(12) United States Patent
Hsia et al.

(10) Patent No.: US 11,592,618 B2
(45) Date of Patent: Feb. 28, 2023

(54) PHOTONIC SEMICONDUCTOR DEVICE AND METHOD OF MANUFACTURE

(71) Applicant: Taiwan Semiconductor Manufacturing Co., Ltd., Hsinchu (TW)

(72) Inventors: Hsing-Kuo Hsia, Jhubei (TW); Chen-Hua Yu, Hsinchu (TW); Kuo-Chiang Ting, Hsinchu (TW); Shang-Yun Hou, Jubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/226,542

(22) Filed: Apr. 9, 2021

(65) Prior Publication Data

US 2022/0043208 A1 Feb. 10, 2022

Related U.S. Application Data

(60) Provisional application No. 63/061,363, filed on Aug. 5, 2020, provisional application No. 63/037,061, filed on Jun. 10, 2020.

(51) Int. Cl.
*G02B 6/12* (2006.01)
*G02B 6/13* (2006.01)
*G02B 6/124* (2006.01)

(52) U.S. Cl.
CPC ........... *G02B 6/13* (2013.01); *G02B 6/12002* (2013.01); *G02B 6/124* (2013.01); *G02B 2006/12107* (2013.01)

(58) Field of Classification Search
CPC .................................................. G02B 6/12002
See application file for complete search history.

(56) References Cited

U.S. PATENT DOCUMENTS

| 9,874,690 | B2 | 1/2018 | Gambino et al. | |
|---|---|---|---|---|
| 10,162,139 | B1 | 12/2018 | Wang et al. | |
| 2004/0207016 | A1* | 10/2004 | Patel | H01L 27/14643 257/E27.113 |
| 2006/0177173 | A1* | 8/2006 | Shastri | G02B 6/42 257/E31.095 |
| 2016/0276807 | A1* | 9/2016 | Cai | H01S 5/026 |
| 2017/0350818 | A1 | 12/2017 | Rothberg et al. | |
| 2020/0174187 | A1 | 6/2020 | Chang et al. | |

FOREIGN PATENT DOCUMENTS

| CN | 109219743 A | 1/2019 | |
|---|---|---|---|
| EP | 3579286 A1 * | 12/2019 | ............. H01L 33/62 |
| TW | 202021084 A | 6/2020 | |

\* cited by examiner

*Primary Examiner* — Charlie Y Peng
(74) *Attorney, Agent, or Firm* — Slater Matsil, LLP

(57) ABSTRACT

A method includes forming a first photonic package, wherein forming the first photonic package includes patterning a silicon layer to form a first waveguide, wherein the silicon layer is on an oxide layer, and wherein the oxide layer is on a substrate; forming vias extending into the substrate; forming a first redistribution structure over the first waveguide and the vias, wherein the first redistribution structure is electrically connected to the vias; connecting a first semiconductor device to the first redistribution structure; removing a first portion of the substrate to form a first recess, wherein the first recess exposes the oxide layer; and filling the first recess with a first dielectric material to form a first dielectric region.

20 Claims, 70 Drawing Sheets

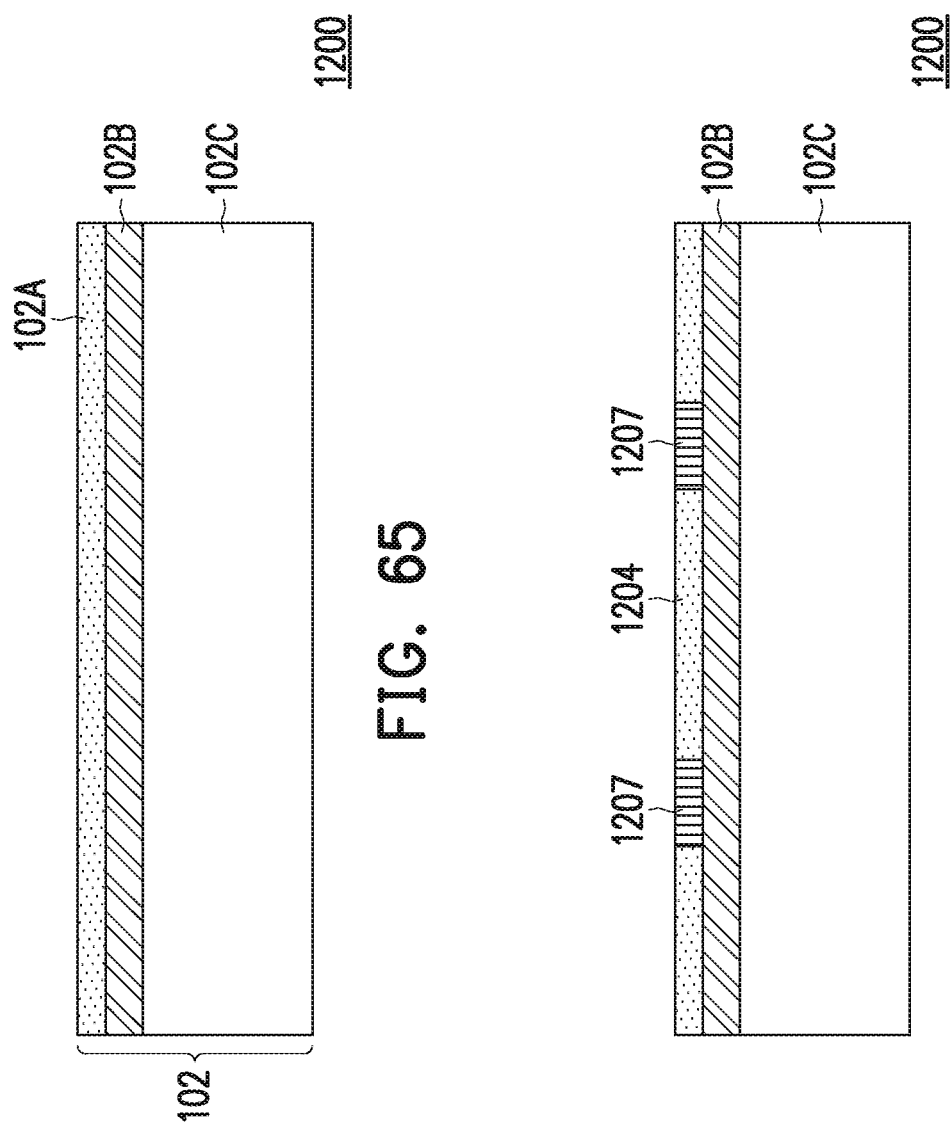

PHOTONIC SEMICONDUCTOR DEVICE AND METHOD OF MANUFACTURE

PRIORITY CLAIM AND CROSS-REFERENCE

This application claims the benefits of U.S. Provisional Application No. 63/037,061, filed on Jun. 10, 2020 and the benefits of U.S. Provisional Application No. 63/061,363, filed on Aug. 5, 2020, which applications are hereby incorporated herein by reference in their entirety.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 65 through 67 illustrate cross-sectional views of intermediate steps of forming a waveguide structure, in accordance with some embodiments.

DETAILED DESCRIPTION

Figure 1:
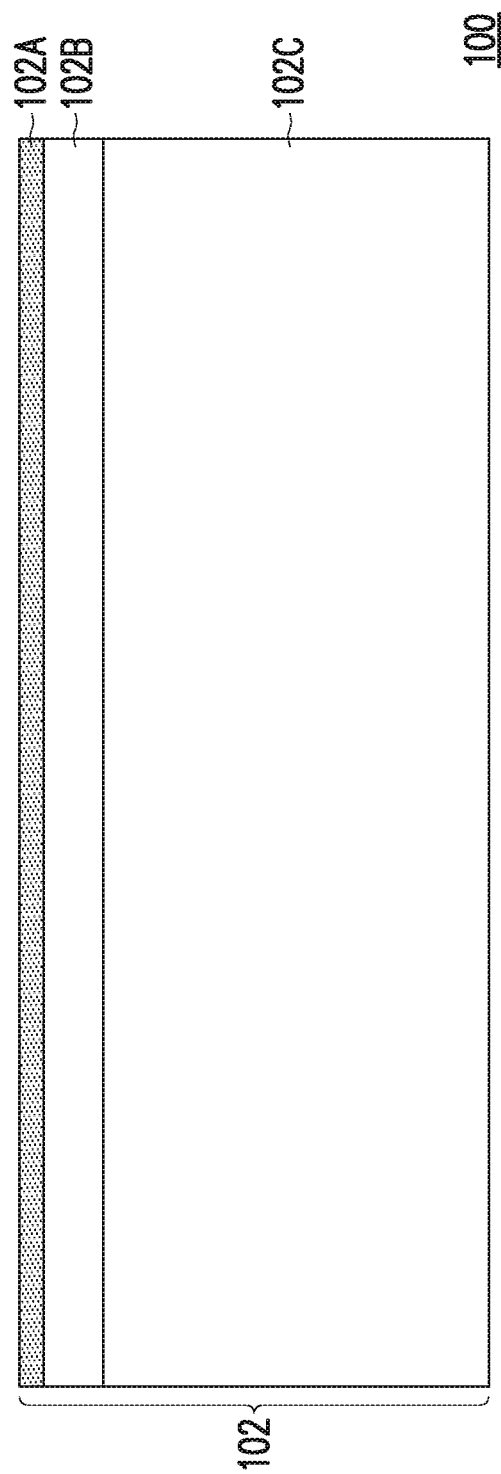
FIGS. 1 through 14 illustrate cross-sectional views of intermediate steps of forming a photonic package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package and the formation thereof are described. Three-dimensional (3D) packages including both optical devices and electrical devices, and the method of forming the same are provided, in accordance with some embodiments. In particular, photonic packages including waveguides are formed on a substrate, with a portion of the substrate replaced by a dielectric material such as silicon oxide. Replacing the portion of the substrate with the dielectric material can reduce loss from edge-mounted optical fibers that are coupled to the waveguide, in some embodiments. In some embodiments, the dielectric material permits optical communication with grating couplers formed in the waveguides. Replacing a portion of the substrate with a dielectric material can also provide thermal benefits. In some embodiments, a photonic system may include several photonic packages attached to a photonic interconnect structure, with the photonic packages being optically coupled to a set of waveguides formed in the photonic interconnect structure. In this manner, the photonic packages may communicate using optical signals transmitted by the waveguides of the photonic interconnect structure. Using photonic packages and optical communication in this manner can provide reduce optical loss, improved efficiency, and improved high-speed communication of a photonic system. The intermediate stages of forming the packages are illustrated, in accordance with some embodiments. Some variations of some embodiments are discussed. Throughout the various views and illustrative embodiments, like reference numbers are used to designate like elements.

FIGS. 1 through 14 show cross-sectional views of intermediate steps of forming a photonic package 100 (see FIG. 14), in accordance with some embodiments. In some embodiments, the photonic package 100 acts as an input/output (I/O) interface between optical signals and electrical signals in a photonic system. For example, one or more photonic packages 100 may be used in a photonic system such as the photonic system 200 (see FIG. 15), the like, or another photonic system.

Turning first to FIG. 1, a buried oxide ("BOX") substrate 102 is provided, in accordance with some embodiments. The BOX substrate 102 includes an oxide layer 102B formed over a substrate 102C, and a silicon layer 102A formed over the oxide layer 102B. The substrate 102C may be, for example, a material such as a glass, ceramic, dielectric, a semiconductor, the like, or a combination thereof. In some embodiments, the substrate 102C may be a semiconductor substrate, such as a bulk semiconductor or the like, which may be doped (e.g., with a p-type or an n-type dopant) or undoped. The substrate 102C may be a wafer, such as a silicon wafer (e.g., a 12-inch silicon wafer). Other substrates, such as a multi-layered or gradient substrate may also be used. In some embodiments, the semiconductor material of the substrate 102C may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The oxide layer 102B may be, for example, a silicon oxide or the like. In some embodiments, the oxide layer 102B may have a thickness between about 0.5 µm and about 4 µm. The silicon layer 102A may have a thickness between about 0.1 µm and about 1.5 µm, in some embodiments. The BOX substrate 102 may be referred to as having a front side or front surface (e.g., the side facing upwards in FIG. 1), and a back side or back surface (e.g., the side facing downwards in FIG. 1).

Figure 2:
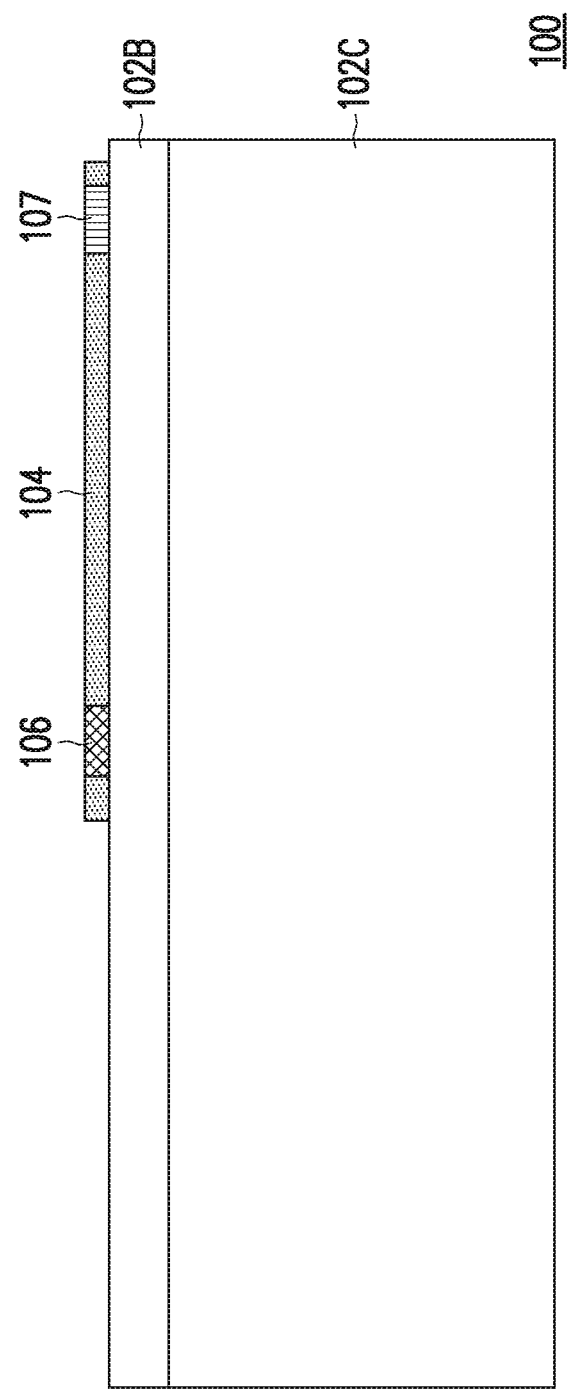

In FIG. 2, the silicon layer 102A is patterned to form silicon regions for waveguides 104, photonic components 106, and/or couplers 107, in accordance with some embodiments. The silicon layer 102A may be patterned using suitable photolithography and etching techniques. For example, a hardmask layer (e.g., a nitride layer or other dielectric material, not shown in FIG. 2) may be formed over the silicon layer 102A and patterned, in some embodiments. The pattern of the hardmask layer may then be transferred to the silicon layer 102A using one or more etching techniques, such as dry etching and/or wet etching techniques. For example, the silicon layer 102A may be etched to form recesses defining the waveguides 104, with sidewalls of the remaining unrecessed portions defining sidewalls of the waveguides 104. In some embodiments, more than one photolithography and etching sequence may be used in order to pattern the silicon layer 102A. One waveguide 104 or multiple waveguides 104 may be patterned from the silicon layer 102A. If multiple waveguides 104 are formed, the multiple waveguides 104 may be individual separate waveguides 104 or connected as a single continuous structure. In some embodiments, one or more of the waveguides 104 form a continuous loop. Other configurations or arrangements of waveguides 104, the photonic components 106, or the couplers 107 are possible. In some cases, the waveguides 104, the photonic components 106, and the couplers 107 may be collectively referred to as "the photonic layer."

The photonic components 106 may be integrated with the waveguides 104, and may be formed with the silicon waveguides 104. The photonic components 106 may be optically coupled to the waveguides 104 to interact with optical signals within the waveguides 104. The photonic components 106 may include, for example, photodetectors and/or modulators. For example, a photodetector may be optically coupled to the waveguides 104 to detect optical signals within the waveguides 104 and generate electrical signals corresponding to the optical signals. A modulator may be optically coupled to the waveguides 104 to receive electrical signals and generate corresponding optical signals within the waveguides 104 by modulating optical power within the waveguides 104. In this manner, the photonic components 106 facilitate the input/output (I/O) of optical signals to and from the waveguides 104. In other embodiments, the photonic components may include other active or passive components, such as laser diodes, optical signal splitters, or other types of photonic structures or devices. Optical power may be provided to the waveguides 104 by, for example, an optical fiber 150 (see FIGS. 16-17) coupled to an external light source, or the optical power may be generated by a photonic component within the photonic package 100 such as a laser diode (not shown in the figures).

In some embodiments, the photodetectors may be formed by, for example, partially etching regions of the waveguides 104 and growing an epitaxial material on the remaining silicon of the etched regions. The waveguides 104 may be etched using acceptable photolithography and etching techniques. The epitaxial material may comprise, for example, a semiconductor material such as germanium (Ge), which may be doped or undoped. In some embodiments, an implantation process may be performed to introduce dopants within the silicon of the etched regions as part of the formation of the photodetectors. The silicon of the etched regions may be doped with p-type dopants, n-type dopants, or a combination. In some embodiments, the modulators may be formed by, for example, partially etching regions of the waveguides 104 and then implanting appropriate dopants within the remaining silicon of the etched regions. The waveguides 104 may be etched using acceptable photolithography and etching techniques. In some embodiments, the etched regions used for the photodetectors and the etched regions used for the modulators may be formed using one or more of the same photolithography or etching steps. The silicon of the etched regions may be doped with p-type dopants, n-type dopants, or a combination. In some embodiments, the etched regions used for the photodetectors and the etched regions used for the modulators may be implanted using one or more of the same implantation steps.

Figure 15:
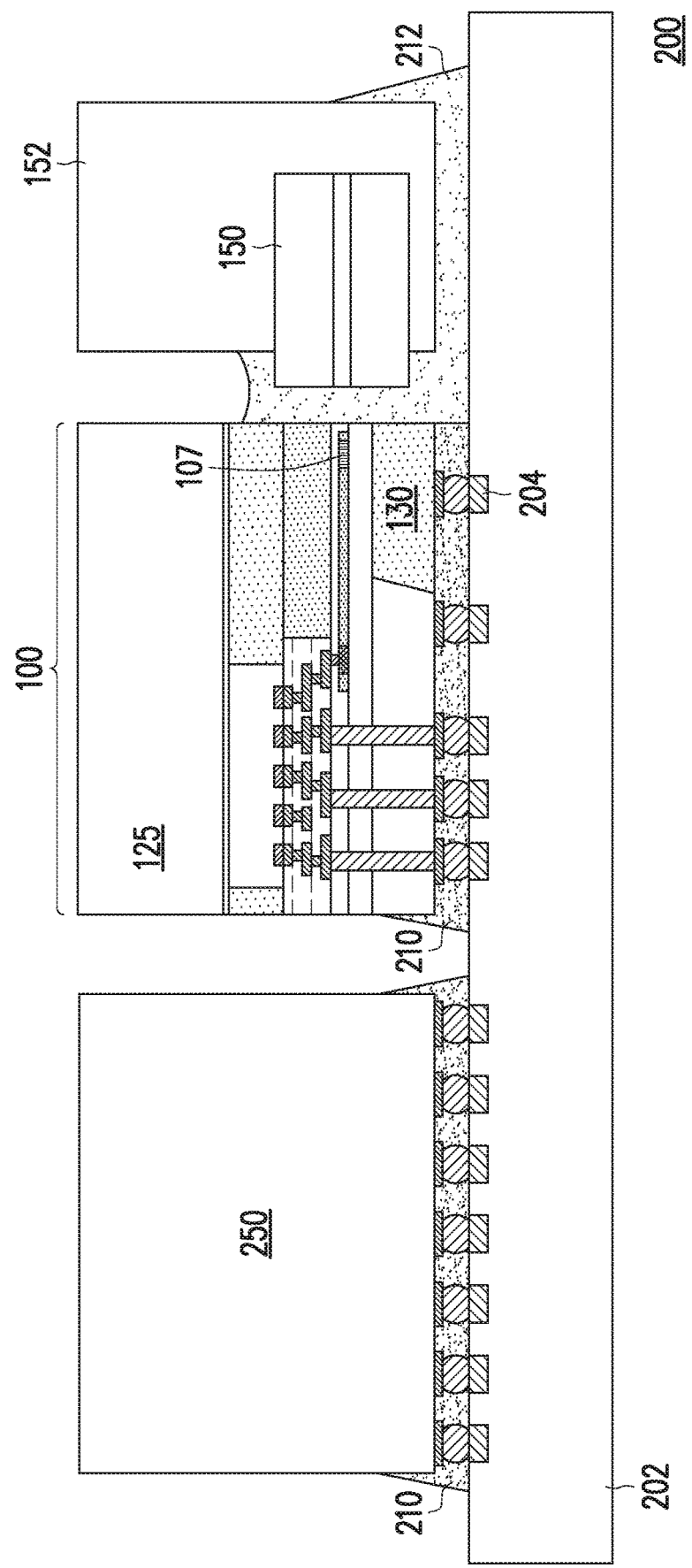
FIG. 15 illustrates a cross-sectional view of a photonic system, in accordance with some embodiments.

In some embodiments, one or more couplers 107 may be integrated with the waveguides 104, and may be formed with the waveguides 104. The edge coupler 106D may be continuous with the waveguides 104 and may be formed in the same processing steps as the waveguides 104 or other photonic components 106. The couplers 107 are photonic structures that allow optical signals and/or optical power to be transferred between the waveguides 104 and a photonic component such as an optical fiber 150 or a waveguide of another photonic system. The couplers 107 may include one or more edge couplers, as shown in FIG. 2. The edge couplers allow optical signals and/or optical power to be transferred between the waveguide 104 and a photonic component that is "edge-mounted" near a sidewall of the photonic package 100. FIG. 15 shows an embodiment in which a coupler 107 comprising an edge coupler is used to couple optical signals between a photonic package 100 and an optical fiber 150, described in greater detail below.

Figure 63:
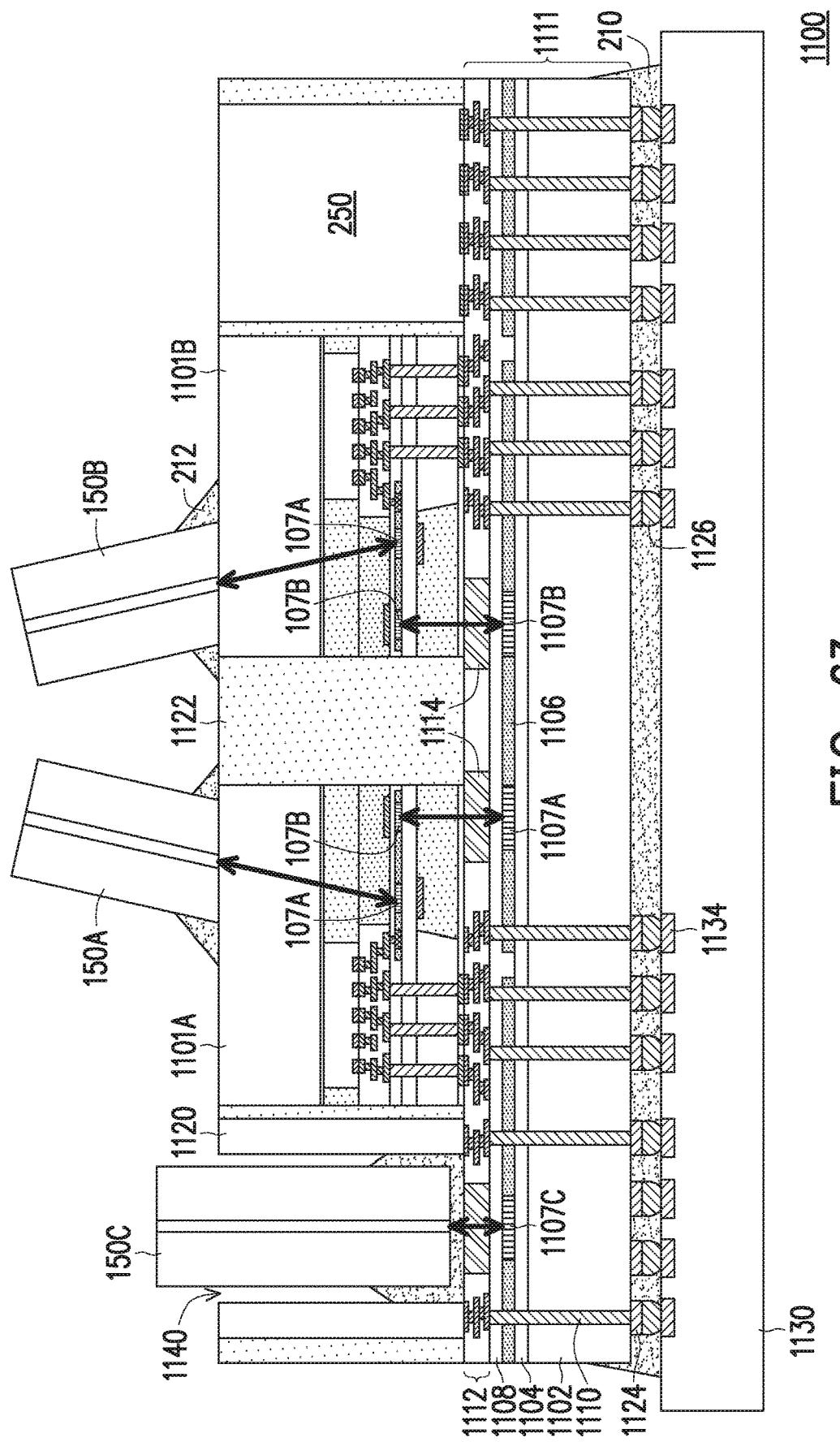

In some embodiments, the couplers 107 include grating couplers, which allow optical signals and/or optical power to be transferred between the waveguides 104 and a photonic component that is vertically mounted over the photonic package 100. FIG. 63 shows an embodiment in which a grating coupler 1107C is used to couple optical power between an optical fiber 150C and a waveguide 1106. FIG. 63 is described in greater detail below. A photonic package 100 may include a single coupler 107, multiple couplers 107, or multiple types of couplers 107, in some embodiments. The couplers 107 may be formed using acceptable photolithography and etching techniques. In some embodiments, the couplers 107 are formed using the same photolithography or etching steps as the waveguides 104 and/or the photonic components 106. In other embodiments, the couplers 107 are formed after the waveguides 104 and/or the photonic components 106 are formed. In some embodiments, the photonic package 100 or other photonic packages described herein may include one or more reflectors 109, shown and described in greater detail for the embodiment of FIG. 56.

Figure 3:
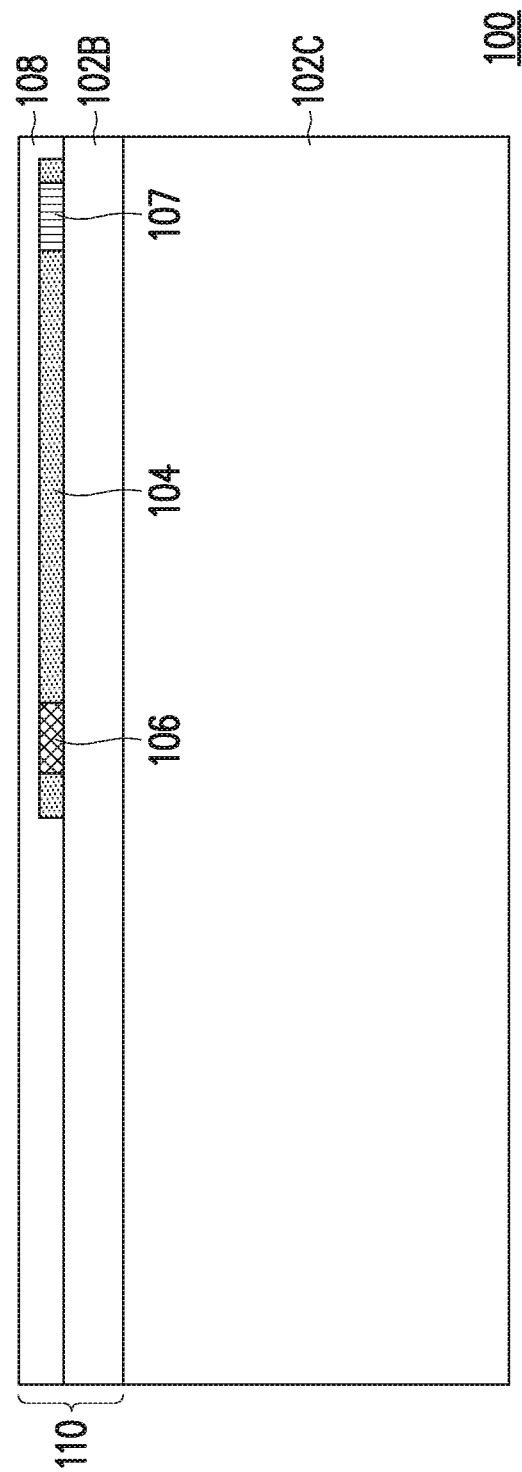
Figure 64:
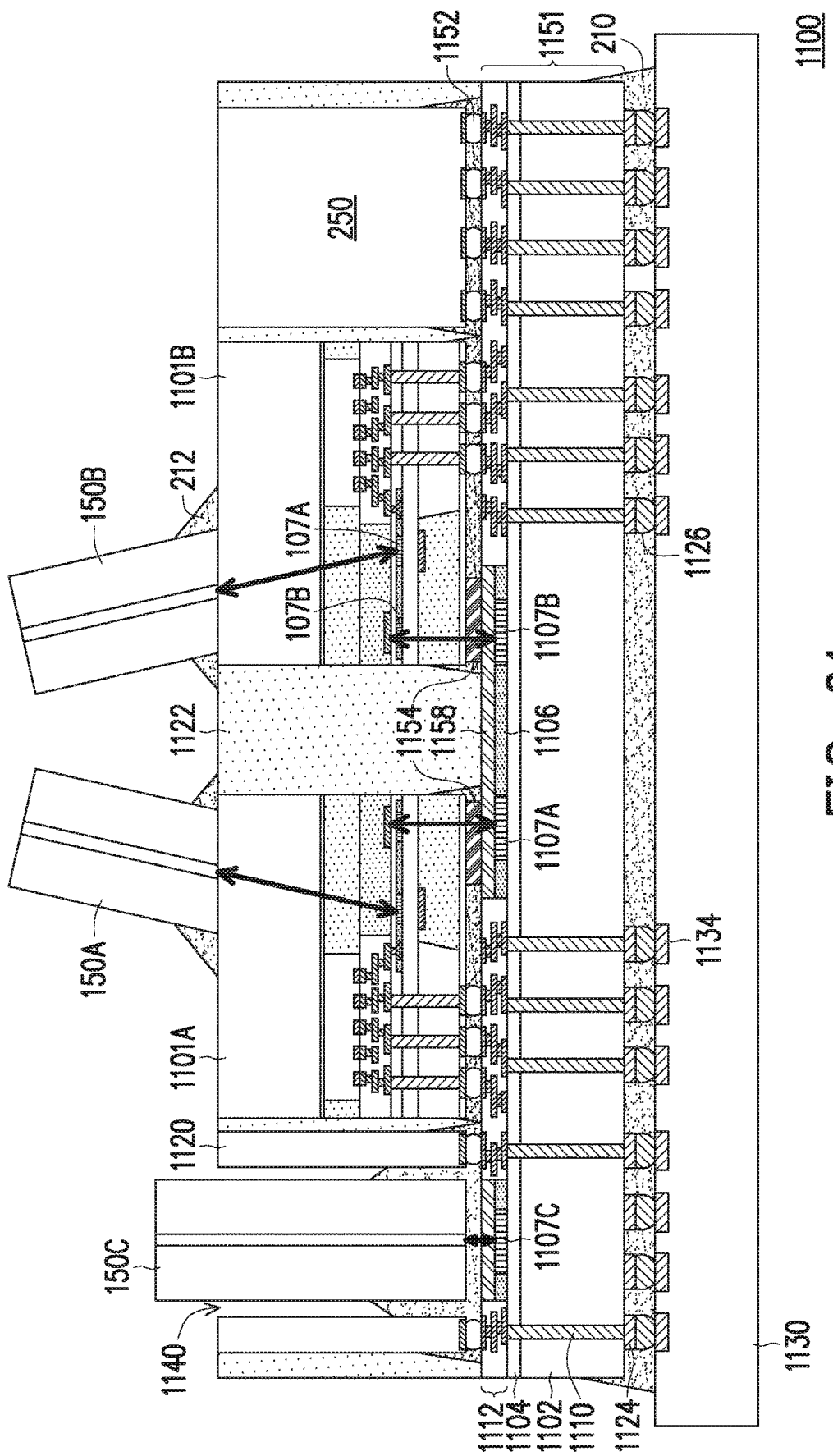
FIG. 64 illustrates a cross-sectional view of a photonic system, in accordance with some embodiments.

In FIG. 3, a dielectric layer 108 is formed on the front side of the BOX substrate 102 to form a photonic routing structure 110, in accordance with some embodiments. The dielectric layer 108 is formed over the waveguides 104, the photonic components 106, the couplers 107, and the oxide layer 102B. The dielectric layer 108 may be formed of one or more layers of silicon oxide, silicon nitride, a combination thereof, or the like, and may be formed by CVD, PVD, atomic layer deposition (ALD), a spin-on-dielectric process, the like, or a combination thereof. In some embodiments, the dielectric layer 108 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other dielectric materials formed by any acceptable process may be used. In some embodiments, the dielectric layer 108 is then planarized using a planarization process such as a CMP process, a grinding process, or the like. The dielectric layer 108 may be formed having a thickness over the oxide layer 102B between about 50 nm and about 500 nm, or may be formed having a thickness over the waveguides 104 between about 10 nm and about 200 nm, in some embodiments. In some cases, a thinner dielectric layer 108 may allow for more efficient optical coupling between a coupler 107 comprising a grating coupler and a vertically mounted photonic component. FIGS. 63 and 64 show embodiments in which a coupler 107 comprising a grating coupler is used to couple optical signals between a photonic package 1101 and vertically mounted optical fiber 150, described in greater detail below.

Due to the difference in refractive indices of the materials of the waveguides 104 and dielectric layer 108, the waveguides 104 have high internal reflections such that light is substantially confined within the waveguides 104, depending on the wavelength of the light and the refractive indices of the respective materials. In an embodiment, the refractive index of the material of the waveguides 104 is higher than the refractive index of the material of the dielectric layer 108. For example, the waveguides 104 may comprise silicon, and the dielectric layer 108 may comprise silicon oxide and/or silicon nitride.

Figure 4:
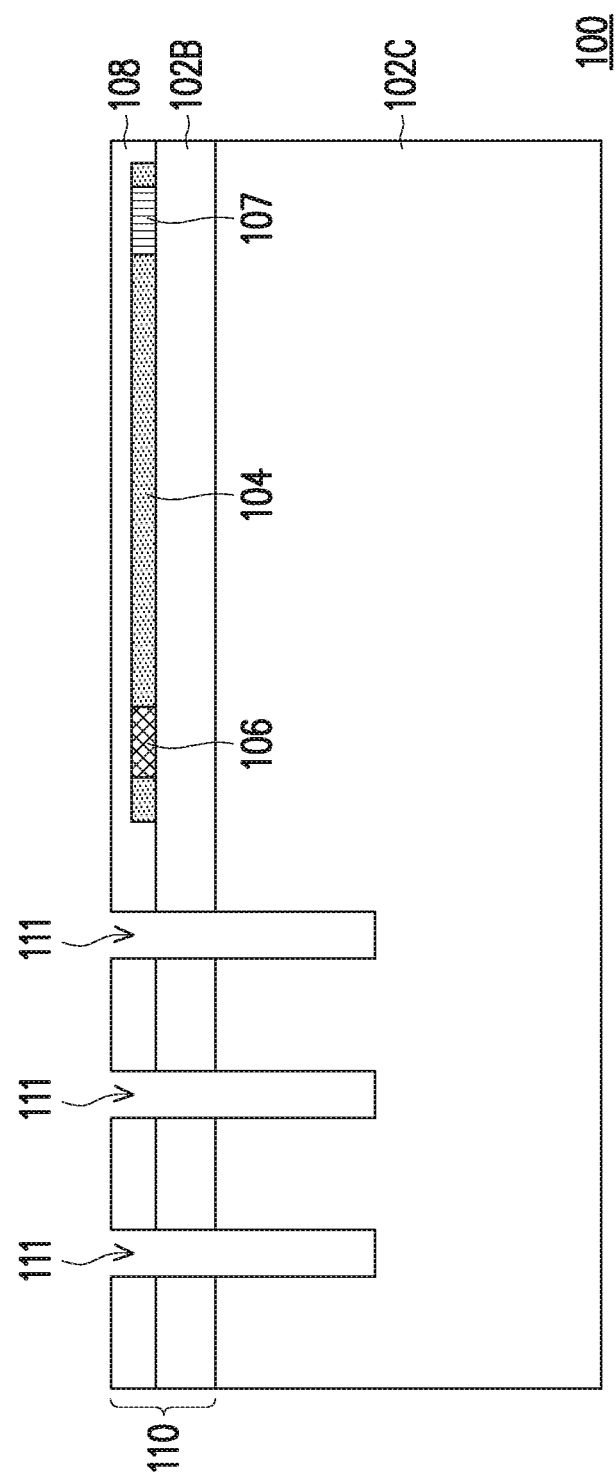

In FIG. 4, openings 111 are formed extending into the substrate 102C, in accordance with some embodiments. The openings 111 are formed extending through the dielectric layer 108 and the oxide layer 102B, and may extend partially into the substrate 102C. The openings 111 may be formed by acceptable photolithography and etching techniques, such as by forming and patterning a photoresist and then performing an etching process using the patterned photoresist as an etching mask. The etching process may include, for example, a dry etching process and/or a wet etching process.

Figure 5:
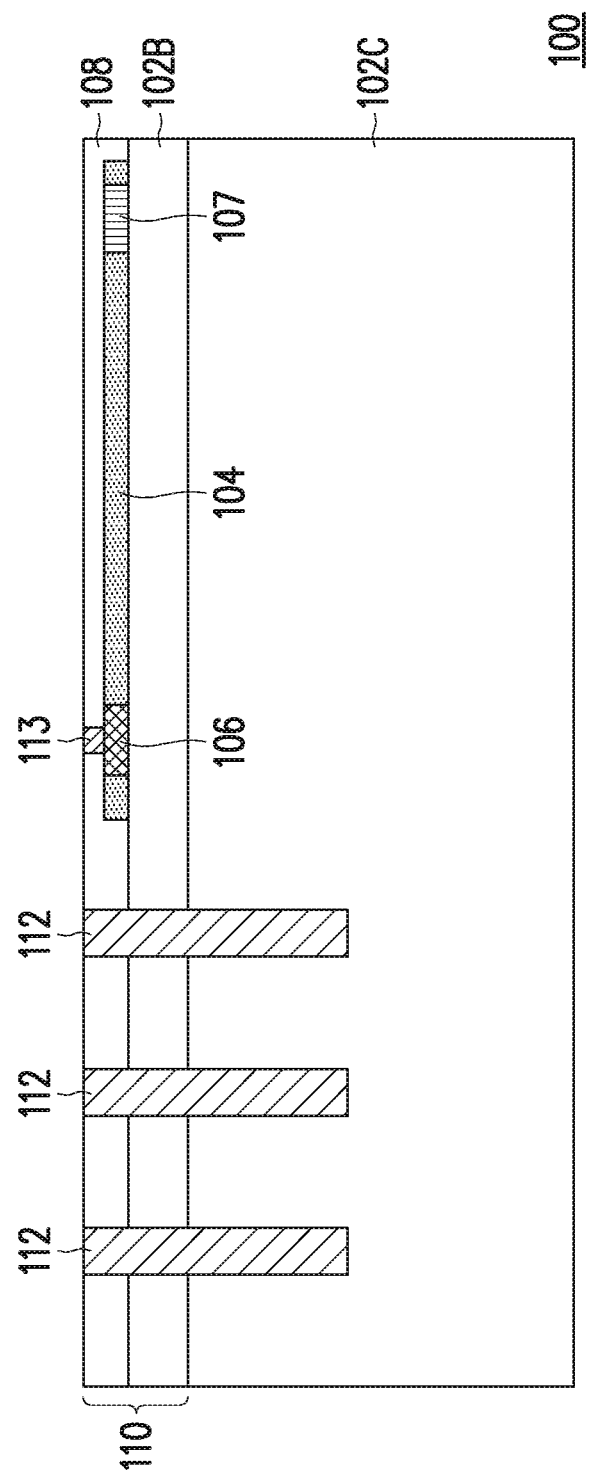

In FIG. 5, a conductive material is formed in the openings 111, thereby forming vias 112, in accordance with some embodiments. In some embodiments, a liner (not shown), such as a diffusion barrier layer, an adhesion layer, or the like, may be formed in the openings 111 from TaN, Ta, TiN, Ti, CoW, or the like, and may be formed using suitable a deposition process such as ALD or the like. In some embodiments, a seed layer (not shown), which may include copper or a copper alloy may then be deposited in the openings 111. The conductive material of the vias 112 is formed in the openings 111 using, for example, ECP or electro-less plating. The conductive material may include, for example, a metal or a metal alloy such as copper, silver, gold, tungsten, cobalt, aluminum, or alloys thereof. A planarization process (e.g., a CMP process or a grinding process) may be performed to remove excess conductive material along the top surface of the dielectric layer 108, such that top surfaces of the vias 112 and the dielectric layer 108 are level.

FIG. 5 also shows the formation of contacts 113 that extend through the dielectric layer 108 and are electrically connected to the photonic components 106. The contacts 113 allow electrical power or electrical signals to be transmitted to the photonic components 106 and electrical signals to be transmitted from the photonic components 106. In this manner, the photonic components 106 may convert electrical signals (e.g., from an electronic die 122, see FIG. 9) into optical signals transmitted by the waveguides 104, and/or convert optical signals from the waveguides 104 into electrical signals (e.g., that may be received by an electronic die 122). The contacts 113 may be formed before or after formation of the vias 112, and the formation of the contacts 113 and the formation of the vias 112 may share some steps such as deposition of the conductive material and/or planarization. In some embodiments, the contact may be formed by a damascene process, e.g., single damascene, dual damascene, or the like. For example, in some embodiments, openings (not shown) for the contacts 113 are first formed in the dielectric layer 108 using acceptable photolithography and etching techniques. A conductive material may then be formed in the openings, forming the contacts 113. Excess conductive material may be removed using a CMP process or the like. The conductive material of the contacts 113 may be formed of a metal or a metal alloy including aluminum, copper, tungsten, or the like, which may be the same as that of the vias 112. The contacts 113 may be formed using other techniques or materials in other embodiments.

Figure 6:
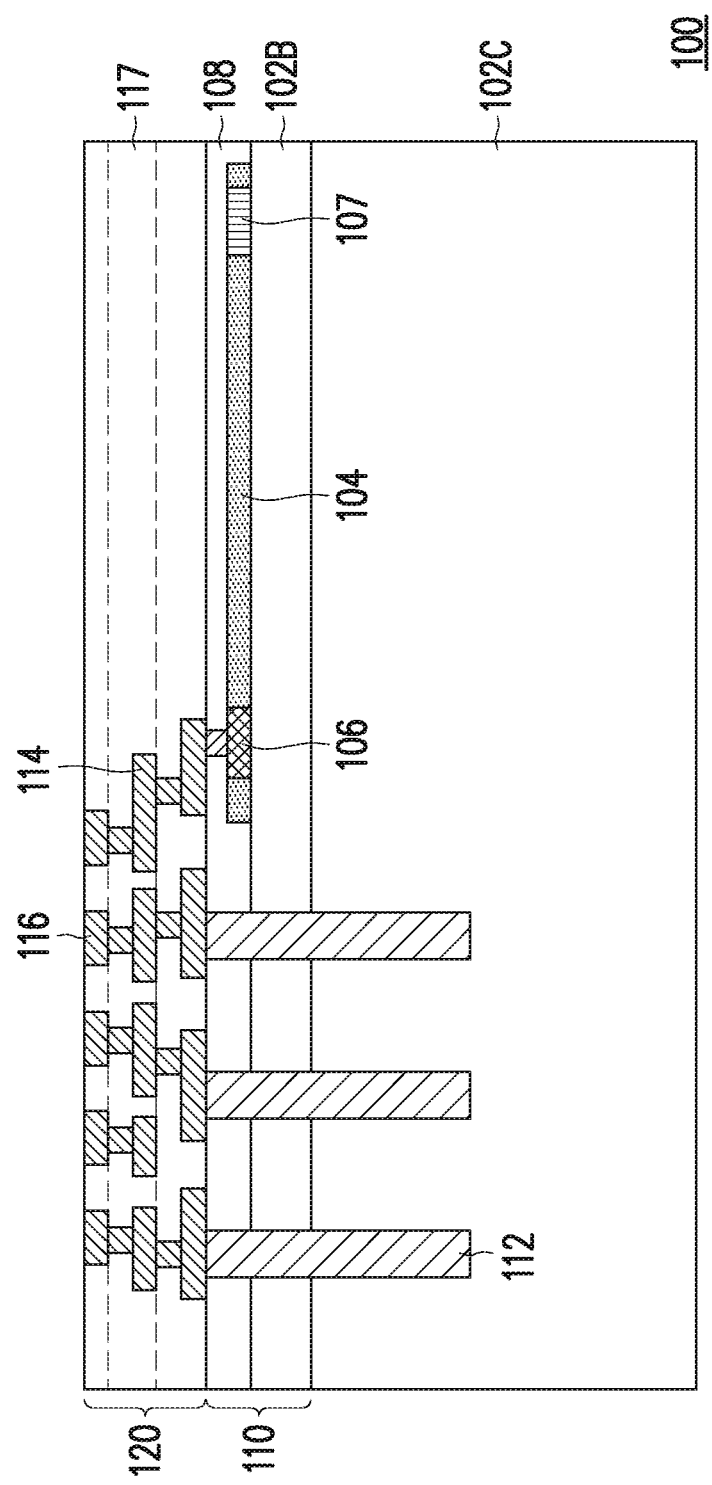

In FIG. 6, a redistribution structure 120 is formed over the dielectric layer 108, in accordance with some embodiments. The redistribution structure 120 includes dielectric layers 117 and conductive features 114 formed in the dielectric layers 117 that provide interconnections and electrical routing. For example, the redistribution structure 120 may connect the vias 112, the contacts 113, and/or overlying devices such as electronic dies 122 (see FIG. 9). The dielectric layers 117 may be, for example, insulating or passivating layers, and may comprise one or more materials similar to those described above for the dielectric layer 108, such as a silicon oxide or a silicon nitride, or may comprise a different material. The dielectric layers 117 and the dielectric layer 108 may be transparent or nearly transparent to light within the same range of wavelengths. The dielectric layers 117 may be formed using a technique similar to those described above for the dielectric layer 108 or using a different technique. The conductive features 114 may include conductive lines and vias, and may be formed by a damascene process, e.g., single damascene, dual damascene, or the like. As shown in FIG. 6, conductive pads 116 are formed in the topmost layer of the dielectric layers 117. A planarization process (e.g., a CMP process or the like) may be performed after forming the conductive pads 116 such that surfaces of the conductive pads 116 and the topmost dielectric layer 117 are substantially coplanar. The redistribution structure 120 may include more or fewer dielectric layers 117, conductive features 114, or conductive pads 116 than shown in FIG. 6. The redistribution structure 120 may be formed having a thickness between about 4 µm and about 6 µm, in some embodiments. Other thicknesses are possible.

Figure 7:
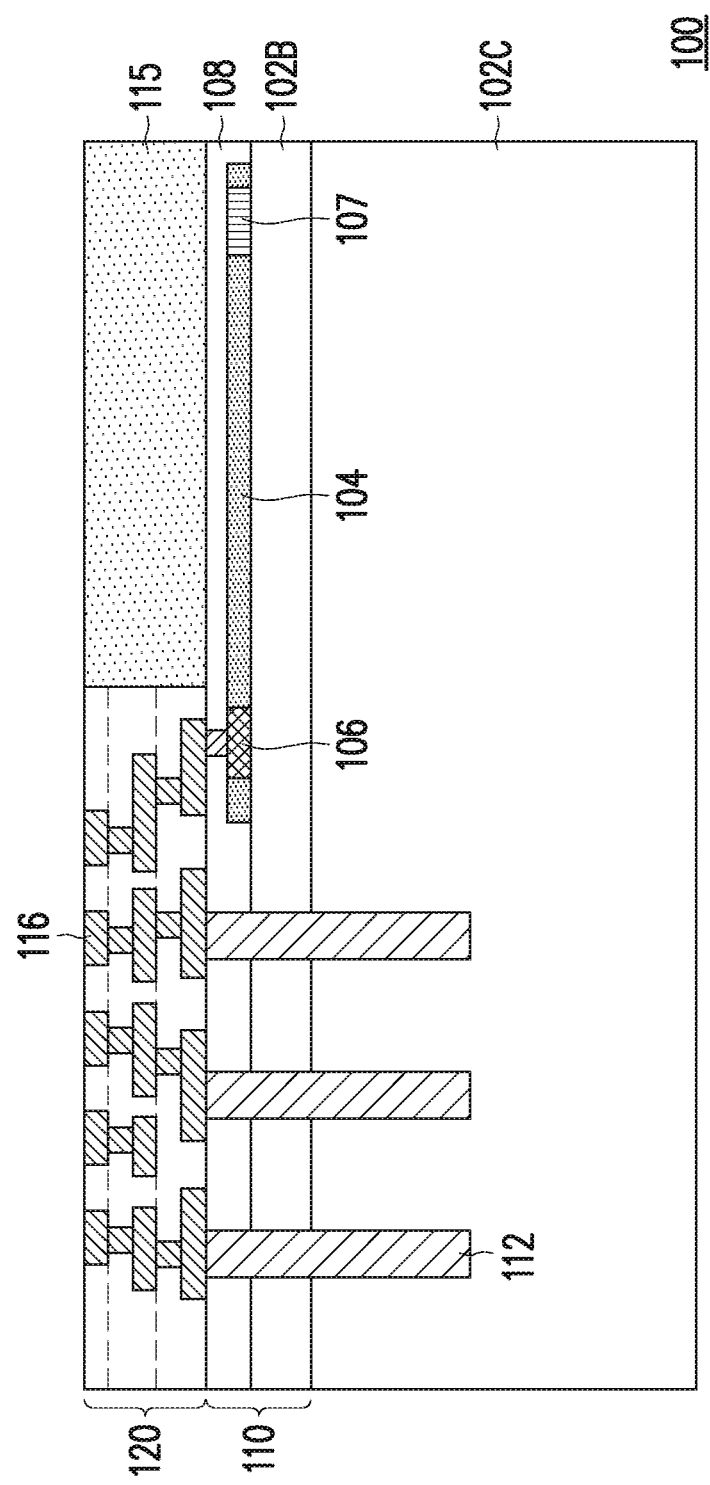

In FIG. 7, a portion of the redistribution structure 120 is removed and replaced by a dielectric layer 115, in accordance with some embodiments. The portion of the redistribution structure 120 may be removed, for example, using acceptable photolithography and etching techniques, such as by forming and patterning a photoresist and then performing an etching process to remove the dielectric layers 117 using the patterned photoresist as an etching mask. The etching process may include, for example, a dry etching process and/or a wet etching process. The dielectric layer 115 may then be deposited to replace the removed portion of the redistribution structure 120. The dielectric layer 115 may comprise one or more materials similar to those described above for the dielectric layer 108, such as a silicon oxide or a silicon nitride, or may comprise a different material. In some embodiments, the dielectric layer 115 and the dielectric layer 108 may be transparent or nearly transparent to light within the same range of wavelengths. The dielectric layer 115 may be formed using a technique similar to those described above for the dielectric layer 108 or using a different technique. In some embodiments, a planarization process (e.g., a CMP or grinding process) is used to remove excess material of the dielectric layer 115. The planarization process may also expose the conductive pads 116. After performing the planarization process, the dielectric layer 115, the topmost dielectric layer 117, and/or the conductive pads 116 may have substantially level surfaces. In some cases, replacing a portion of the redistribution structure 120 with the dielectric layer 115 can improve the optical confinement within the waveguides 104 beneath the dielectric layer 115. In other embodiments, the redistribution structure 120 is not etched and the dielectric layer 115 is not formed.

Figure 8:
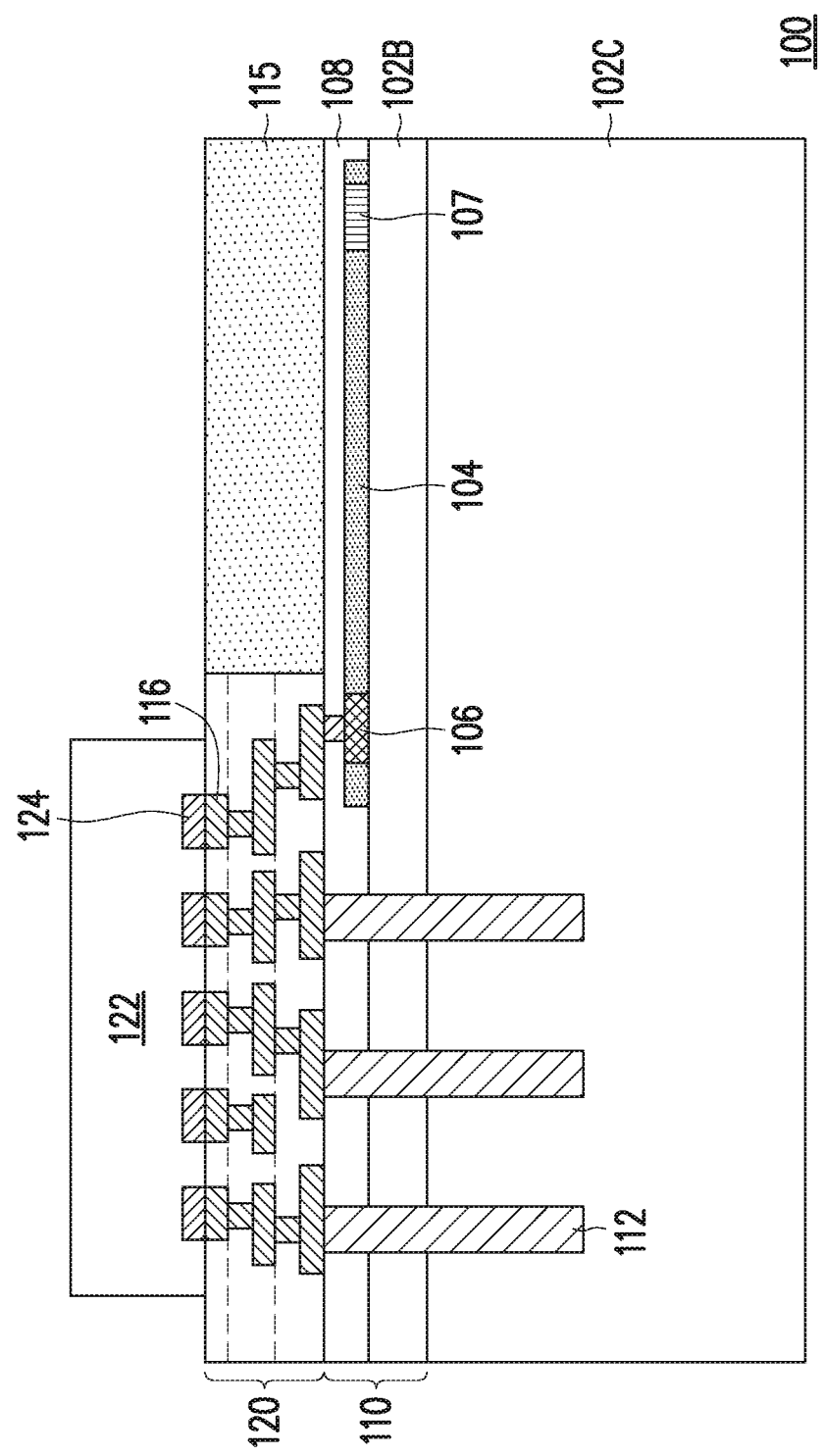

In FIG. 8, one or more electronic dies 122 are bonded to the redistribution structure 120, in accordance with some embodiments. The electronic dies 122 may be, for example, semiconductor devices, dies, or chips that communicate with the photonic components 106 using electrical signals. One electronic die 122 is shown in FIG. 8, but a photonic package 100 may include two or more electronic dies 122 in other embodiments. In some cases, multiple electronic dies 122 may be incorporated into a single photonic package 100 in order to reduce processing cost. The electronic die 122 may include die connectors 124, which may be, for example, conductive pads, conductive pillars, or the like. In some embodiments, the electronic die 122 may have a thickness between about 10 µm and about 35 µm. Other thicknesses are possible.

The electronic die 122 may include integrated circuits for interfacing with the photonic components 106, such as circuits for controlling the operation of the photonic components 106. For example, the electronic die 122 may include controllers, drivers, transimpedance amplifiers, the like, or combinations thereof. The electronic die 122 may also include a CPU, in some embodiments. In some embodiments, the electronic die 122 includes circuits for processing electrical signals received from photonic components 106, such as for processing electrical signals received from a photonic component 106 comprising a photodetector. The electronic die 122 may control high-frequency signaling of the photonic components 106 according to electrical signals (digital or analog) received from another device or die, in some embodiments. In some embodiments, the electronic die 122 may be an electronic integrated circuit (EIC) or the like that provides Serializer/Deserializer (SerDes) functionality. In this manner, the electronic die 122 may act as part of an I/O interface between optical signals and electrical signals within a photonic package 100, and the photonic package 100 described herein could be a considered system-on-chip (SoC) or a system-on-integrated-circuit (SoIC) device.

In some embodiments, an electronic die 122 is bonded to the redistribution structure 120 by dielectric-to-dielectric bonding and/or metal-to-metal bonding (e.g., direct bonding, fusion bonding, oxide-to-oxide bonding, hybrid bonding, or the like). In such embodiments, covalent bonds may be formed between oxide layers, such as the topmost dielectric layer 117 and surface dielectric layers (not shown) of the electronic die 122. During the bonding, metal bonding may also occur between the die connectors 124 of the electronic die 122 and the conductive pads 116 of the redistribution structure 120.

In some embodiments, before performing the bonding process, a surface treatment is performed on the electronic die 122. In some embodiments, the top surfaces of the redistribution structure 120 and/or the electronic die 122 may first be activated utilizing, for example, a dry treatment, a wet treatment, a plasma treatment, exposure to an inert gas, exposure to $H_2$, exposure to $N_2$, exposure to $O_2$, the like, or combinations thereof. However, any suitable activation process may be utilized. After the activation process, the redistribution structure 120 and/or the electronic die 122 may be cleaned using, e.g., a chemical rinse. The electronic die 122 is then aligned with the redistribution structure 120 and placed into physical contact with the redistribution structure 120. The electronic die 122 may be placed on the redistribution structure 120 using a pick-and-place process, for example. The redistribution structure 120 and the electronic die 122 may then be subjected to a thermal treatment and/or pressed against each other (e.g., by applying contact pressure) to bond the redistribution structure 120 and the electronic die 122. For example, the redistribution structure 120 and the electronic die 122 may be subjected to a pressure of about 200 kPa or less, and to a temperature between about 200° C. and about 400° C. The redistribution structure 120 and the electronic die 122 may then be subjected to a temperature at or above the eutectic point of the material of the conductive pads 116 and the die connectors 124 (e.g., between about 150° C. and about 650° C.) to fuse the conductive pads 116 and the die connectors 124. In this manner, the dielectric-to-dielectric bonding and/or metal-to-metal bonding of the redistribution structure 120 and the electronic die 122 forms a bonded structure. In some embodiments, the bonded structure is baked, annealed, pressed, or otherwise treated to strengthen or finalize the bonds.

Figure 9:
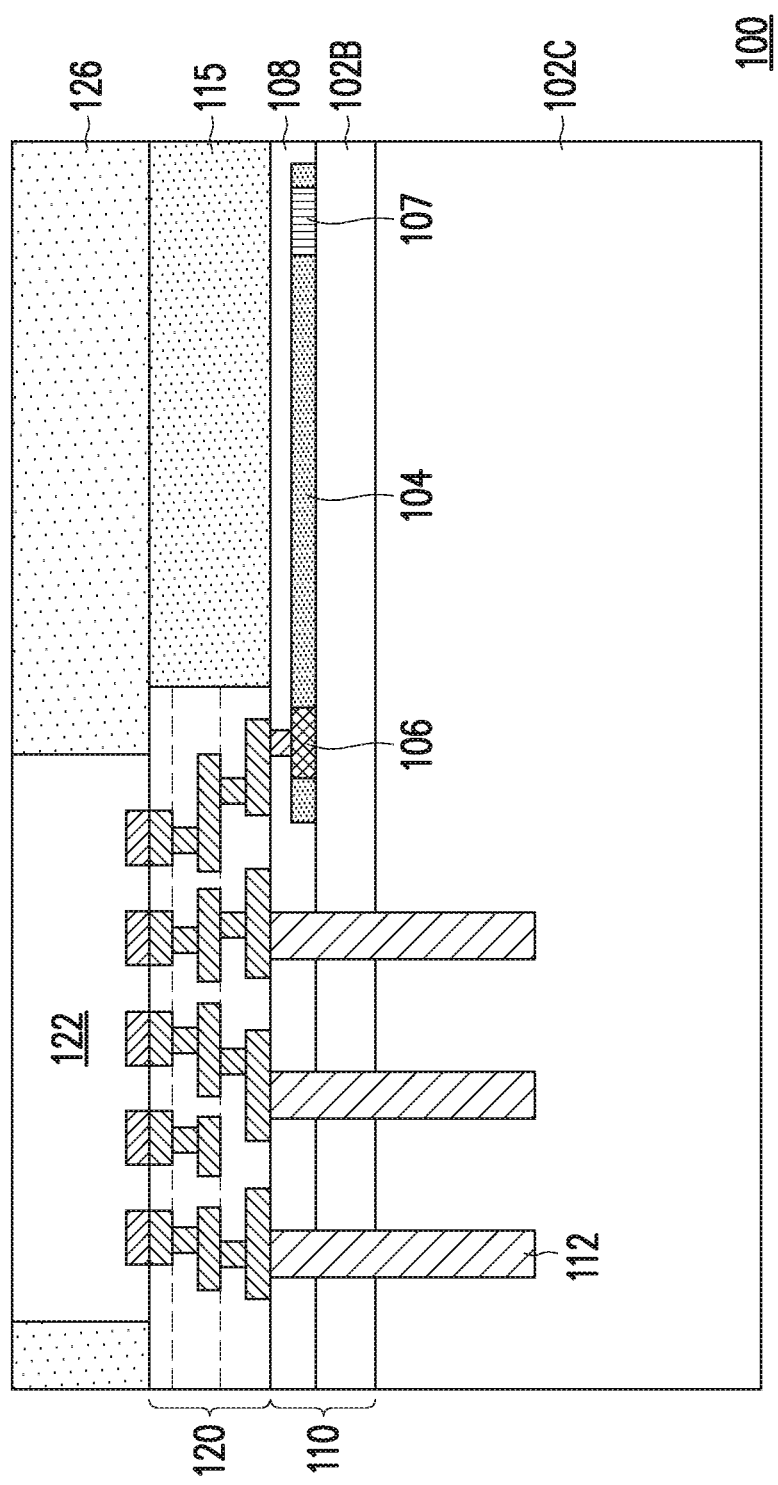

In FIG. 9, a dielectric material 126 is formed over the electronic die 122 and the redistribution structure 120, in accordance with some embodiments. The dielectric material 126 may be formed of silicon oxide, silicon nitride, a polymer, the like, or a combination thereof. The dielectric material 126 may be formed by CVD, PVD, ALD, a spin-on-dielectric process, the like, or a combination thereof. In some embodiments, the dielectric material 126 may be formed by HDP-CVD, FCVD, the like, or a combination thereof. The dielectric material 126 may be a gap-fill material in some embodiments, which may include one or more of the example materials above. Other dielectric materials formed by any acceptable process may be used. The dielectric material 126 may be planarized using a planarization process such as a CMP process, a grinding process, or the like. In some embodiments, the planarization process may expose the electronic die 122 such that a surface of the electronic die 122 and a surface of the dielectric material 126 are coplanar.

Figure 10:
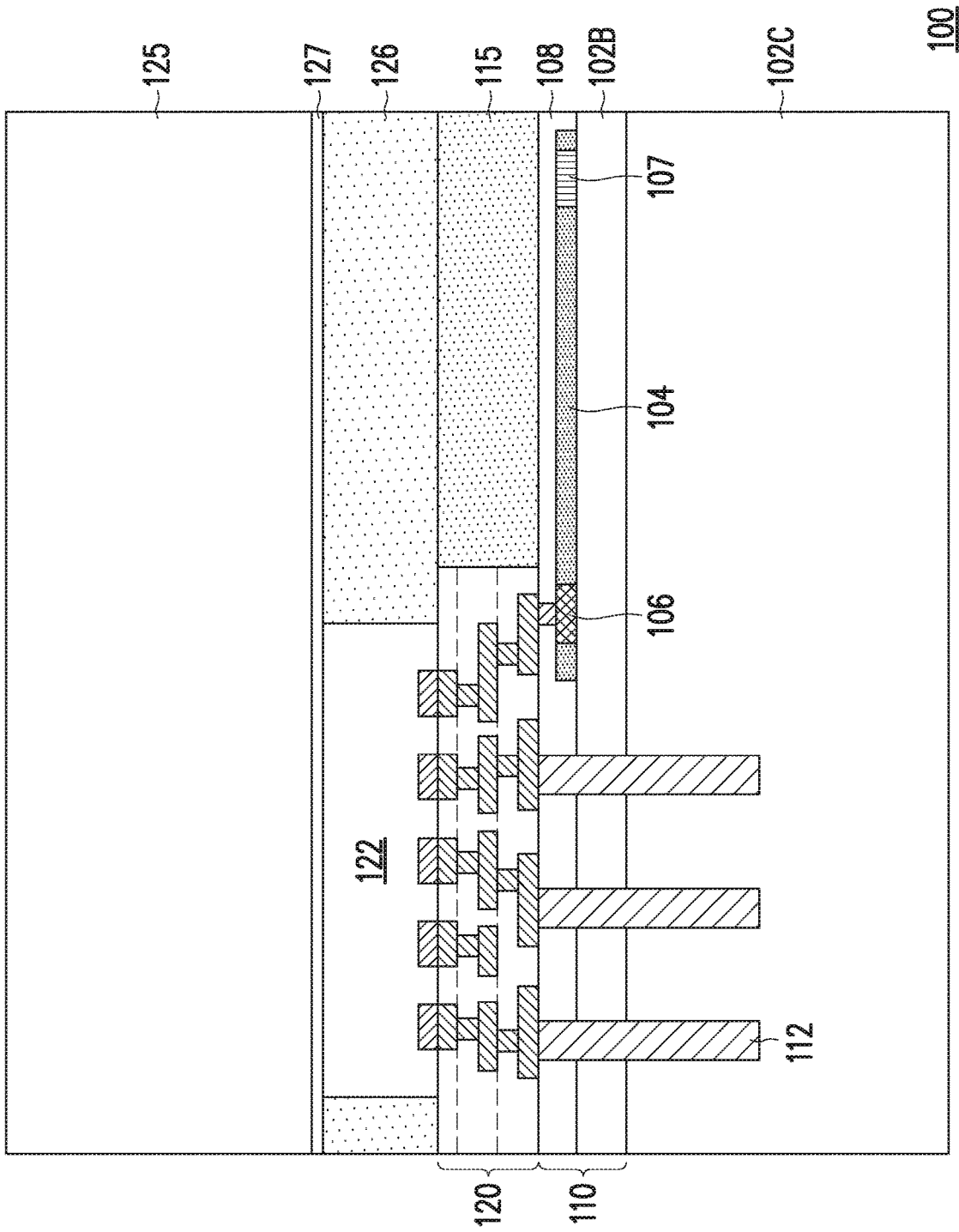

In FIG. 10, an optional support 125 is attached to the structure, in accordance with some embodiments. The support 125 is a rigid structure that is attached to the structure in order to provide structural or mechanical stability. The use of a support 125 can reduce warping or bending, which can improve the performance of the optical structures such as the waveguides 104 or photonic components 106. The support 125 may comprise one or more materials such as silicon (e.g., a silicon wafer, bulk silicon, or the like), a silicon oxide, a metal, an organic core material, the like, or another type of material. The support 125 may be attached to the structure (e.g., to the dielectric material 126 and/or the electronic dies 122) using an adhesive layer 127, as shown in FIG. 10, or the support 125 may be attached using direct bonding or another suitable technique. In some embodiments, the support 125 may have a thickness between about 500 μm and about 700 μm. The support 125 may also have lateral dimensions (e.g., length, width, and/or area) that are greater than, about the same as, or smaller than those of the structure. In other embodiments, the support 125 is attached at a later process step during the manufacturing the photonic package 100 than shown.

Figure 11:
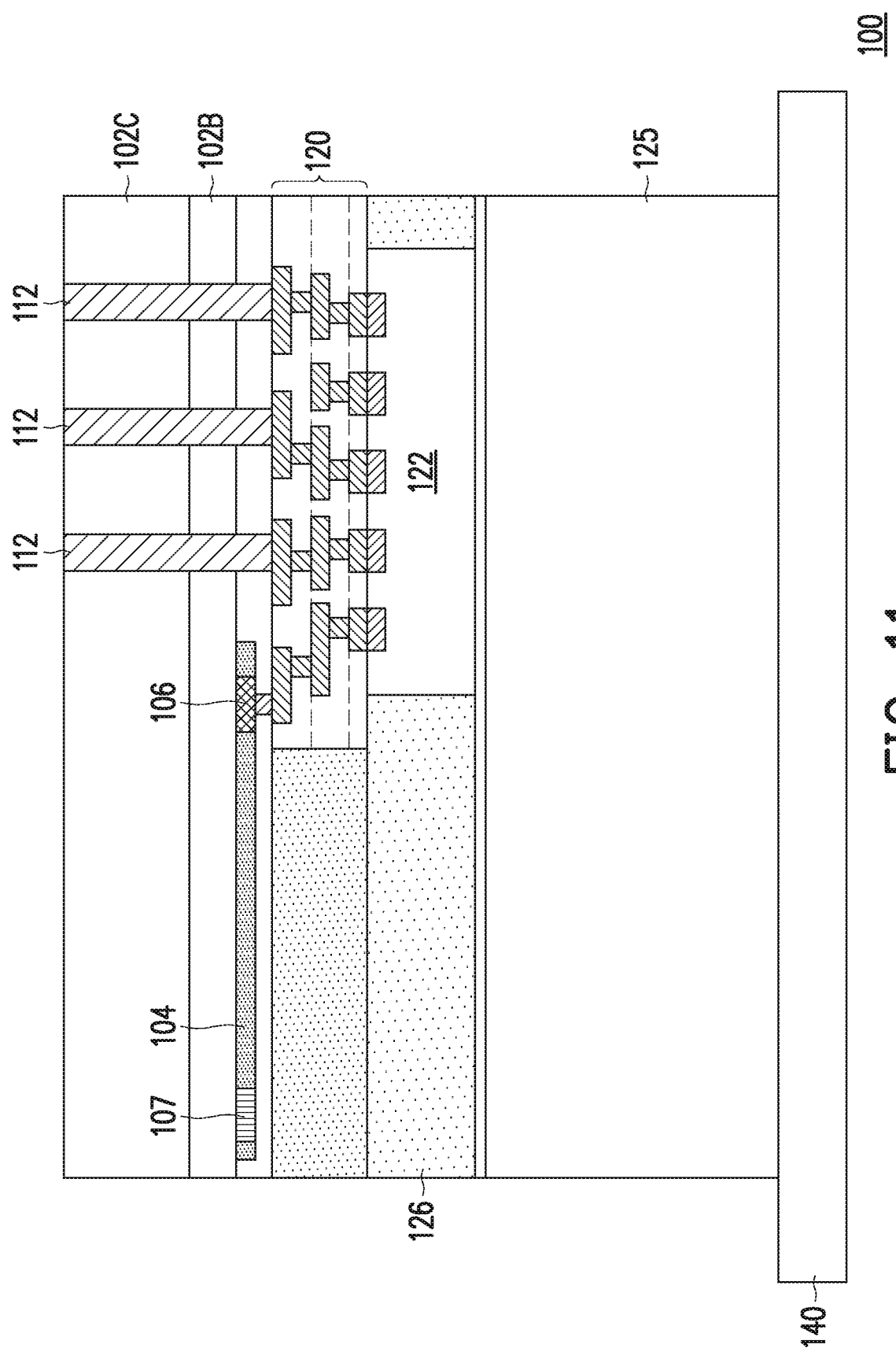

In FIG. 11, the structure is flipped over and attached to a carrier 140, in accordance with some embodiments. The carrier 140 may be, for example, a wafer (e.g., a silicon wafer), a panel, a glass substrate, a ceramic substrate, or the like. The structure may be attached to the carrier 140 using, for example, an adhesive or a release layer (not shown). The back side of the substrate 102C is then thinned to expose the vias 112, in accordance with some embodiments. The substrate 102C may be thinned by a CMP process, a mechanical grinding, an etching process, the like, or a combination thereof.

Figure 12:
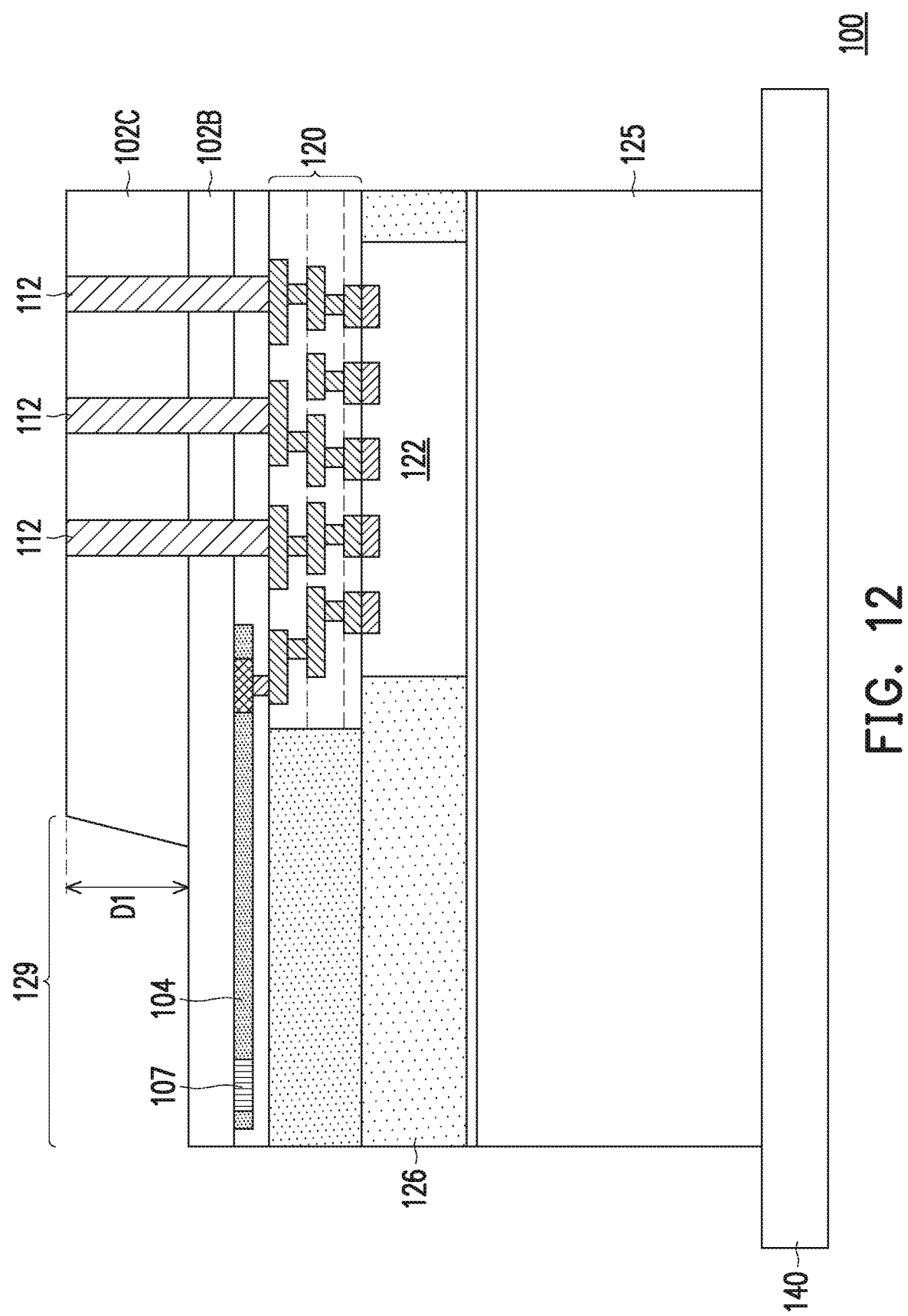

In FIG. 12, a portion of the substrate 102C is removed to form a recess 129 that exposes the oxide layer 102B, in accordance with some embodiments. The recess 129 may extend over the waveguide 104 and over a coupler 107, and may extend to an edge of the photonic package 100, as shown in FIG. 12. In some embodiments, more than one recess 129 is formed. The recess 129 may be formed using suitable photolithography and etching techniques. For example, in some embodiments, a photoresist may be formed over the structure and patterned, wherein the pattern corresponds to the recess 129. The substrate 102C may be etched using the patterned photoresist as an etching mask. The etching may be performed using one or more suitable techniques, such as a wet etching process, a dry etching process, or a combination thereof. In some embodiments, the etching may be selective such that the substrate 102C is removed without significant etching of the oxide layer 102B. For example, the etching may be performed using $HNO_3$, HF, $CH_3COOH$, the like, or combinations thereof. Other etching techniques are possible. In some embodiments, the recess 129 may have a depth D1 that is in the range of about 6 μm to about 25 μm, though other depths are possible. In some embodiments, a sidewall of the recess 129 is sloped or faceted, such as shown in FIG. 12, but in other embodiments, the recess 129 may have a vertical sidewall or a sidewall with a different slope than shown.

Figure 13:
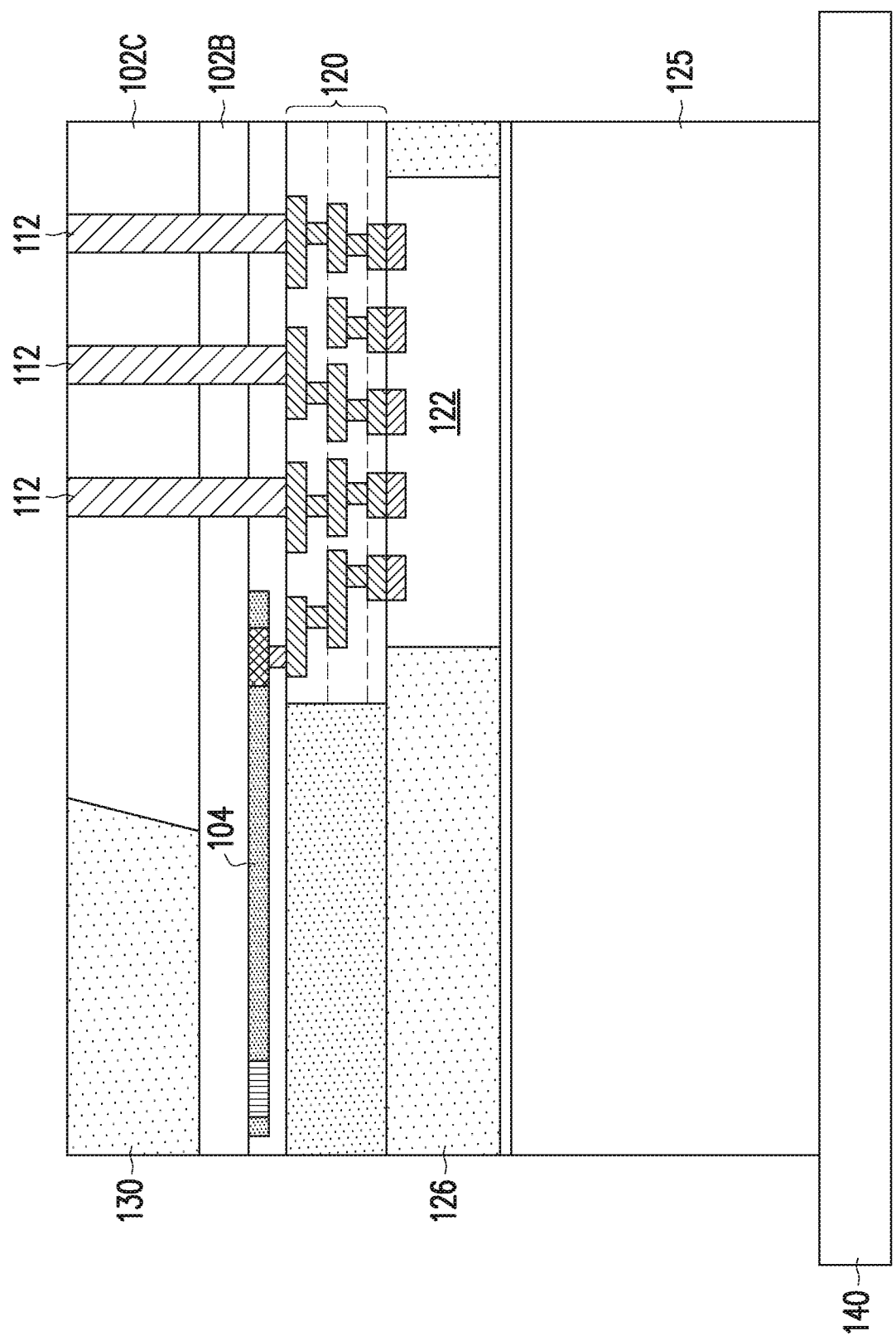

In FIG. 13, the recess 129 is filled with a dielectric layer 130, in accordance with some embodiments. The dielectric layer 130 may comprise one or more materials similar to those described above for the dielectric layer 108 or the dielectric layer 115, such as a silicon oxide or the like. In some embodiments, the dielectric layer 130 may be transparent or nearly transparent to light within the same range of wavelengths. The dielectric layer 130 may be formed using a technique similar to those described above for the dielectric layer 108 or the dielectric layer 115, or may be formed using a different technique. For example, the dielectric layer 130 may be formed by CVD, PVD, HDP-CVD, FCVD, the like, or using a different technique. In some embodiments, a planarization process (e.g., a CMP, grinding process, and or etching process) is used to remove excess material of the dielectric layer 130. The planarization process may also expose the vias 112. After performing the planarization process, the dielectric layer 130, the substrate 102C, and the vias 112 may have substantially level surfaces.

In some cases, replacing a portion of the substrate 102C over a coupler 107 with the dielectric layer 130 can improve optical coupling from an edge-mounted optical fiber (e.g., fiber 150 in FIG. 15) to the coupler 107. For example, the dielectric layer 130 may be a material that is more transparent to relevant wavelengths of light than the substrate 102C. For example, the dielectric layer 130 may be silicon oxide and the substrate 102C may be silicon, in some embodiments. In some cases, the material of the substrate 102C may reflect or absorb relevant wavelengths of light. By replacing the substrate 102C near a coupler 107 with the dielectric layer 130, less light from an optical fiber may be reflected or absorbed by the substrate 102C before reaching the coupler 107, and more light from the optical fiber may be coupled into the coupler 107. In this manner, optical loss may be reduced, and coupling efficiency between a coupler 107 and an edge-mounted optical fiber may be improved. Additionally, the formation of the dielectric layer 130 as described herein may avoid difficult process steps such as undercutting and refilling, and may allow for a photonic package with a more robust structure. In other embodiments, more than one recess 129 filled with a dielectric layer 130 may be formed, and the one or more dielectric layers 130 may provide benefits similar to those described in FIG. 22 for the dielectric layers 330A-B.

Figure 14:
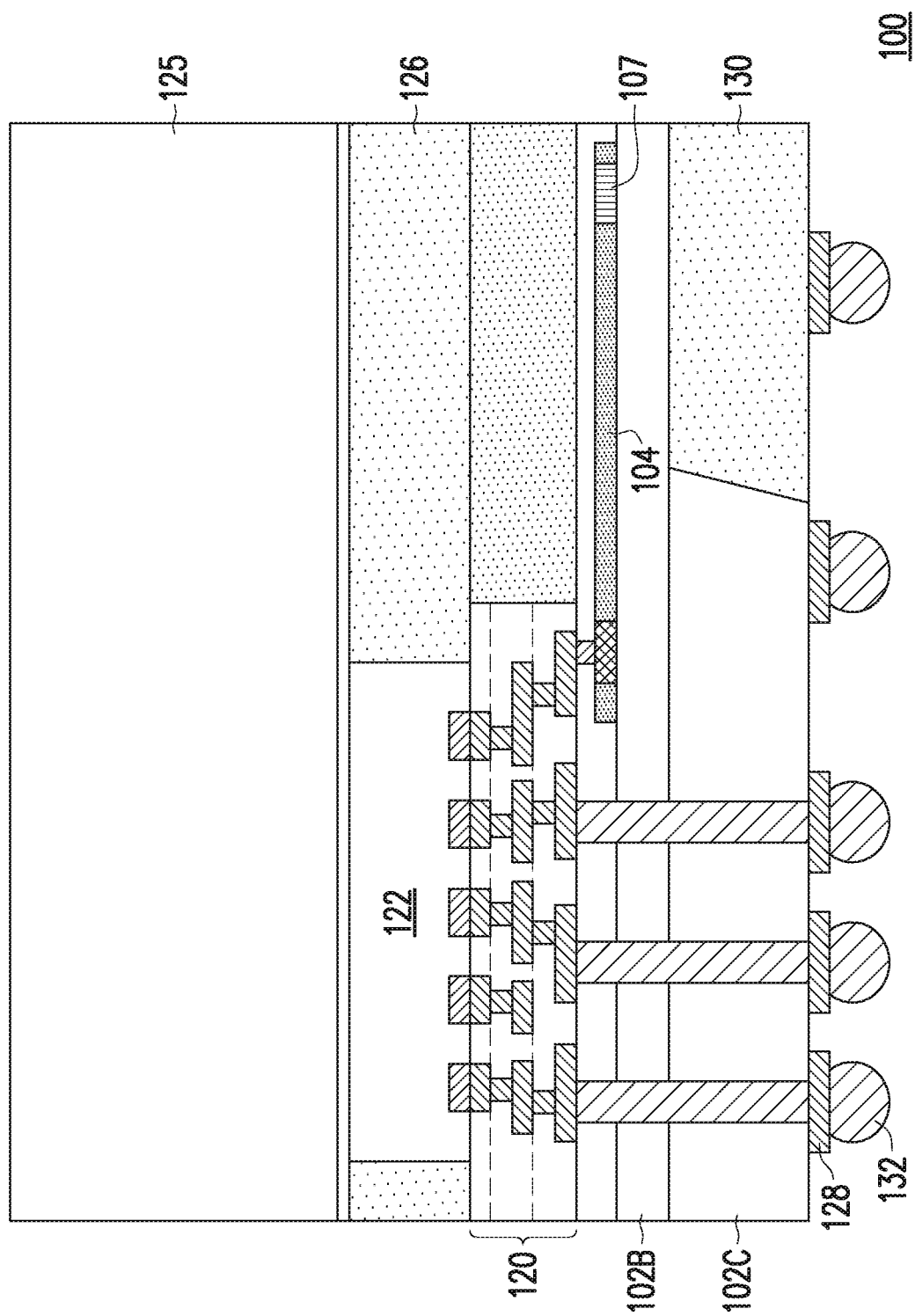

In FIG. 14, conductive pads 128 are formed on the exposed vias 112 and the substrate 102C, in accordance with some embodiments. The conductive pads 128 may be conductive pads or conductive pillars that are electrically connected to the redistribution structure 120. The conductive pads 128 may be formed from a conductive material such as copper, another metal or metal alloy, the like, or combinations thereof. The material of the conductive pads 128 may be formed by a suitable process, such as plating. For example, in some embodiments, the conductive pads 128 are metal pillars (such as copper pillars) formed by a sputtering, printing, electro plating, electroless plating, CVD, or the like. The metal pillars may be solder free and have substantially vertical sidewalls. In some embodiments, a metal cap layer (not shown) is formed on the top of the conductive pads 128. The metal cap layer may include nickel, tin, tin-lead, gold, silver, palladium, indium, nickel-palladium-gold, nickel-gold, the like, or a combination thereof and may be formed by a plating process. In some embodiments, underbump metallizations (UBMs, not shown) may be formed over the conductive pads 128. In some embodiments, a passivation layer (not shown) such as a silicon oxide or silicon nitride may be formed over the substrate 102C to surround or partially cover the conductive pads 128.

Still referring to FIG. 14, conductive connectors 132 may be formed on the conductive pads 128 to form a photonic package 100, in accordance with some embodiments. The conductive connectors 132 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 132 may include a conductive material such as solder, copper, aluminum, gold, nickel, silver, palladium, tin, the like, or a combination thereof. In some embodiments, the conductive connectors 132 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 132 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the conductive connectors 132. The metal cap layer may include nickel, tin, tin-lead, gold, silver, palladium, indium, nickel-palladium-gold, nickel-gold, the like, or a combination thereof and may be formed by a plating process.

In some embodiments, multiple photonic packages 100 may be formed on a single BOX substrate 102 and then singulated to form individual photonic packages 100 such as the photonic package 100 shown in FIG. 14. In embodiments such as this, the recess 129 and the dielectric layer 130 may extend into a scribe region that is removed during singulation. The singulation may be performed using a suitable technique, such as using a saw, laser, the like, or a combination thereof. The photonic package 100 described herein allows for optical communication with an optical fiber 150, shown below for FIG. 15.

FIG. 15 illustrates a photonic system 200, in accordance with some embodiments. The photonic system 200 includes one or more photonic packages 100 and one or more semiconductor devices 250 that are attached to an interconnect substrate 202. The photonic package 100 may be similar to those described in FIG. 14. In some embodiments, the photonic package 100 facilitates optical communication between semiconductor devices 250 and external devices, optical networks, or the like. In this manner, a photonic system 200 may combine semiconductor devices 250 and photonic packages 100 on a single interconnect substrate 202 that allows for interfacing with one or more optical fibers 150. The optical fibers 150 may be edge-mounted as shown in FIG. 15.

The interconnect substrate 202 may be for example, a glass substrate, a ceramic substrate, a dielectric substrate, an organic substrate (e.g., an organic core), a semiconductor substrate (e.g., a semiconductor wafer), the like, or a combination thereof. In some embodiments, the interconnect substrate 202 includes conductive pads 204 and conductive routing (e.g., conductive lines, vias, redistribution structures, or the like). The interconnect substrate 202 may include passive or active devices, in some embodiments. In some embodiments, the interconnect substrate 202 may be another type of structure, such as an integrated fan-out structure, a redistribution structure, or the like. In some embodiments, the interconnect substrate 202 may be similar to the interconnect substrate 1320 described for FIG. 74. The conductive connectors 132 of the photonic package 100 may be bonded to the conductive pads 204 of the interconnect substrate 202, forming electrical connections between the photonic package 100 and the interconnect substrate 202. For example, the conductive connectors 132 of the photonic package 100 may be placed in physical contact with the conductive pads 204, and then a reflow process may be performed to bond solder material of the conductive connectors 132 to the conductive pads 204. In some embodiments, an underfill 210 may be formed between the photonic package 100 and the interconnect substrate 202.

The semiconductor device 250 may be, for example, chips, dies, system-on-chip (SoC) devices, system-on-integrated-circuit (SoIC) devices, packages, the like, or a combination thereof. The semiconductor device 250 may include one or more processing devices, such as a central processing unit (CPU), a graphics processing unit (GPU), an application-specific integrated circuit (ASIC), a high performance computing (HPC) die, the like, or a combination thereof. The semiconductor device 250 may include one or more memory devices, which may be a volatile memory such as dynamic random-access memory (DRAM), static random-access memory (SRAM), high-bandwidth memory (HBM), another type of memory, or the like. The semiconductor device 250 may be attached to the interconnect substrate 202, and an underfill 210 may be formed between the semiconductor device 250 and the interconnect substrate 202.

In some embodiments, an edge-mounted optical fiber 150 may be attached to the interconnect substrate 202. The fiber 150 may be secured by a fiber holder 152 or similar structure, and may be attached to the interconnect substrate 202 and/or the photonic package 100 by an optical glue 212 or the like. In some embodiments, the fiber 150 may be actively aligned to a coupler 107 by adjusting the position of the fiber 150 while monitoring the signal strength as detected by the photonic package 100. As described previously, the use of the dielectric layer 130 may reduce optical loss of the coupling between a fiber 150 and a coupler 107.

In some embodiments, the photonic package 100 receives optical signals from an optical fiber 150 (e.g., at a coupler 107) which are detected using suitable photonic components 106. One or more electronic dies 122 in the photonic package 100 may then generate corresponding electrical signals based on the optical signals. These electrical signals may then be transmitted to the semiconductor device 250 through the interconnect substrate 202. In some embodiments, the semiconductor device 250 generates electrical signals that may be transmitted to one or more electronic dies 122 of a photonic package 100 through the interconnect substrate 202. The electronic dies 122 may then generate optical signals using suitable photonic components 106 and couple these optical signals into an optical fiber 150 (e.g., using a coupler 107). In some embodiments, the semiconductor device 250 controls the electronic dies 122 of the photonic package 100. In this manner, in some embodiments, the photonic package 100 may be considered an "optical input/output (I/O) module" for the photonic system 200. Use of photonic packages 100 as described herein may reduce the size or cost of a photonic system 200 while providing high-speed optical communication.

Figure 16:
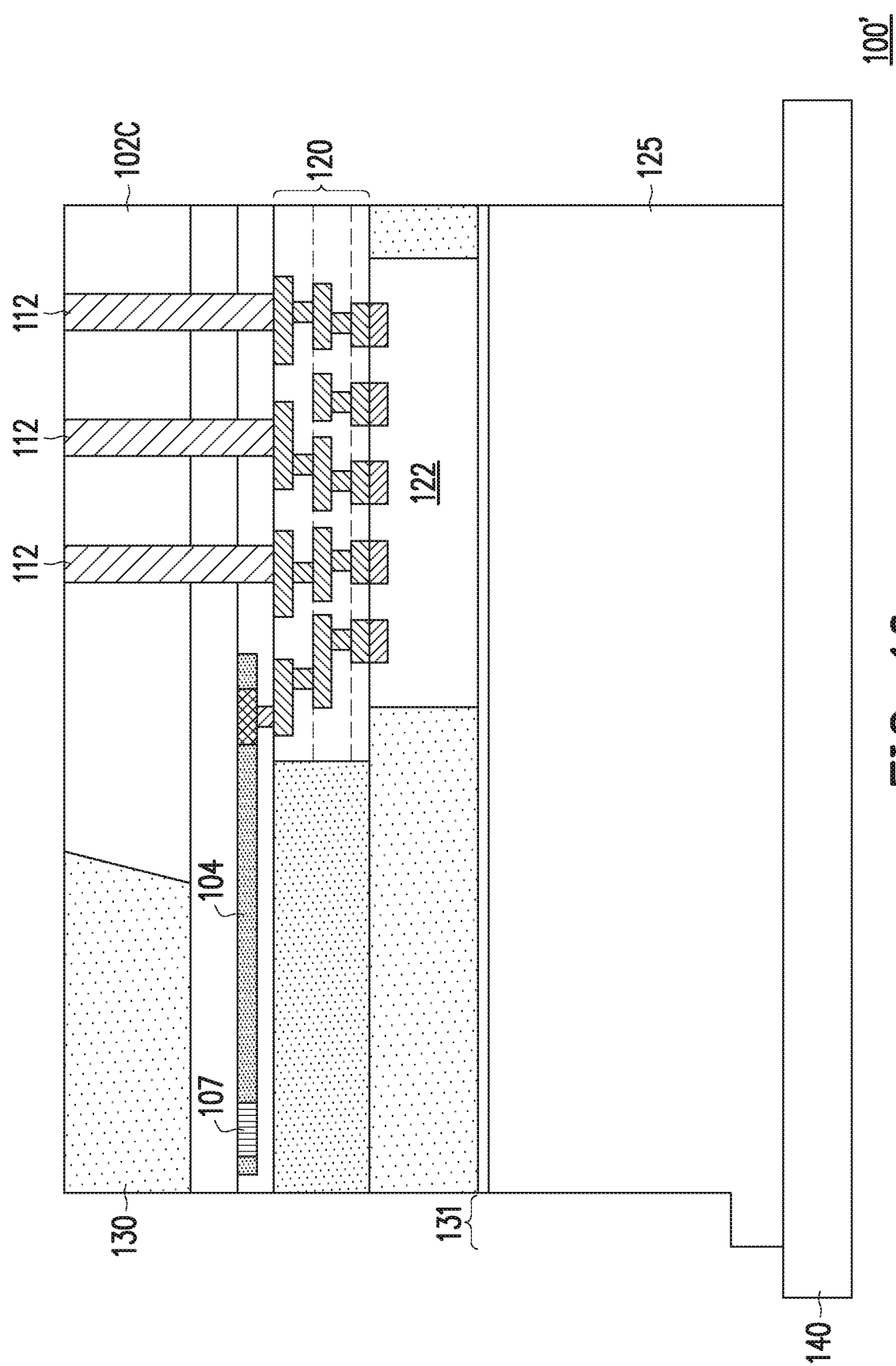
FIG. 16 illustrates a cross-sectional view of an intermediate step of forming a photonic package, in accordance with some embodiments.
Figure 17:
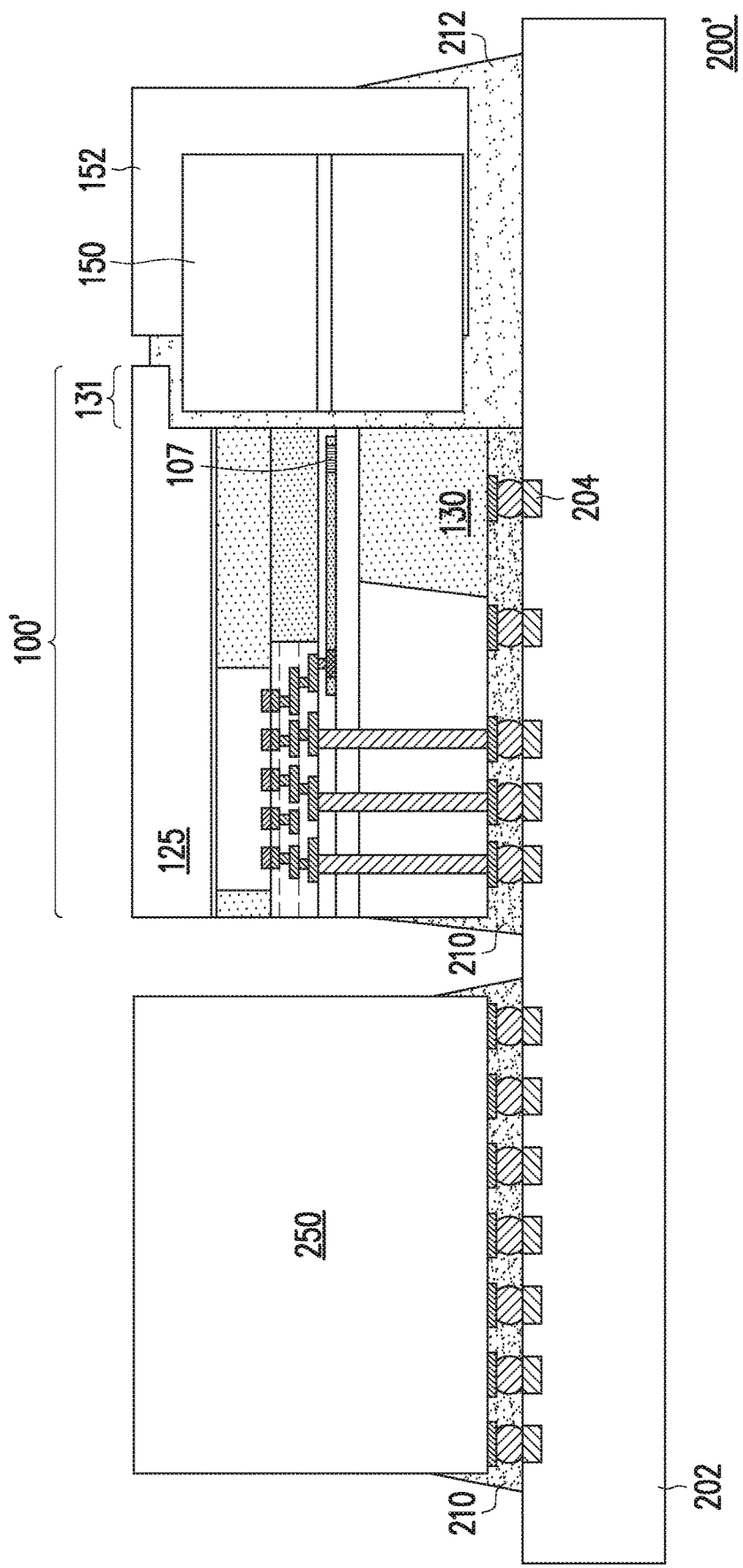
FIG. 17 illustrates a cross-sectional view of a photonic system, in accordance with some embodiments.

FIGS. 16 and 17 illustrate a photonic package 100' and a photonic system 200', in accordance with some embodiments. The photonic package 100' may be similar to the photonic package 100 shown in FIG. 14, except that a groove 131 is etched into the support 125 for facilitating the attachment of an optical fiber 150. The groove 131 may be, for example, a V-shaped or U-shaped groove, which may have facets. In some embodiments, the groove 131 is etched into the support 125 by extending the etch that forms the recess 129. In other embodiments, the groove 131 is etched in a separate etching step. Controlling the depth and size of the groove 131 may allow for the passive alignment of an optical fiber 150. For example, an optical fiber 150 may fit into the groove 131 such that the optical fiber 150 is optically coupled with the coupler 107. Passively aligning the optical fiber 150 in this manner can reduce assembly time, in some cases.

Turning to FIG. 17, a photonic system 200' is shown that includes a photonic package 100' having a groove 131, in accordance with some embodiments. The photonic system 200' is similar to the photonic system 200 shown in FIG. 15, except that the photonic system 200' includes the photonic package 100'. The optical fiber 150 may be aligned to the groove 131 of the photonic package 100' and then secured using an optical glue 212 or the like. The optical fiber 150 may also be supported by a fiber holder 152, in some embodiments.

FIGS. 18 through 23 illustrate intermediate steps in the formation of a photonic package 300, in accordance with some embodiments. The photonic package 300 is similar to the photonic package 100, except that multiple recesses 329 are formed in the substrate 102C and the electronic die 122 is attached to the vias 112 using the conductive connectors 132. In some cases, the electronic die 122 can be attached to the vias 112 at a lower cost than attaching the electronic die 122 to the redistribution structure 120 using direct bonding.

Figure 18:
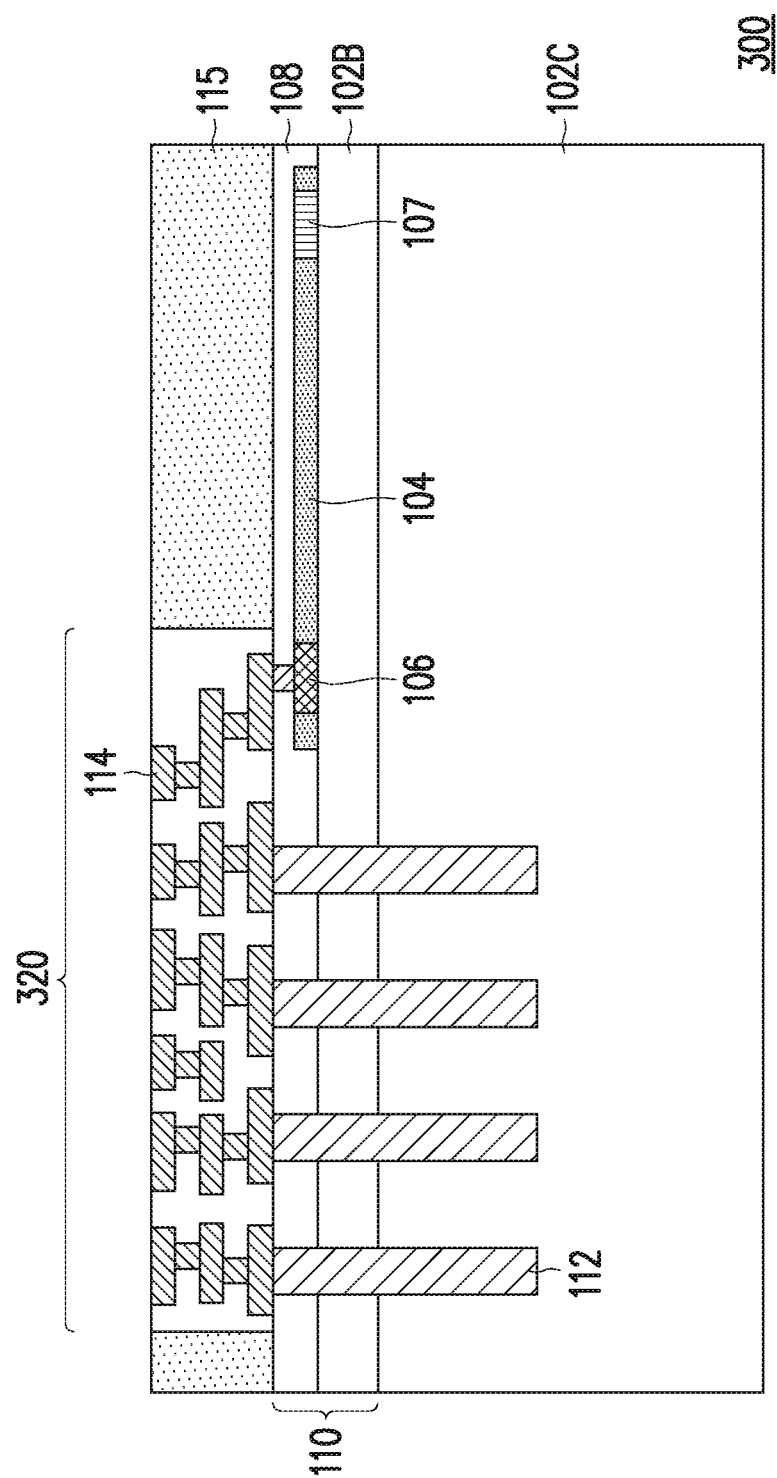
FIGS. 18 through 23 illustrate cross-sectional views of intermediate steps of forming a photonic package, in accordance with some embodiments.

FIG. 18 illustrates a structure similar to the structure shown in FIG. 7, in accordance with some embodiments. For example, the structure shown in FIG. 18 comprises one or more waveguides 104, one or more photonic components 106, one or more couplers 107, vias 112, and a redistribution structure 320. The waveguides 104, photonic components 106, couplers 107, and vias 112 may be similar to those described previously for the photonic package 100, and may be formed in a similar manner. The redistribution structure 320 may be similar to the redistribution structure 120 described for FIGS. 6-7, and may be formed in a similar manner. The redistribution structure 320 may have a top surface that is substantially level with the dielectric layer 115. In some embodiments, the redistribution structure 320 includes a layer of conductive features 114 instead of a layer of conductive pads 116.

Figure 19:
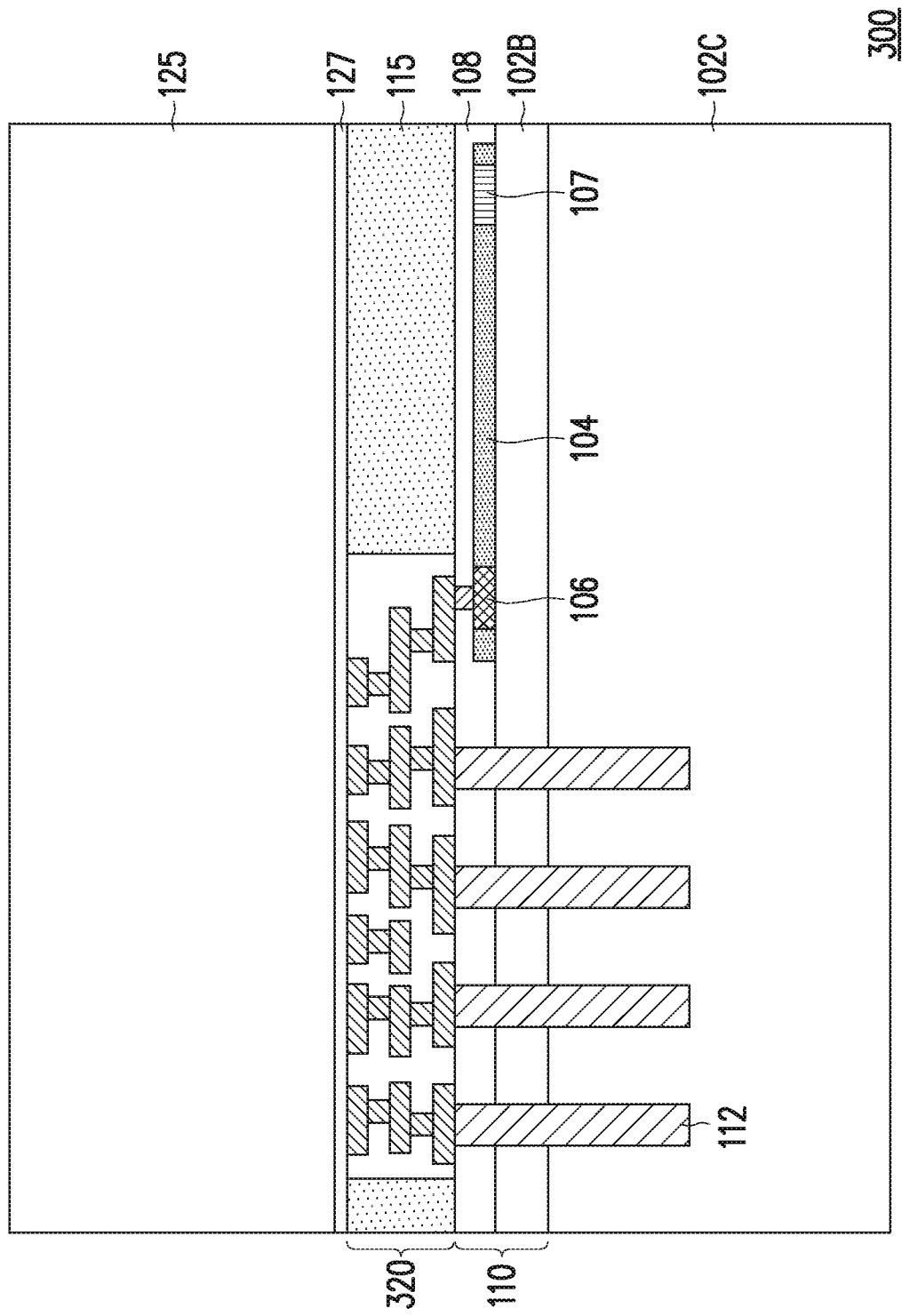
Figure 20:
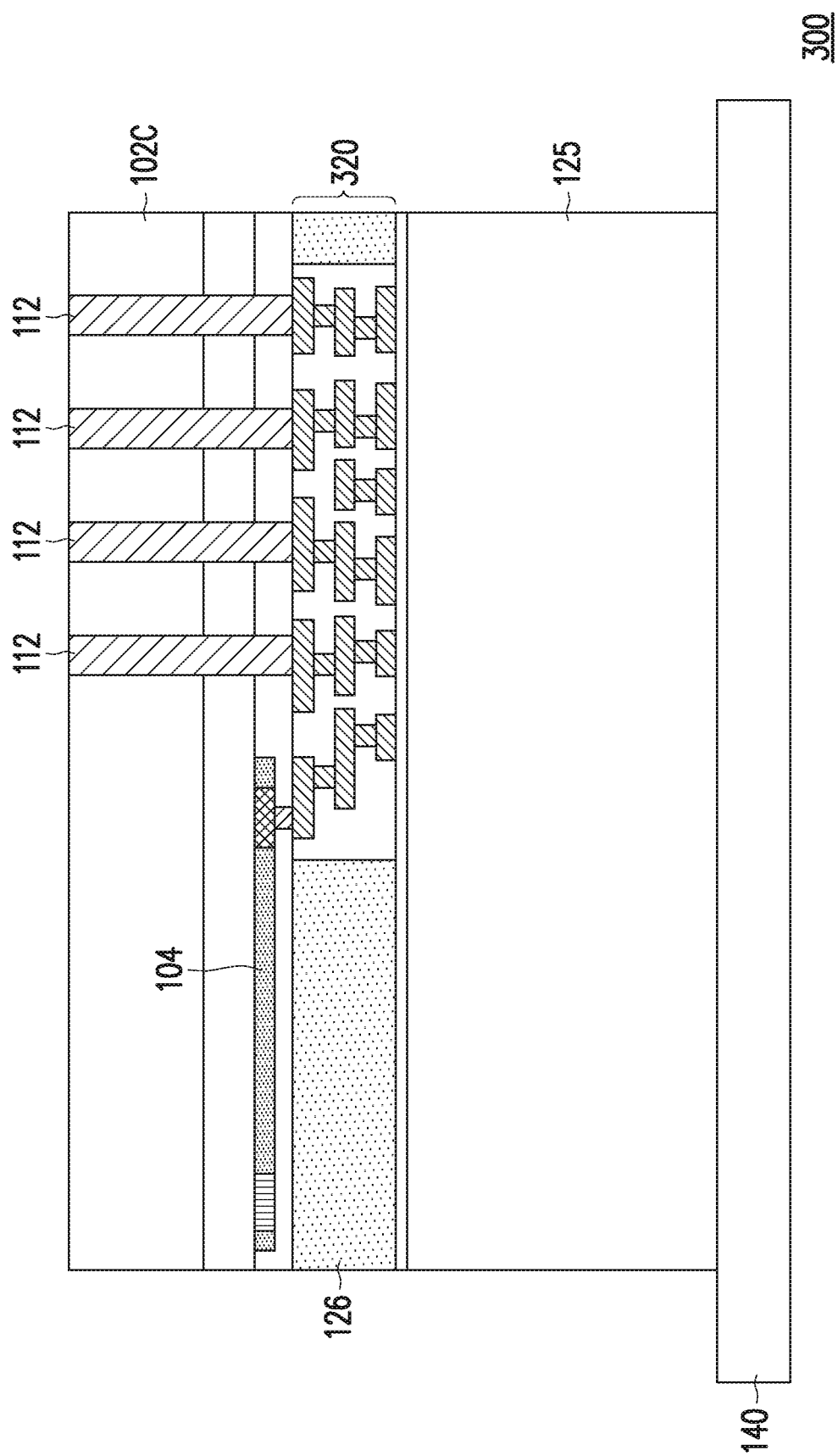

In FIG. 19, a support 125 is attached to the structure. The support 125 may be similar to the support 125 described previously for FIG. 10, and may be attached in a similar manner. For example, the support 125 may be attached to the redistribution structure 320 and the dielectric layer 115 using an adhesive layer 127. In FIG. 20, the structure is flipped over and attached to a carrier 140, in accordance with some embodiments. The carrier 140 may be similar to the carrier 140 described previously for FIG. 11. The structure may be attached to the carrier 140 using, for example, an adhesive or a release layer (not shown). The back side of the substrate 102C is then thinned to expose the vias 112, in accordance with some embodiments. The substrate 102C may be thinned by a CMP process, a mechanical grinding, an etching process, the like, or a combination thereof.

Figure 21:
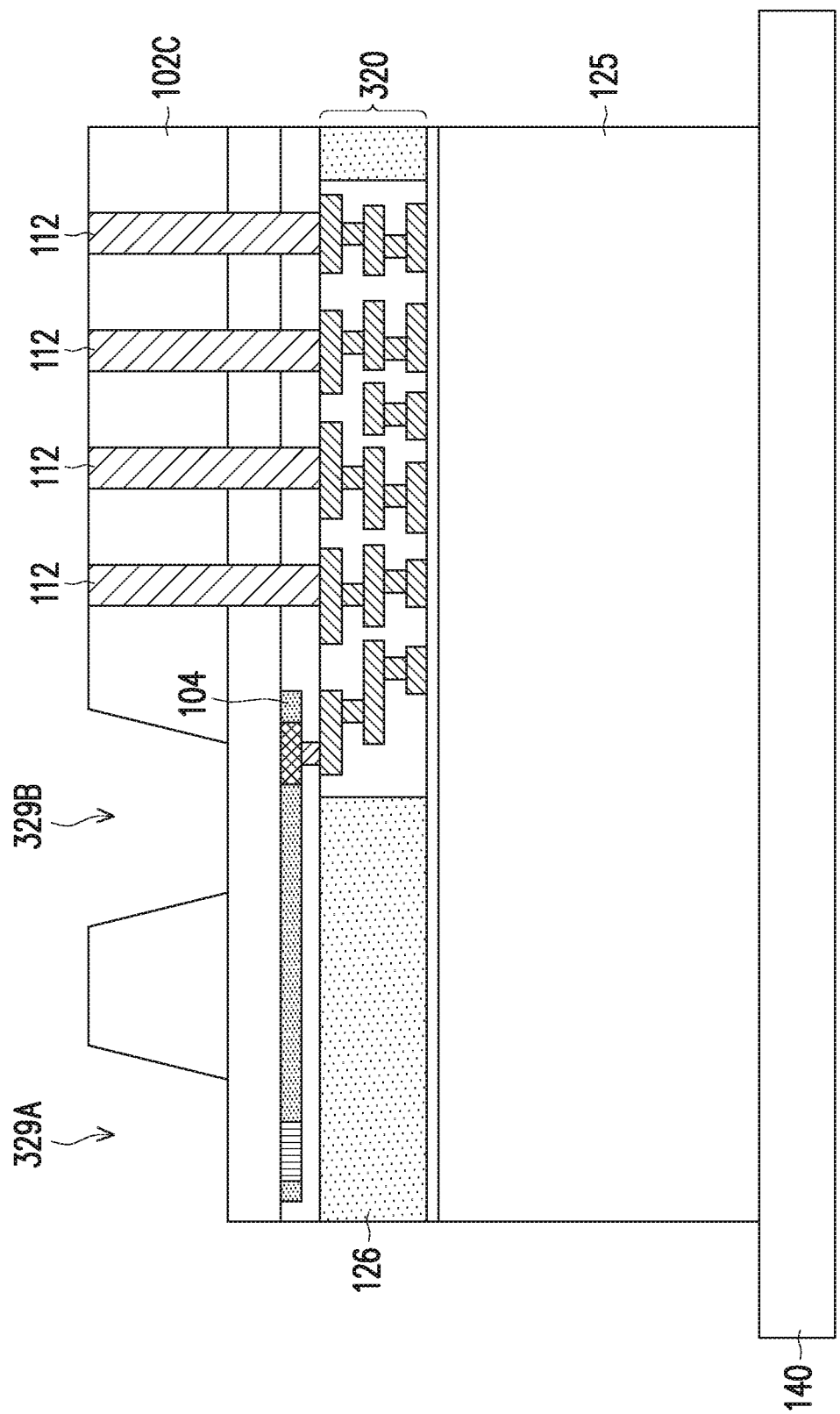

In FIG. 21, a portion of the substrate 102C is removed to form multiple recesses 329 that expose the oxide layer 102B, in accordance with some embodiments. FIG. 21 shows two recesses 329A and 329B, but more than two recesses 329 may be formed in other embodiments. The recess 329A may extend over the waveguide 104 and over a coupler 107, and may extend to an edge of the photonic package 300, as shown in FIG. 21. The recess 329B may be formed away from the edge of the photonic package 300, and a remaining portion of the substrate 102C may separate the recess 329A and the recess 329B. The recesses 329A and 329B may have differing sizes or shapes, which may be different than those shown in FIG. 21.

The recesses 329A-B may be formed using suitable photolithography and etching techniques, such as those described for the recesses 129 shown in FIG. 12. For example, in some embodiments, a photoresist may be formed over the structure and patterned, and then the substrate 102C may be etched using the patterned photoresist as an etching mask. In some embodiments, sidewalls of the recesses 329A-B are sloped or faceted, such as shown in FIG. 21, but in other embodiments, the recesses 329A-B may have vertical sidewalls or sidewalls with different slopes than shown.

Figure 22:
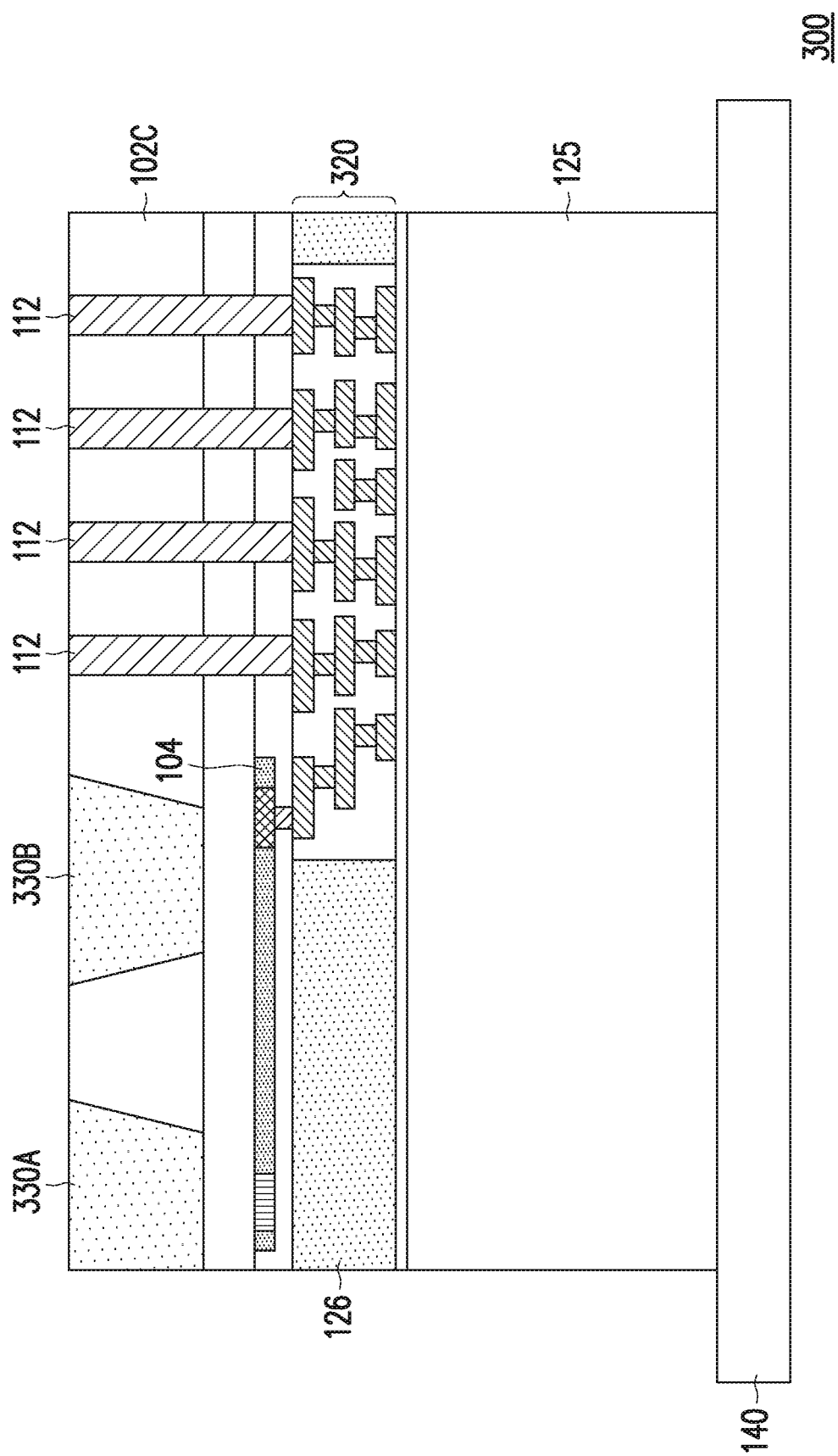

In FIG. 22, the recesses 329A-B are filled with a dielectric material to form a dielectric layer 330A in the recess 329A and a dielectric layer 330B in the recess 329B, in accordance with some embodiments. The dielectric material may comprise one or more materials similar to those described for the dielectric layer 130 in FIG. 13, such as a silicon oxide or the like. The dielectric material may be formed using a technique similar to those described above for the dielectric layer 130. In some embodiments, a planarization process (e.g., a CMP, grinding process, and or etching process) is used to remove excess dielectric material of the dielectric layers 330A-B. The planarization process may also expose the vias 112. After performing the planarization process, the dielectric layers 330A-B, the substrate 102C, and the vias 112 may have substantially level surfaces.

In some cases, replacing a portion of the substrate 102C over a coupler 107 with the dielectric layer 330A can improve optical coupling from an edge-mounted optical fiber (e.g., optical fiber 150 in FIG. 24) to the coupler 107. This improvement is similar to that described previously for the dielectric layer 130 in FIG. 13. In some cases, replacing a portion of the substrate 102C over a coupler 107 with the dielectric layer 330B can improve electrical isolation and/or thermal isolation of the photonic package 300. For example, in some embodiments, the dielectric layer 330B may be formed over a photonic component 206 or over the redistribution structure 320. In some cases, the dielectric material of the dielectric layer 330B can provide better electrical insulation than the material of the substrate 102C. Thus, forming a dielectric layer 330B may allow for reduced electrical leakage or improved electrical isolation. Additionally, in some cases, the dielectric material of the dielectric layer 330B can provide better thermal insulation than the material of the substrate 102C. Thus, replacing a portion of the substrate 102C with the dielectric layer 330B can allow for better thermal isolation of components or structures near the dielectric layer 330B. In some cases, photonic structures such as photonic components 106, waveguides 104, or couplers 107 may have improved performance at elevated temperatures. A dielectric layer 330B may be formed near such photonic structures to provide improved thermal isolation and improved heating efficiency of the photonic structures, which can improve performance of the photonic package 300. In some cases, a dielectric layer 330A over a coupler 107 may also provide similar benefits to electrical isolation or thermal isolation.

Figure 23:
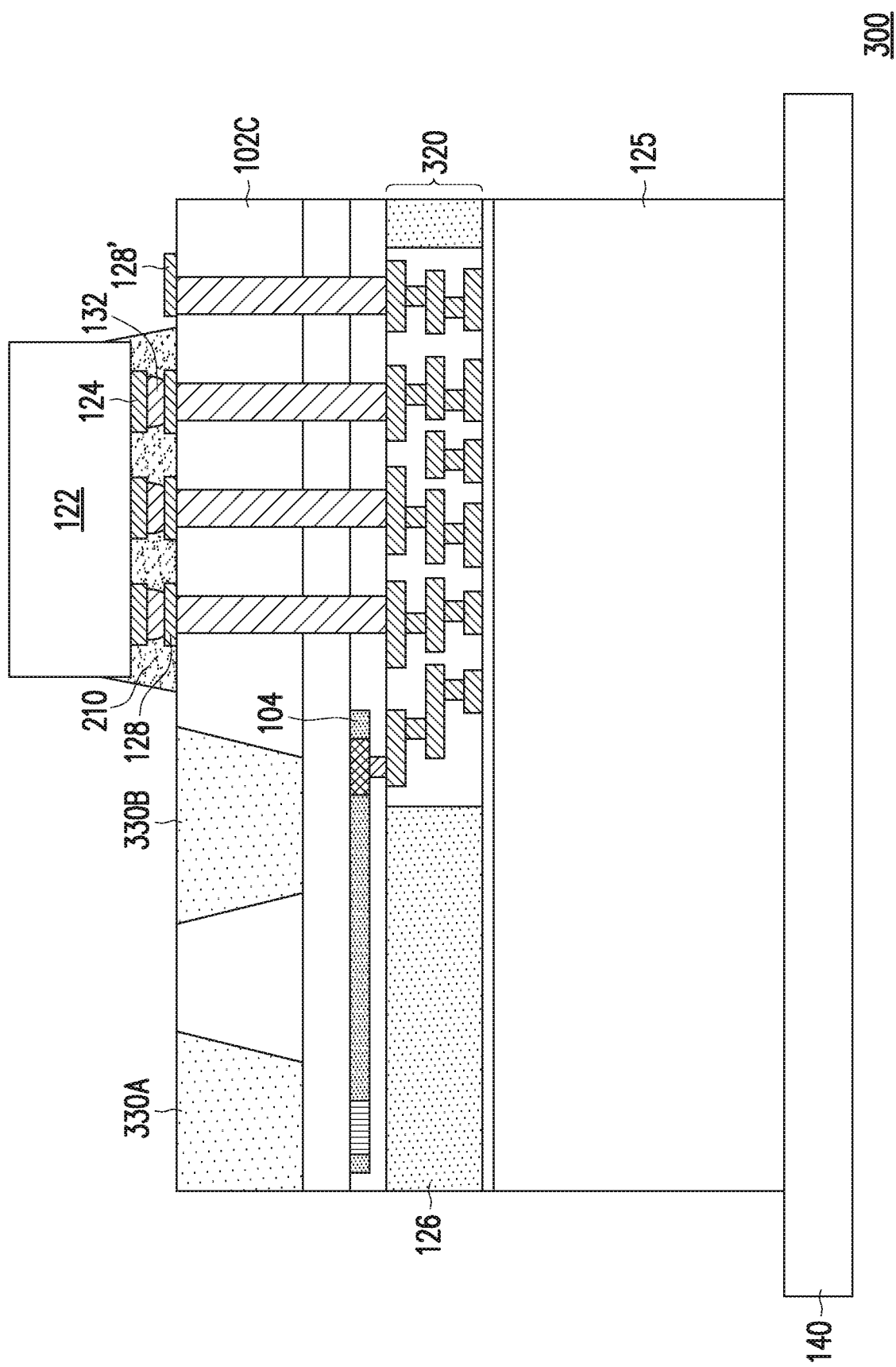

In FIG. 23, conductive pads 128 and conductive connectors 132 are formed on the vias 112, and an electronic die 122 is attached to the conductive connectors 132, in accordance with some embodiments. The conductive pads 128 and conductive connectors 132 may be similar to those described previously for FIG. 14. In some embodiments, the conductive pads 128 may include one or more conductive pads subsequently used for wire bonding (see FIG. 24), an example of which is indicated in FIG. 23 as conductive pad 128'.

The electronic die 122 may be similar to the electronic die 122 described previously for FIG. 8, and more than one electronic die 122 may be present. In some embodiments, the electronic die 122 may be bonded to the conductive pads 128, forming electrical connections between the vias and the electronic die 122. For example, connectors 124 of the electronic die 122 may be placed in physical contact with the conductive connectors 132, and then a reflow process may be performed to bond solder material of the conductive connectors 132 to the connectors 124. In some embodiments, an underfill 210 may be formed between the electronic die 122 and the substrate 102C. In some cases, attaching an electronic die 122 using conductive connectors 132 may reduce processing cost. In this manner, a photonic package 300 may be formed. In other embodiments, a groove 131 similar to that shown in FIG. 16 may be formed in the photonic package 300. After attaching the electronic die 122, the carrier 140 may be removed from the structure.

Figure 24:
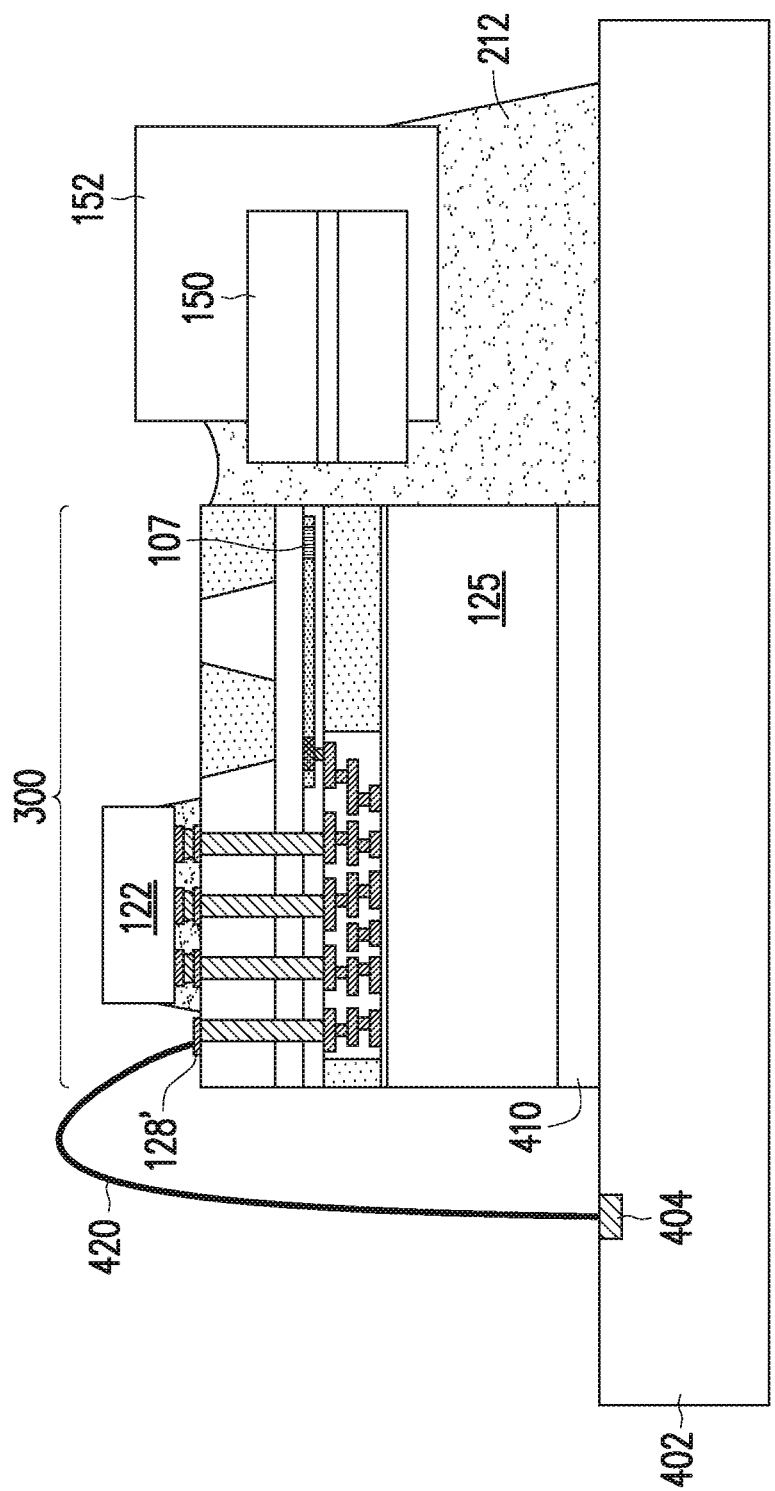
FIG. 24 illustrates a cross-sectional view of a photonic system, in accordance with some embodiments.

FIG. 24 illustrates a photonic system 400, in accordance with some embodiments. The photonic system 400 includes one or more photonic packages 300 attached to an interconnect substrate 402. The photonic package 300 may be similar to those described for FIG. 23. The interconnect substrate 402 may be similar to the interconnect substrate 202 described for FIG. 15. For example, the interconnect substrate 402 may include one or more conductive pads 404 similar to the conductive pads 204 of the interconnect substrate 202. In some embodiments, the support 125 of the photonic package 300 is attached to the interconnect substrate 402 using an adhesive layer 410 or another suitable technique.

In some embodiments, the photonic package 300 is electrically connected to the interconnect substrate 402 using one or more wire bonds 420. The wire bonds 420 may be connected to the conductive pads 128' of the photonic package 300 and to the conductive pads 404 of the interconnect substrate 402. An encapsulant, molding compound, or the like may be subsequently deposited over the wire bonds 420 in some embodiments (not shown in FIG. 24). One or more edge-mounted optical fibers 150 may also be attached to the interconnect substrate 402 and optically coupled to couplers 107 of the photonic package 300. In some embodiments, one or more semiconductor devices 250 similar to those described for FIG. 15 may be connected to the interconnect substrate 402 (not shown in FIG. 24).

Figure 25:
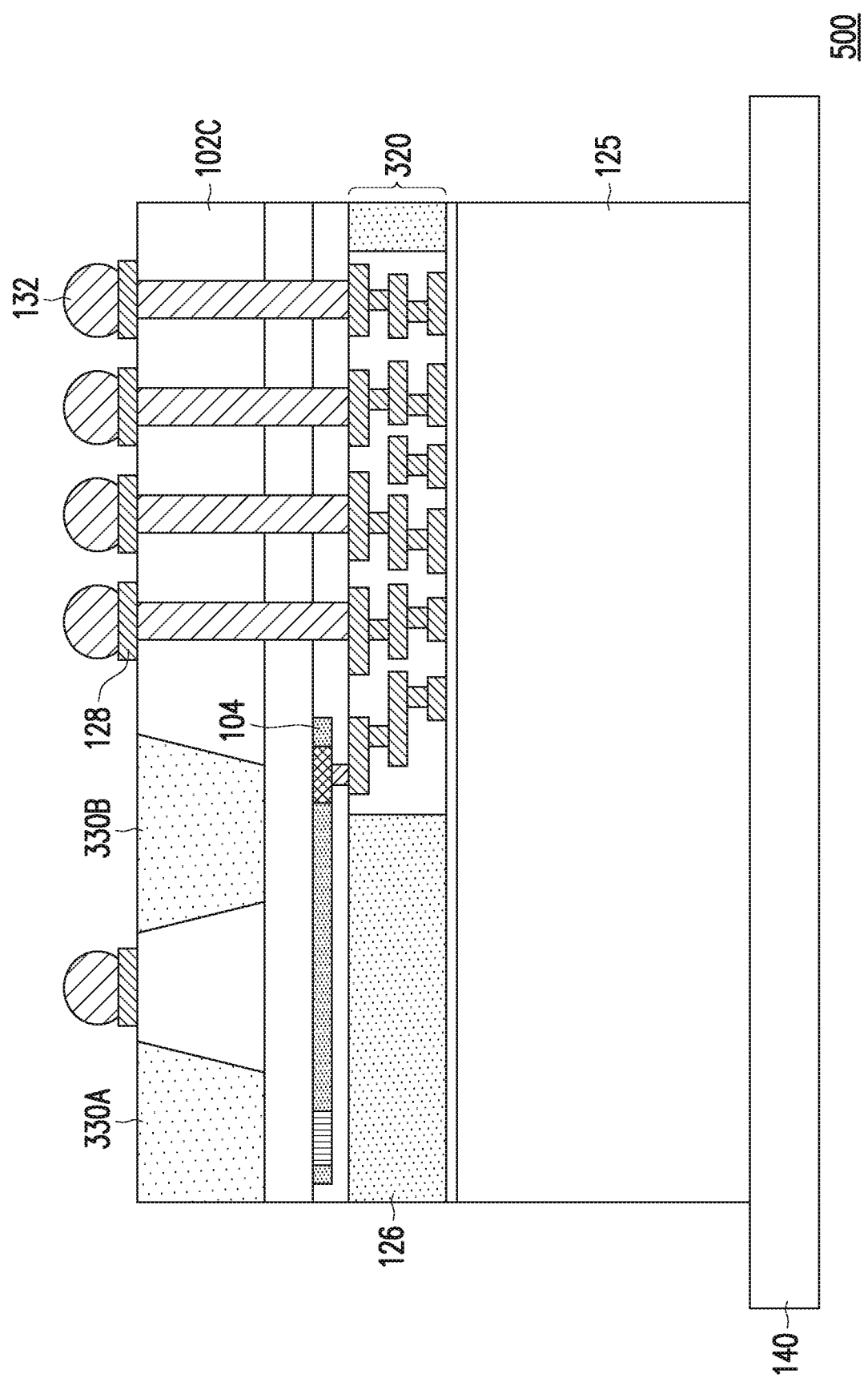
FIG. 25 illustrates a cross-sectional view of an intermediate step of forming a photonic package, in accordance with some embodiments.

FIG. 25 illustrates a photonic package 500, in accordance with some embodiments. The photonic package 500 is similar to the photonic package 300 shown in FIG. 23, except that electronic dies 122 are not attached to the conductive connectors 132, and thus the photonic package 500 does not include electronic dies 122. The photonic package 500 may include one or more dielectric layers 330A-B, which may be similar to the dielectric layers 330A-B described for FIG. 23 or the dielectric layer 130 described for FIG. 13.

Figure 26:
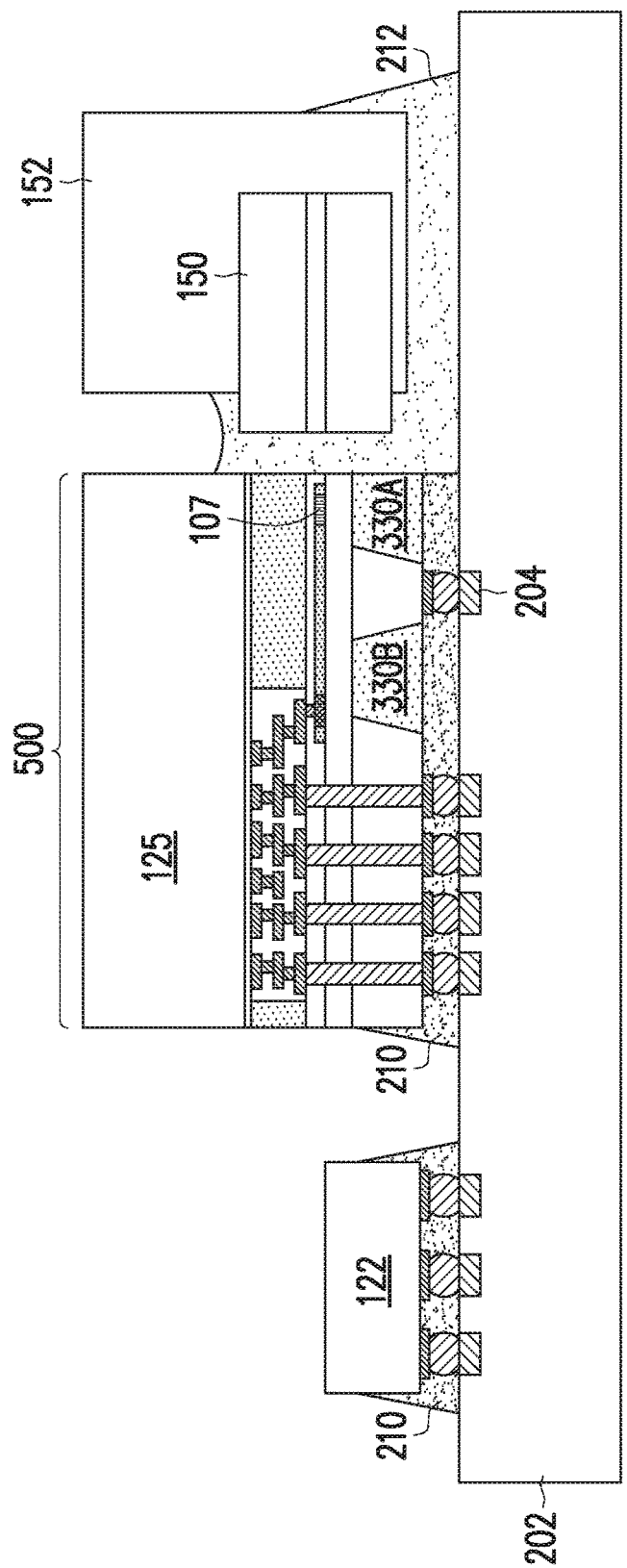
FIG. 26 illustrates a cross-sectional view of a photonic system, in accordance with some embodiments.

FIG. 26 illustrates a photonic system 550, in accordance with some embodiments. The photonic system 550 includes one or more photonic packages 500 attached to an interconnect substrate 202. The photonic packages 500 may be similar to those described for FIG. 25. The interconnect substrate 202 may be similar to the interconnect substrate 202 described for FIG. 15. For example, the interconnect substrate 202 may include one or more conductive pads 204.

The conductive connectors 132 of the photonic package 500 may be bonded to the conductive pads 204 of the interconnect substrate 202, forming electrical connections between the photonic package 500 and the interconnect substrate 202. For example, the conductive connectors 132 of the photonic package 500 may be placed in physical contact with the conductive pads 204, and then a reflow process may be performed to bond solder material of the conductive connectors 132 to the conductive pads 204. In some embodiments, an underfill 210 may be formed between the photonic package 500 and the interconnect substrate 202.

In some embodiments, one or more electronic dies 122 are connected to the interconnect substrate 202. The electronic dies 122 may be similar to those described previously. The electronic dies 122 may be connected to the conductive pads 204 of the interconnect substrate 202 using, for example, solder bumps or the like. In this manner, the electronic dies 122 may be electrically connected to the photonic package 500 through the interconnect substrate 202. In some cases, attaching the electronic dies 122 to the interconnect substrate 202 may allow for more flexibility of design, a thinner photonic system 550, or reduced processing cost. One or more edge-mounted optical fibers 150 may also be attached to the interconnect substrate 202 and optically coupled to couplers 107 of the photonic package 500. In some embodiments, one or more semiconductor devices 250 similar to those described for FIG. 15 may be connected to the interconnect substrate 202 (not shown in FIG. 26).

FIGS. 27 through 42 illustrate intermediate steps in the formation of a photonic package 600, in accordance with some embodiments. The photonic package 600 is similar to the photonic package 100, except that one or more waveguides 604 (see waveguides 604A-B in FIG. 42) are formed over the waveguides 104 and optically coupled to the waveguides 104. The waveguides 604 are formed of a different material than the waveguides 104. For example, the waveguides 604 may be formed of silicon nitride or a polymer and the waveguides 104 may be formed of silicon. Other materials are possible. In some cases, the waveguides 604 may be formed of a material that has less optical loss or less process cost than the waveguides 104. In this manner, an optical network formed of the waveguides 104 and the waveguides 604 may be formed in a photonic package 600, which may improve the efficiency or performance of the photonic package 600.

Figure 27:
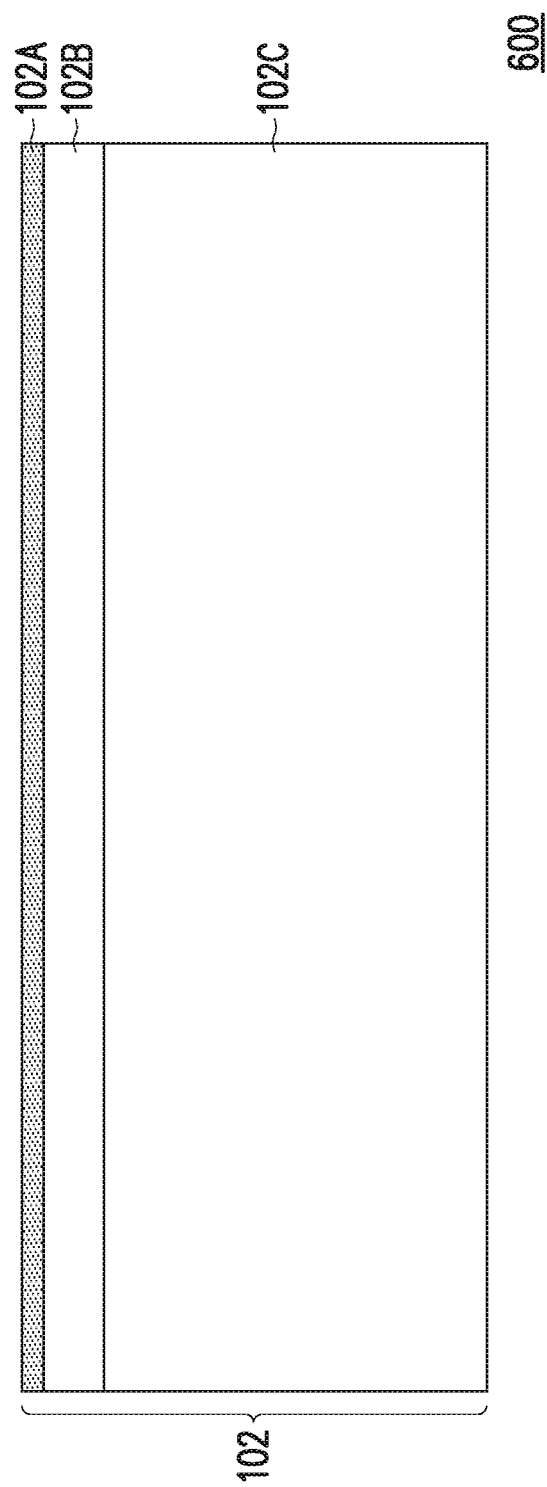
FIGS. 27 through 42 illustrate cross-sectional views of intermediate steps of forming a photonic package, in accordance with some embodiments.
Figure 28:
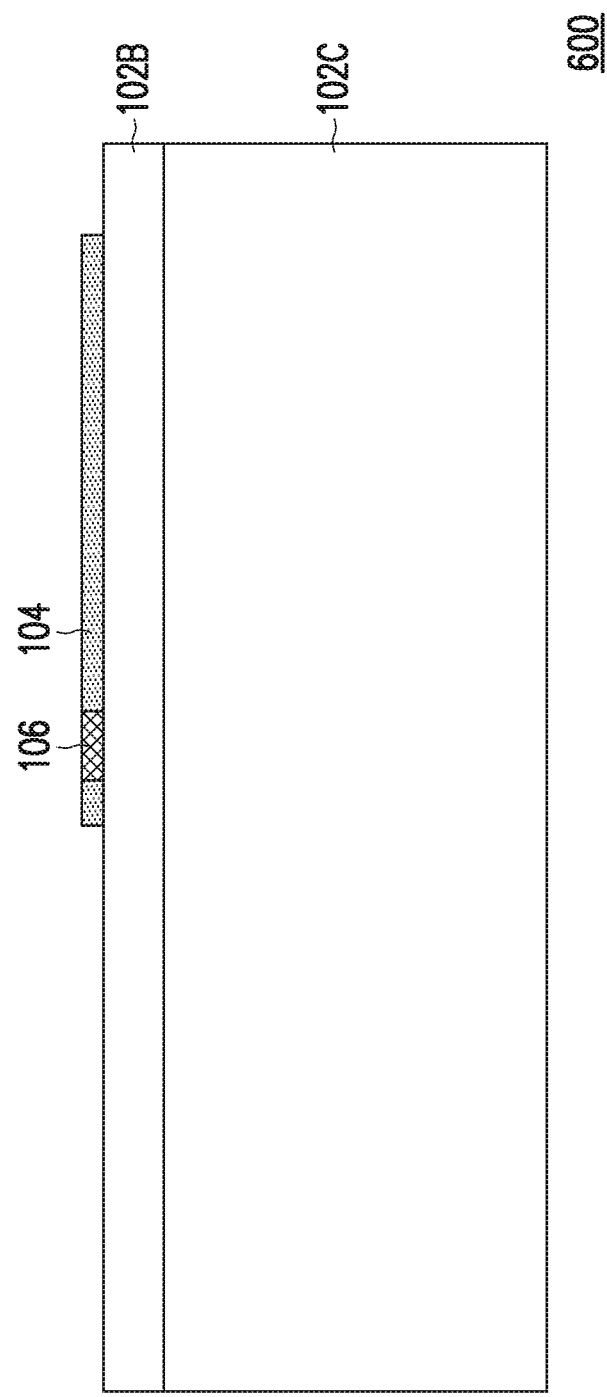

FIG. 27 illustrates a BOX substrate 102, in accordance with some embodiments. The BOX substrate 102 may be similar to the BOX substrate 102 described for FIG. 1. For example, the BOX substrate may include an oxide layer 102B formed over a substrate 102C, and a silicon layer 102A formed over the oxide layer 102B. In FIG. 28, the silicon layer 102A is patterned to form silicon regions for waveguides 104 and/or photonic components 106, in accordance with some embodiments. The waveguides 104 or photonic components 106 may be similar to those described previously for FIG. 2, and may be formed in a similar manner. In some embodiments, one or more couplers 107 are also formed (not shown in FIG. 28).

Figure 29:
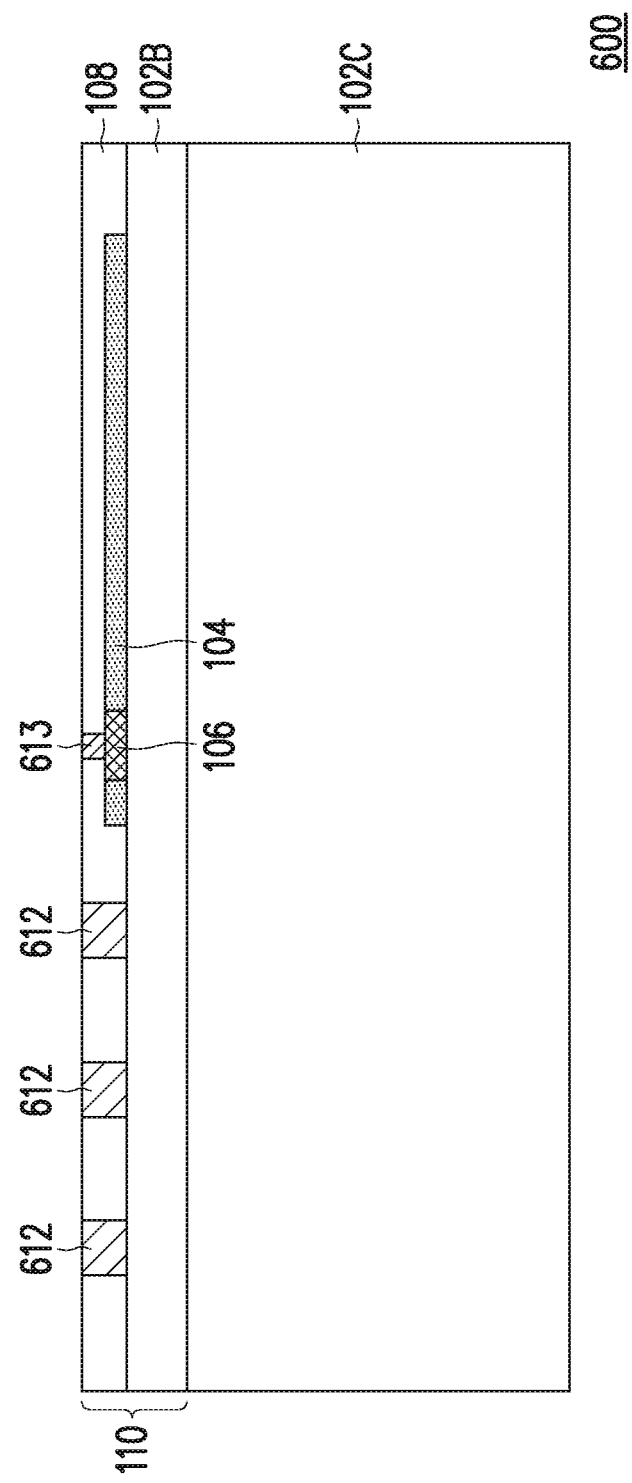

In FIG. 29, a dielectric layer 108 is formed on the front side of the BOX substrate 102, and vias 612 and contacts 613 are formed in the dielectric layer 108, in accordance with some embodiments. The dielectric layer 108 is formed over the waveguides 104, the photonic components 106, and the oxide layer 102B. The dielectric layer 108 may be similar to the dielectric layer 108 described previously for FIG. 3.

The vias 612 and contacts 613 may then be formed in the dielectric layer 108. The vias 612 may extend into the dielectric layer 108, and the contacts 613 may extend into the dielectric layer 108 to make electrical contact with the photonic components 106. In some embodiments, the vias 612 or contacts 613 may be formed using a damascene process, e.g., single damascene, dual damascene, or the like. The vias 612 and the contacts 613 may be formed, for example, by forming openings in the dielectric layer 108 using acceptable photolithography and etching techniques. The openings may extend partially or fully through the dielectric layer 108, or may extend partially into the oxide layer 102B, in some embodiments. After forming the openings, conductive material may be deposited within the openings to form the vias 612 and the contacts 613. The conductive material of the vias 612 and/or the contacts 613 may be a material similar to that described previously for the vias 112 or the contacts 113 (see FIG. 5), and may be formed using similar techniques. The vias 612 or contacts 613 may be formed using other techniques or materials in other embodiments.

Figure 30:
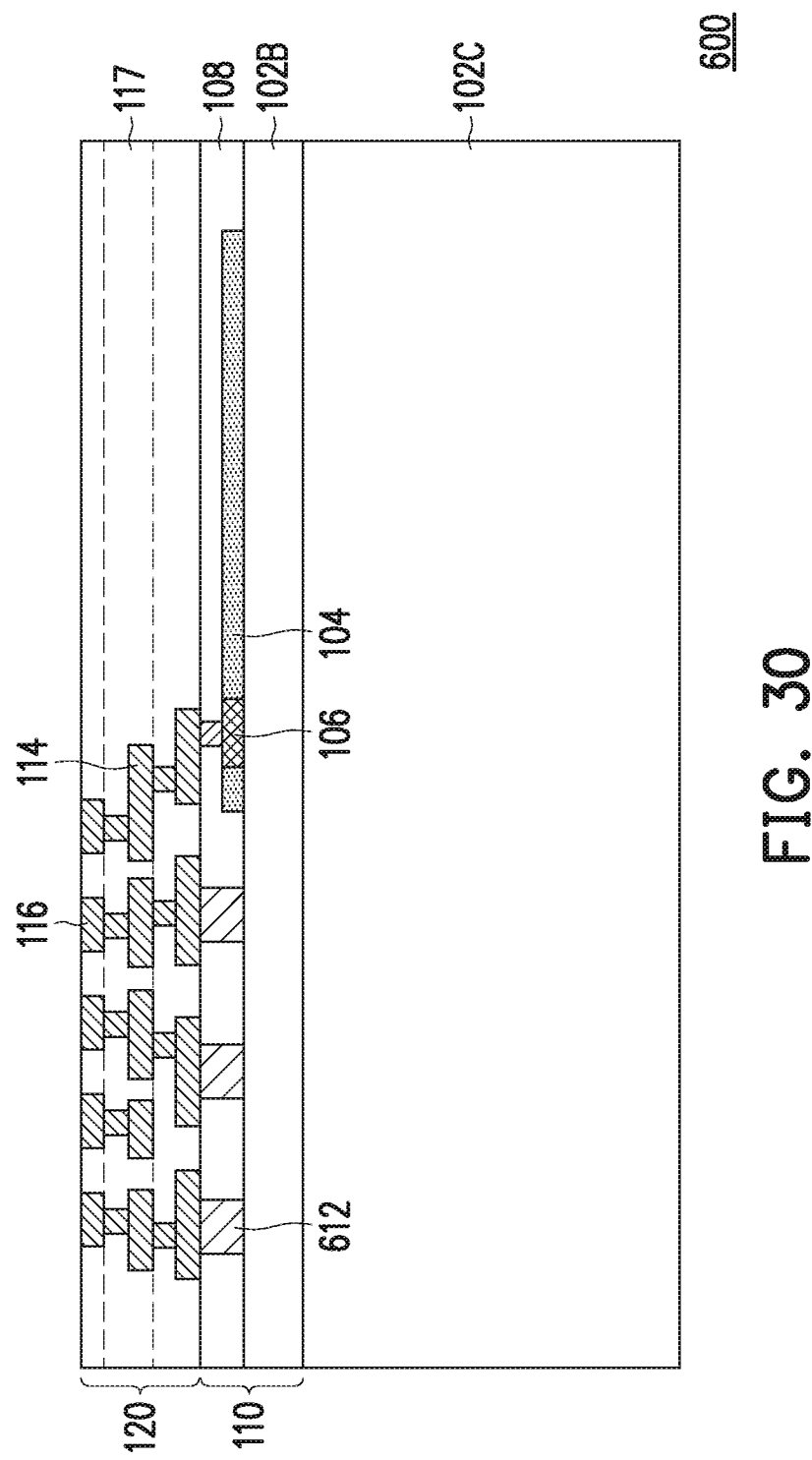
Figure 31:
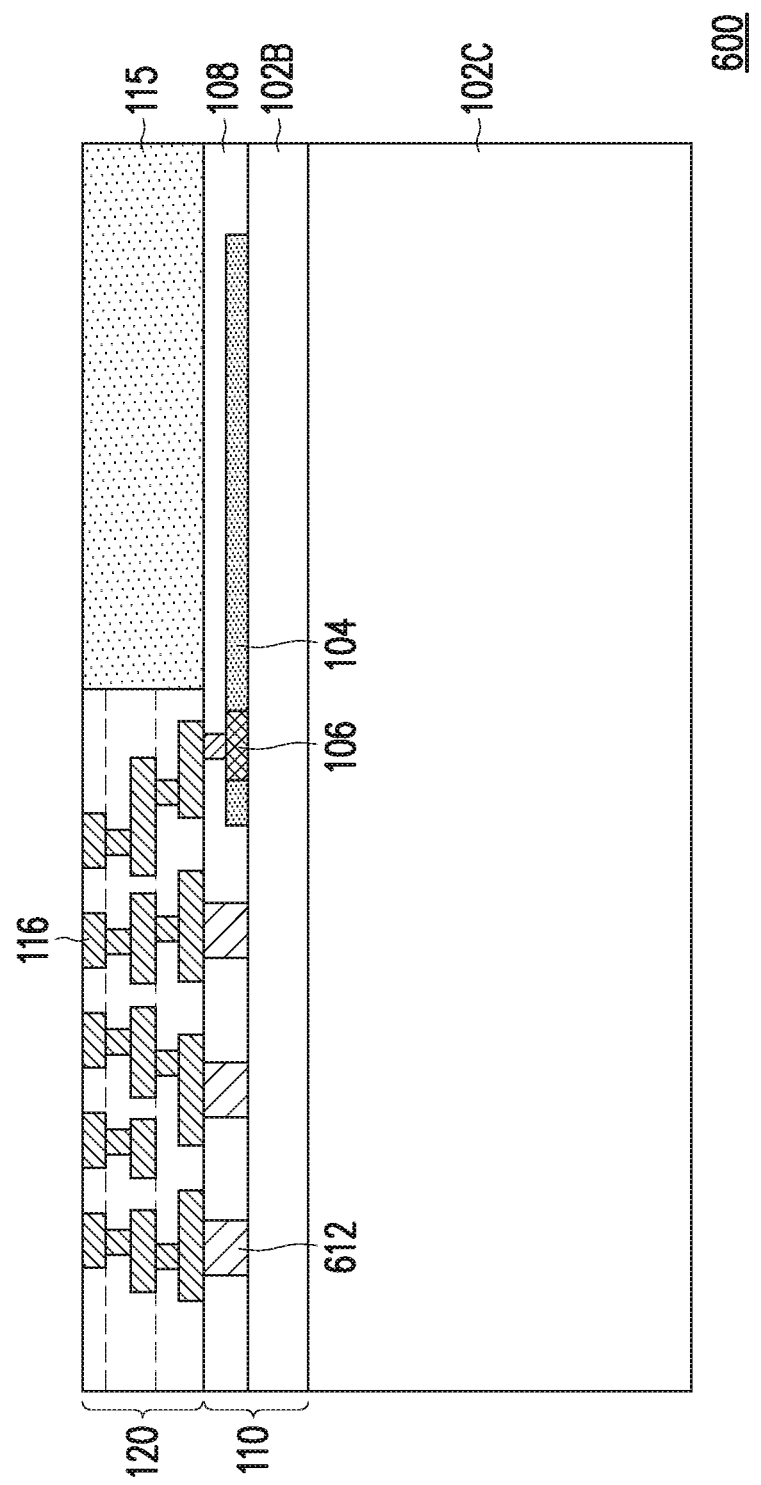

In FIG. 30, a redistribution structure 120 is formed over the dielectric layer 108, in accordance with some embodiments. The redistribution structure 120 may be similar to the redistribution structure 120 described for FIG. 6. For example, the redistribution structure 120 may include dielectric layers 117 and conductive features 114 formed in the dielectric layers 117 that provide interconnections and electrical routing. The redistribution structure 120 may connect the vias 612, the contacts 613, and/or overlying devices such as electronic dies 122 (see FIG. 32). In FIG. 31, a portion of the redistribution structure 120 is removed and replaced by a dielectric layer 115, in accordance with some embodiments. The removal of the portion of the redistribution structure 120 and deposition of the dielectric layer 115 may be similar to the process and materials described previously for FIG. 7.

Figure 32:
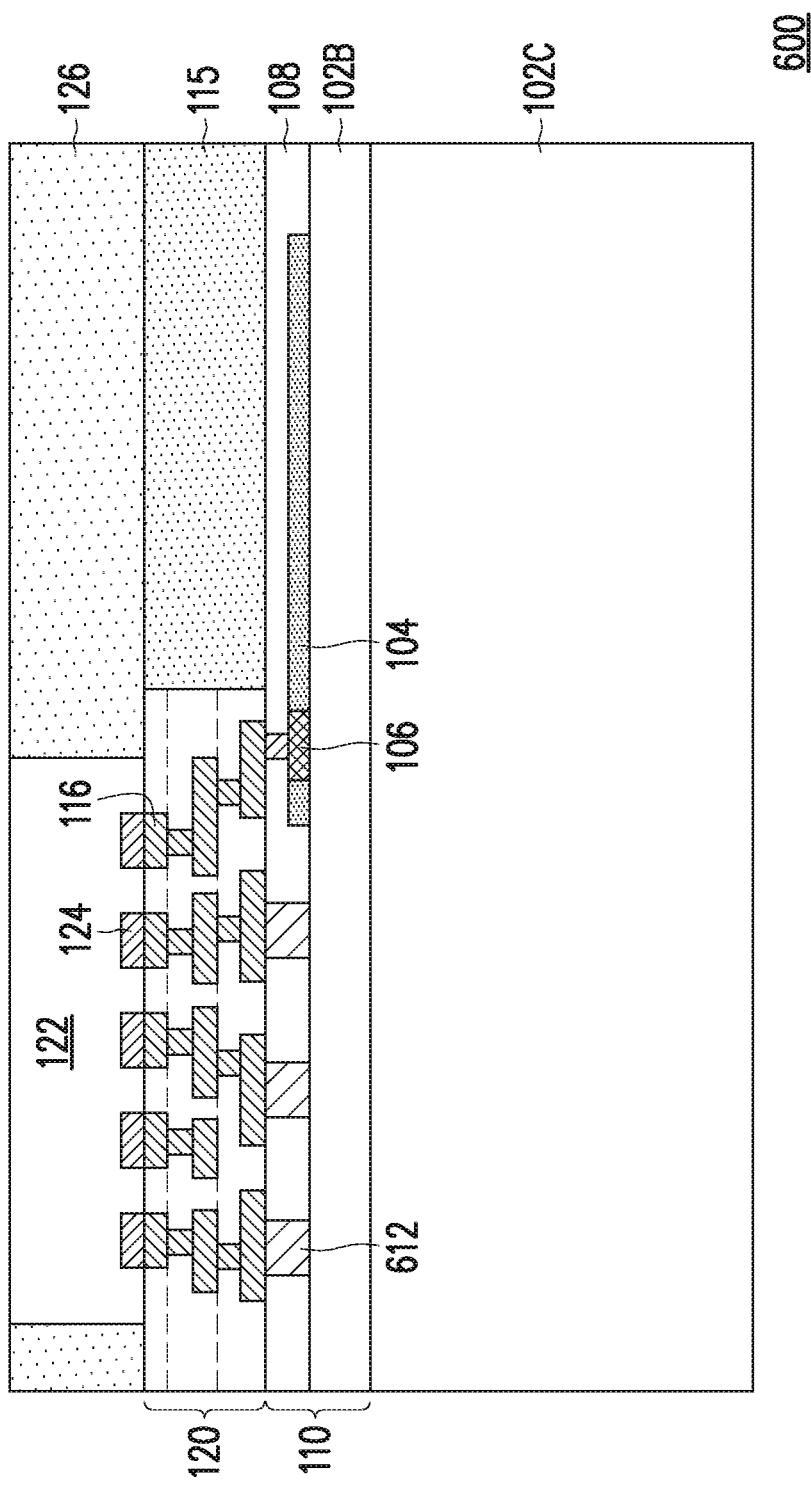

In FIG. 32, one or more electronic dies 122 are attached to the redistribution structure 120, and a dielectric material 126 is formed, in accordance with some embodiments. The electronic die 122 may be similar to the electronic die 122 described for FIG. 8, and may be attached to the redistribution structure 120 using similar techniques. For example, the electronic die 122 may be attached using direct bonding or the like. The dielectric material 126 may be a similar material as the dielectric material 126 described previously for FIG. 9, and may be formed in a similar manner. A planarization process may be performed after forming the dielectric material 126, which may leave top surfaces of the electronic die 122 and the dielectric material 126 substantially planar.

Figure 33:
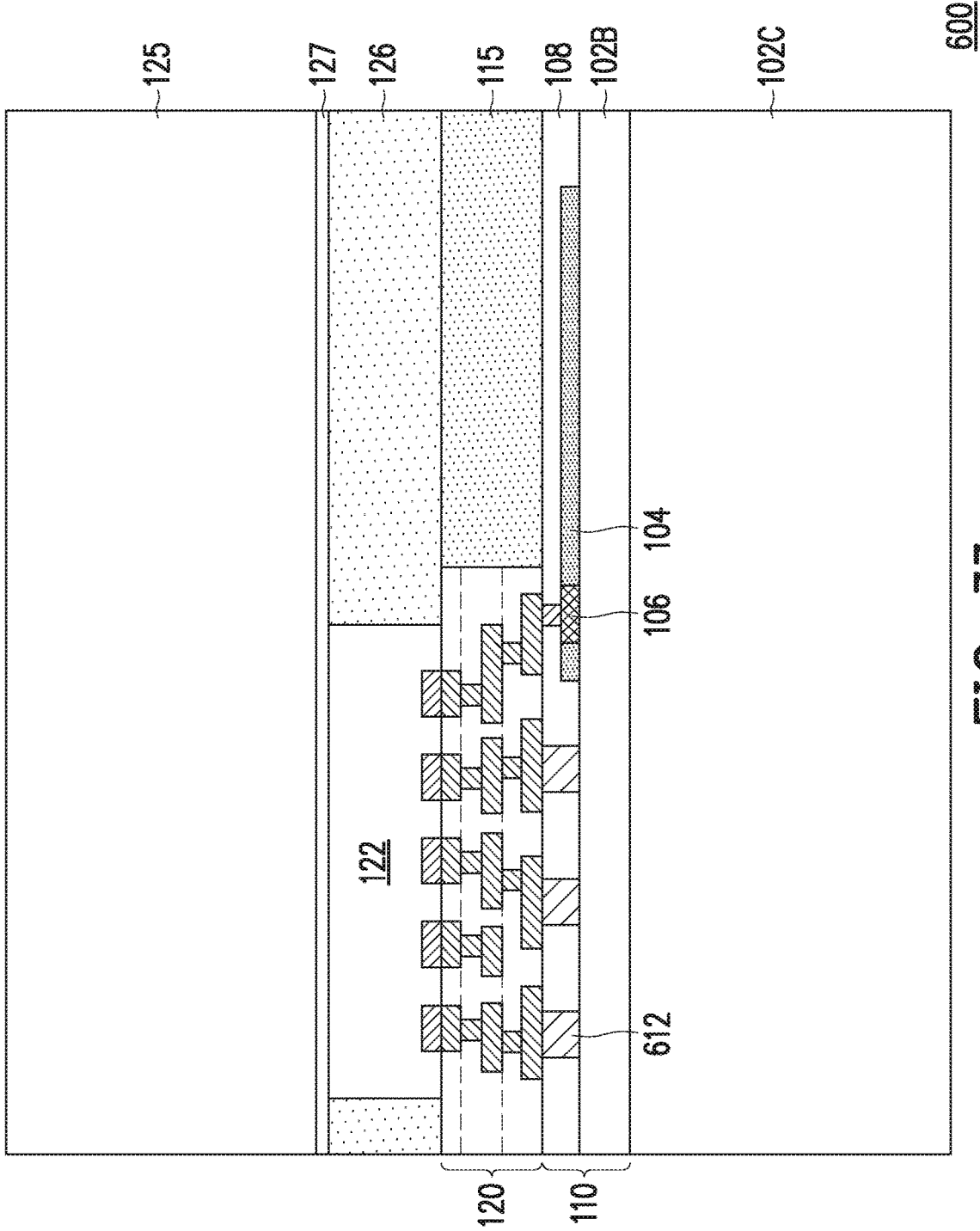

In FIG. 33, a support 125 is attached to the structure, in accordance with some embodiments. The support 125 may be similar to the support 125 described previously for FIG. 10, and may be attached in a similar manner. For example, the support 125 may be attached using an adhesive layer 127 or the like.

Figure 34:
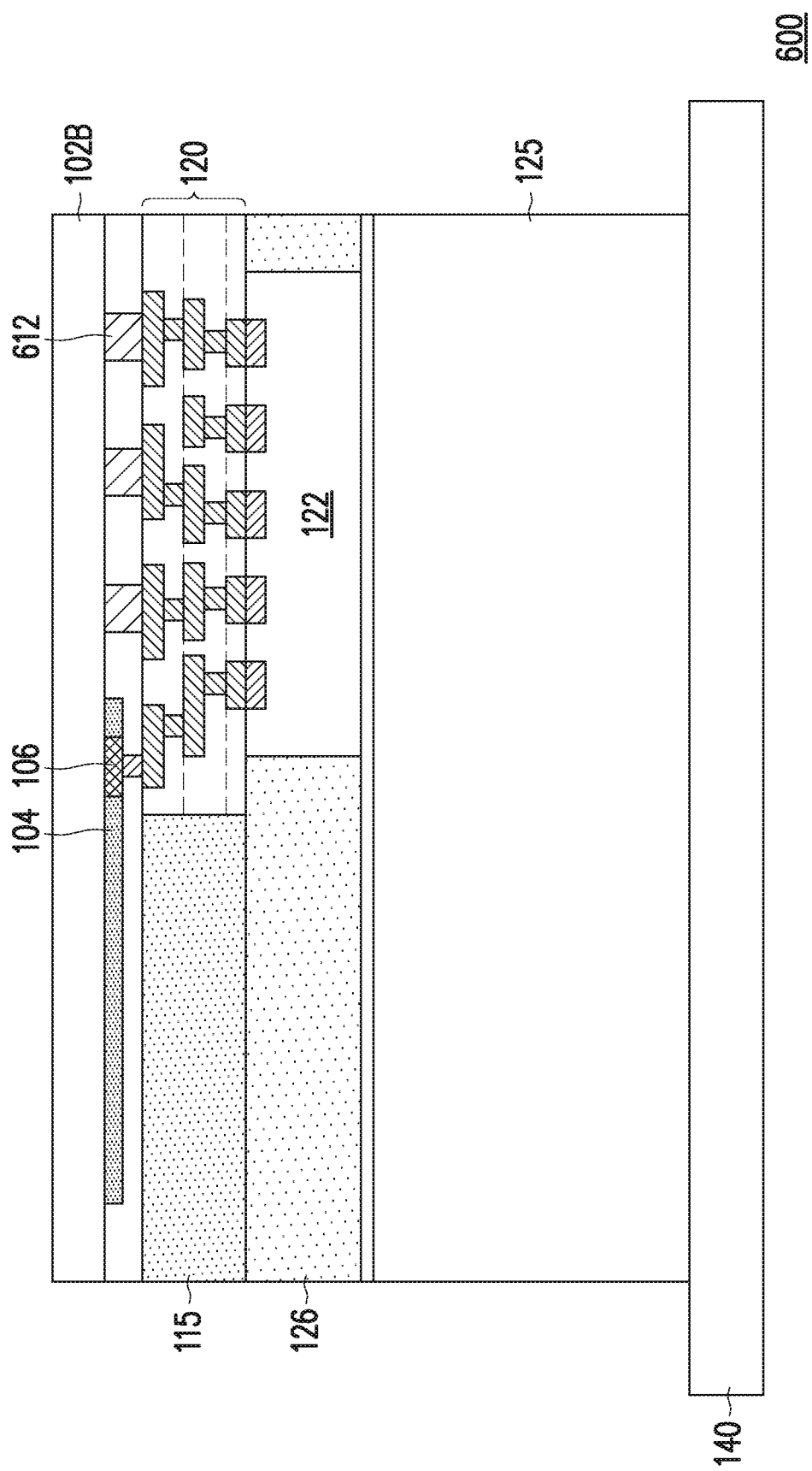

In FIG. 34, the structure is flipped over and attached to a carrier 140, in accordance with some embodiments. The carrier 140 may be, similar to the carrier 140 described previously for FIG. 11. The structure may be attached to the carrier 140 using, for example, an adhesive or a release layer (not shown). The back side of the substrate 102C is then removed to expose the oxide layer 102B, in accordance with some embodiments. The substrate 102C may be removed using a CMP process, a mechanical grinding, an etching process (e.g., a wet etch, a dry etch, or a combination), the like, or a combination thereof.

Figure 35:
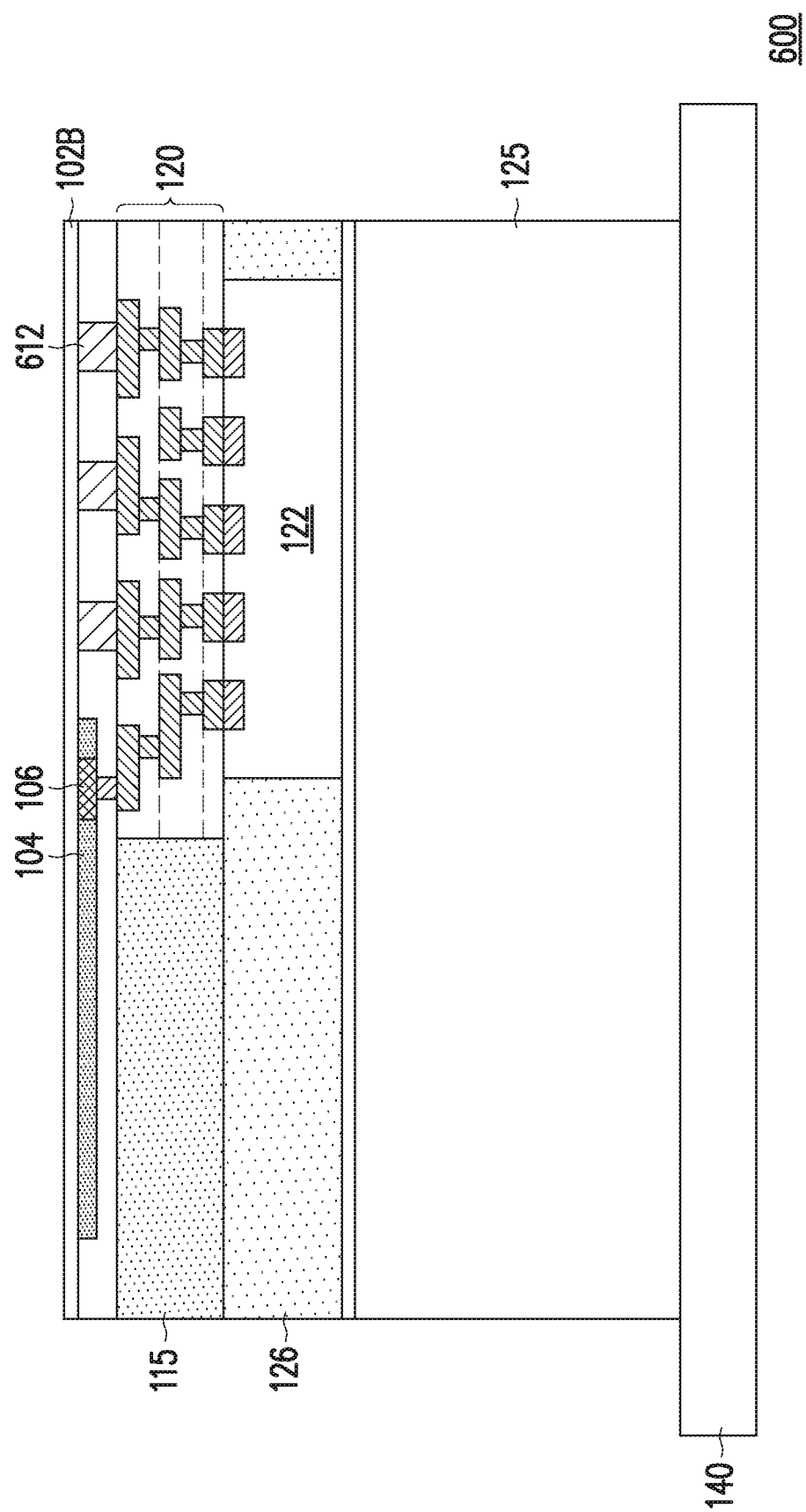

In FIG. 35, the oxide layer 102B is thinned, in accordance with some embodiments. The oxide layer 102B may be thinned using a CMP process, a mechanical grinding, an etching process (e.g., a wet etch, a dry etch, or a combination), the like, or a combination thereof. In some embodiments, after thinning, the oxide layer 102B may have a thickness that is in the range of about 100 nm to about 400 nm. Other thicknesses are possible. In some cases, thinning the oxide layer 102B may allow for more efficient optical coupling between the waveguides 104 and the subsequently formed waveguides 604A (see FIG. 37).

Figure 36:
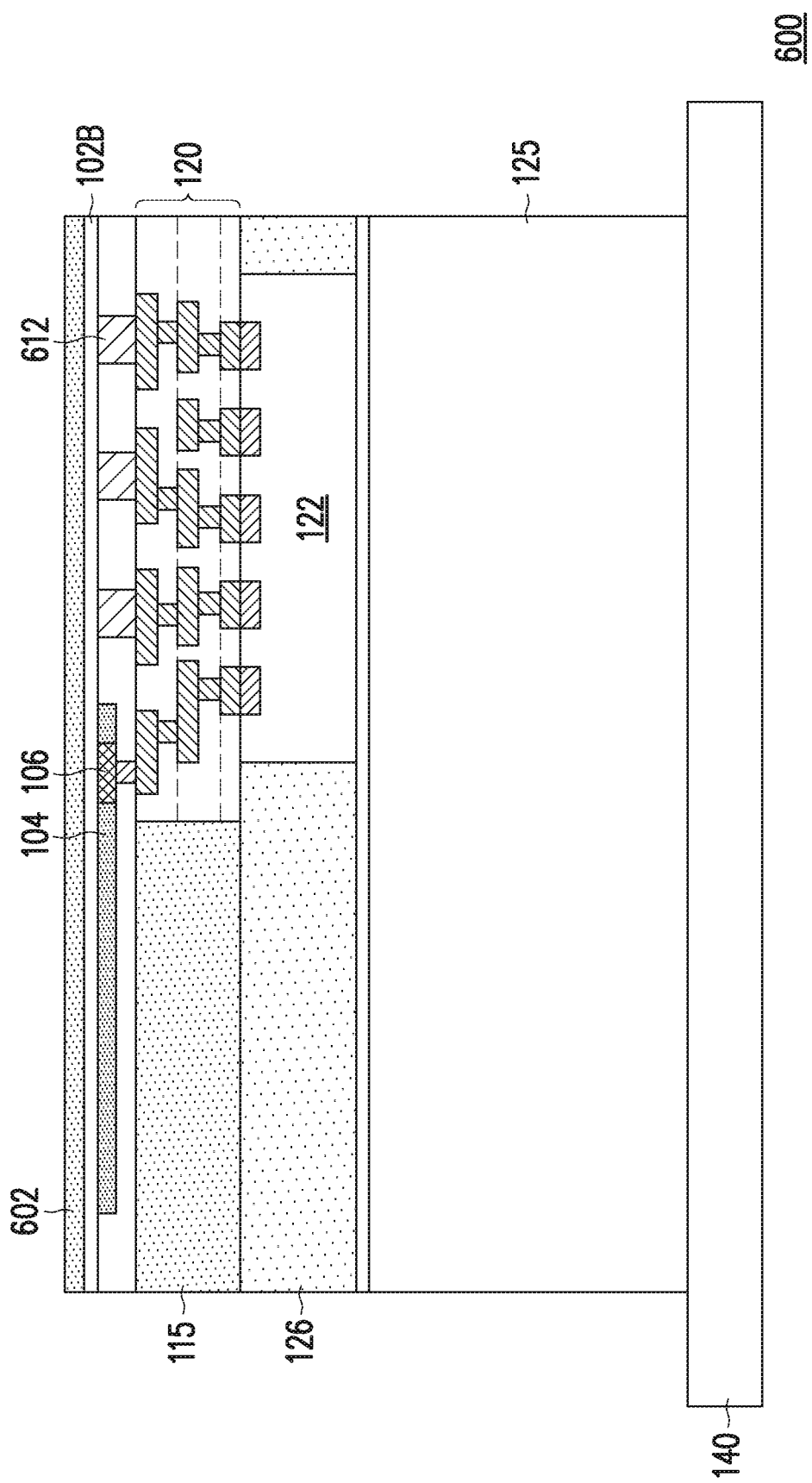
Figure 37:
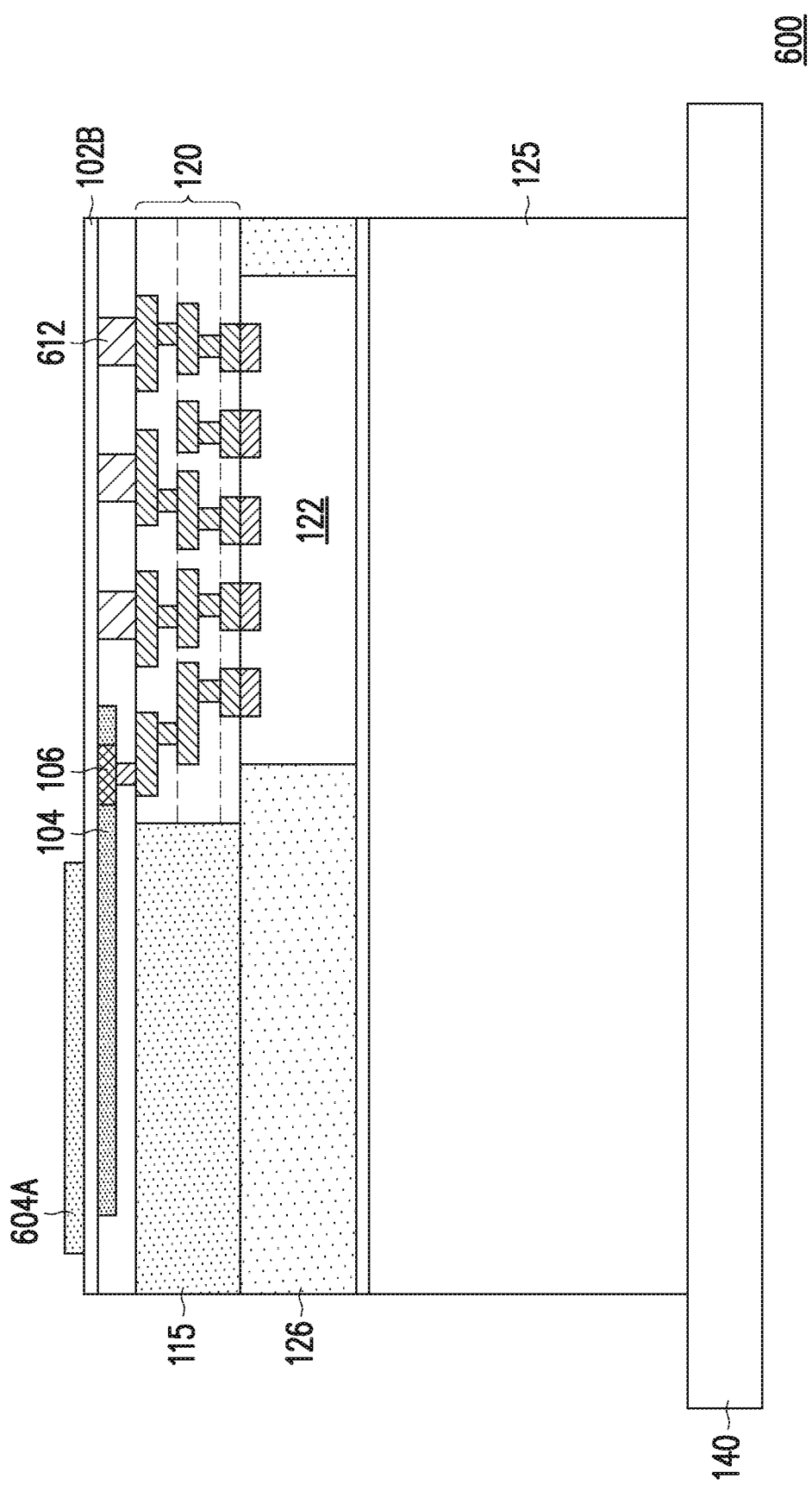
Figure 38:
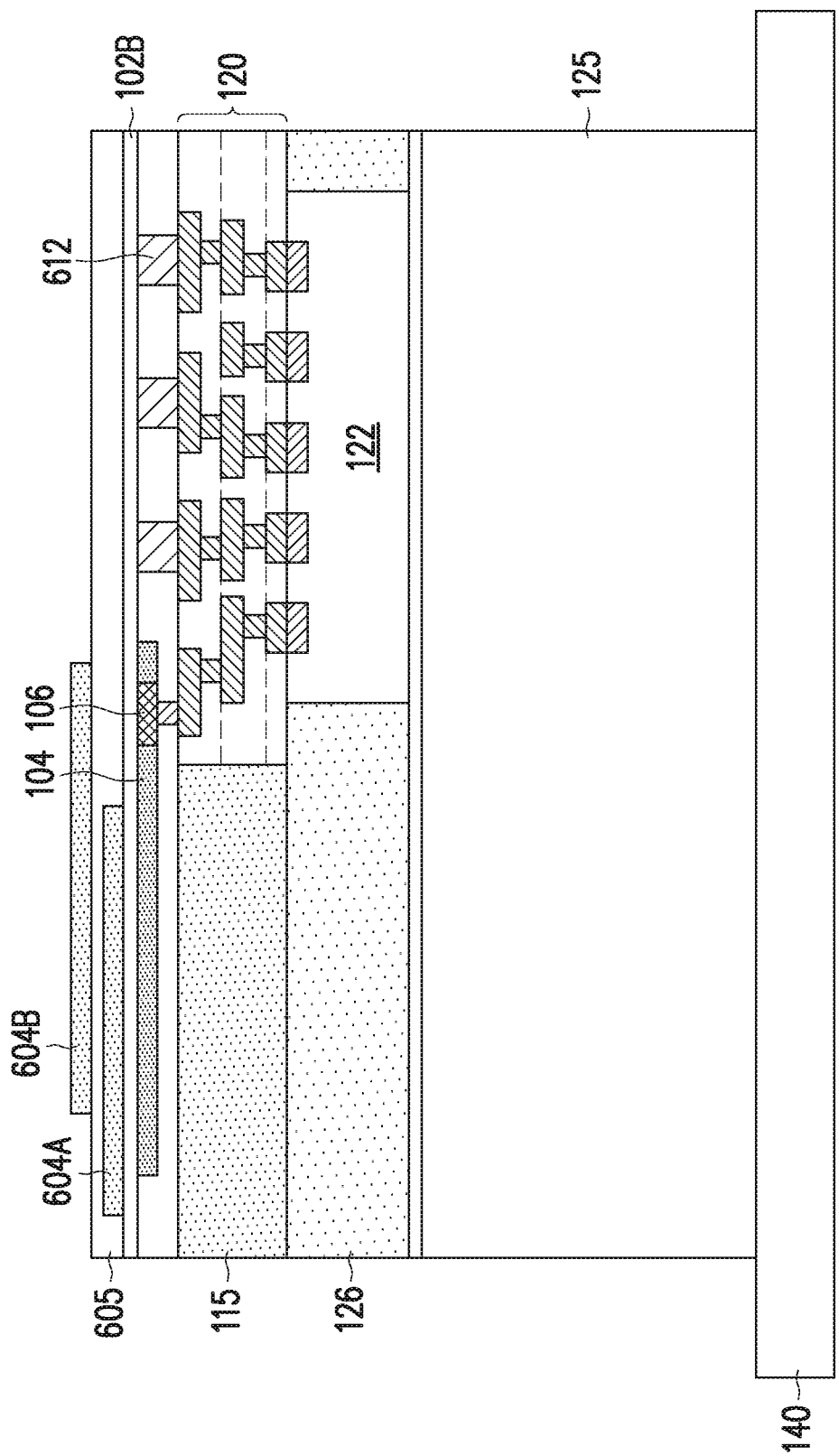

FIGS. 36, 37, and 38 illustrate intermediate steps in the formation of waveguides 604 over the oxide layer 102B, in accordance with some embodiments. The waveguides 604 may comprise a material such as silicon nitride, polymer, or the like, in some embodiments. The description of FIGS. 36, 37, and 38 below are for an embodiment in which the waveguides 604 comprise silicon nitride, but other materials may be used in other embodiments. The photonic package 600 includes two layers of waveguides 604, comprising a layer of waveguides 604A and a layer of waveguides 604B, but the photonic package 600 may comprise more or fewer layers of waveguides 604 in other embodiments. In some embodiments, a single layer of waveguides 604 are formed for the photonic package 600, and in other embodiments, three or more layers of waveguides 604 are formed for the photonic package 600. More layers of waveguides 604 may be formed, for example, by repeating some or all of the steps described for forming the waveguides 604A or the waveguides 604B.

In FIG. 36, a silicon nitride layer 602 is deposited over the oxide layer 102B, in accordance with some embodiments. The silicon nitride layer 602 may be formed using a suitable deposition technique, such as CVD, PECVD, LPCVD, PVD, or the like. In some embodiments, the silicon nitride layer 602 is formed having a thickness in the range of about 0.3 μm to about 1.0 μm, though other thicknesses are possible.

In FIG. 37, the silicon nitride layer 602 is patterned to form the waveguides 604A, in accordance with some embodiments. waveguides 604A may be patterned using acceptable photolithography and etching techniques. For example, a hardmask layer may be formed over the silicon nitride layer 602 and patterned, in some embodiments. The pattern of the hardmask layer may then be transferred to the silicon nitride layer 602 using an etching process. The etching process may include, for example, a dry etching process and/or a wet etching process. The etching process may be selective to silicon nitride over silicon oxide or other materials. The silicon nitride layer 602 may be etched to form recesses defining the waveguides 604A, with sidewalls of the remaining unrecessed portions defining sidewalls of the waveguides 604A. In some embodiments, more than one photolithography and etching sequence may be used in order to pattern the silicon nitride layer 602. One waveguide 604A or multiple waveguides 604A may be patterned from the silicon nitride layer 602. If multiple waveguides 604A are formed, the multiple waveguides 604A may be individual separate waveguides 604A or connected as a single continuous structure. In some embodiments, one or more of the waveguides 604A form a continuous loop. In some embodiments, waveguides 604A may include photonic structures such as grating couplers, edge couplers, or couplers (e.g., mode converters) that allow optical signals to be transmitted between two waveguides 604A and/or between a waveguide 604A and a waveguide 104. For example, a waveguides 604A may include an edge coupler that allows optical signals and/or optical power to be transferred between the waveguides 604A and, for example, an edge-mounted optical fiber 150.

In some cases, a waveguide formed from silicon nitride (e.g., waveguides 604A) may have advantages over a waveguide formed from silicon (e.g., waveguides 104). For example, silicon nitride has a higher dielectric constant than silicon, and thus a nitride waveguide may have a greater internal confinement of light than a silicon waveguide. This may also allow the performance or leakage of nitride waveguides to be less sensitive to process variations, less sensitive to dimensional uniformity, and less sensitive to surface roughness (e.g., edge roughness or linewidth roughness). In some cases, the reduced process sensitivity may allow nitride waveguides to be easier or less costly to process than silicon waveguides. These characteristics may allow a nitride waveguide to have a lower propagation loss than a silicon waveguide. In some cases, the propagation loss (dB/cm) of a nitride waveguide may be between about 0.1% and about 50% of a silicon waveguide. In some cases, a nitride waveguide may also be less sensitive to the temperature of the environment than a silicon waveguide. For example, a nitride waveguide may have a sensitivity to temperature that is as small as about 1% of that of a silicon waveguide. In this manner, the embodiments described herein can allow for the formation of a photonic package 600 that has both nitride waveguides (e.g., waveguides 604A) and silicon waveguides (e.g., waveguides 104). The multiple sets of waveguides (e.g., 104, 604) in the photonic package 600 can allow for a larger and more efficient optical network within the photonic package 600, which can result in faster and more efficient device performance.

Turning to FIG. 38, a dielectric layer 605 is formed over the waveguides 604A, and waveguides 604B may be formed over the dielectric layer 605, in accordance with some embodiments. The dielectric layer 605 may comprise one or more materials similar to those described above for the dielectric layer 108 or the dielectric layer 115. For example, the dielectric layer 605 may comprise a silicon oxide or the like. The dielectric layer 605 may be formed using a technique similar to those described above for the dielectric layer 108 or the dielectric layer 115, or may be formed using a different technique. For example, the dielectric layer 605 may be formed by CVD, PVD, HDP-CVD, FCVD, the like, or using a different technique. In some embodiments, a planarization process (e.g., a CMP, grinding process, and or etching process) is used to remove excess material of the dielectric layer 605. After planarization, the dielectric layer 605 may have a thickness between about 0.6 µm and about 1.6 µm, in some embodiments. Other thicknesses are possible. In some cases, a thinner dielectric layer 605 may allow for more efficient optical coupling between the waveguides 604A and overlying waveguides 604B (if present).

The waveguides 604B may then be formed on the dielectric layer 605. The waveguides 604B may be formed using techniques similar to those used to form the waveguides 604A. For example, a layer of silicon nitride may be deposited on the dielectric layer 605 and patterned to form the waveguides 604B. The waveguides 604B may comprise couplers that allow optical signals to be transmitted between two waveguides 604B and/or between a waveguide 604B and a waveguide 604A, or may comprise one or more edge couplers. In some embodiments, an additional layer of waveguides 604 may be formed over the waveguides 604B by, for example, depositing a dielectric layer, thinning the dielectric layer, and then forming the additional waveguides in a manner similar to that of waveguides 604A-B.

Figure 39:
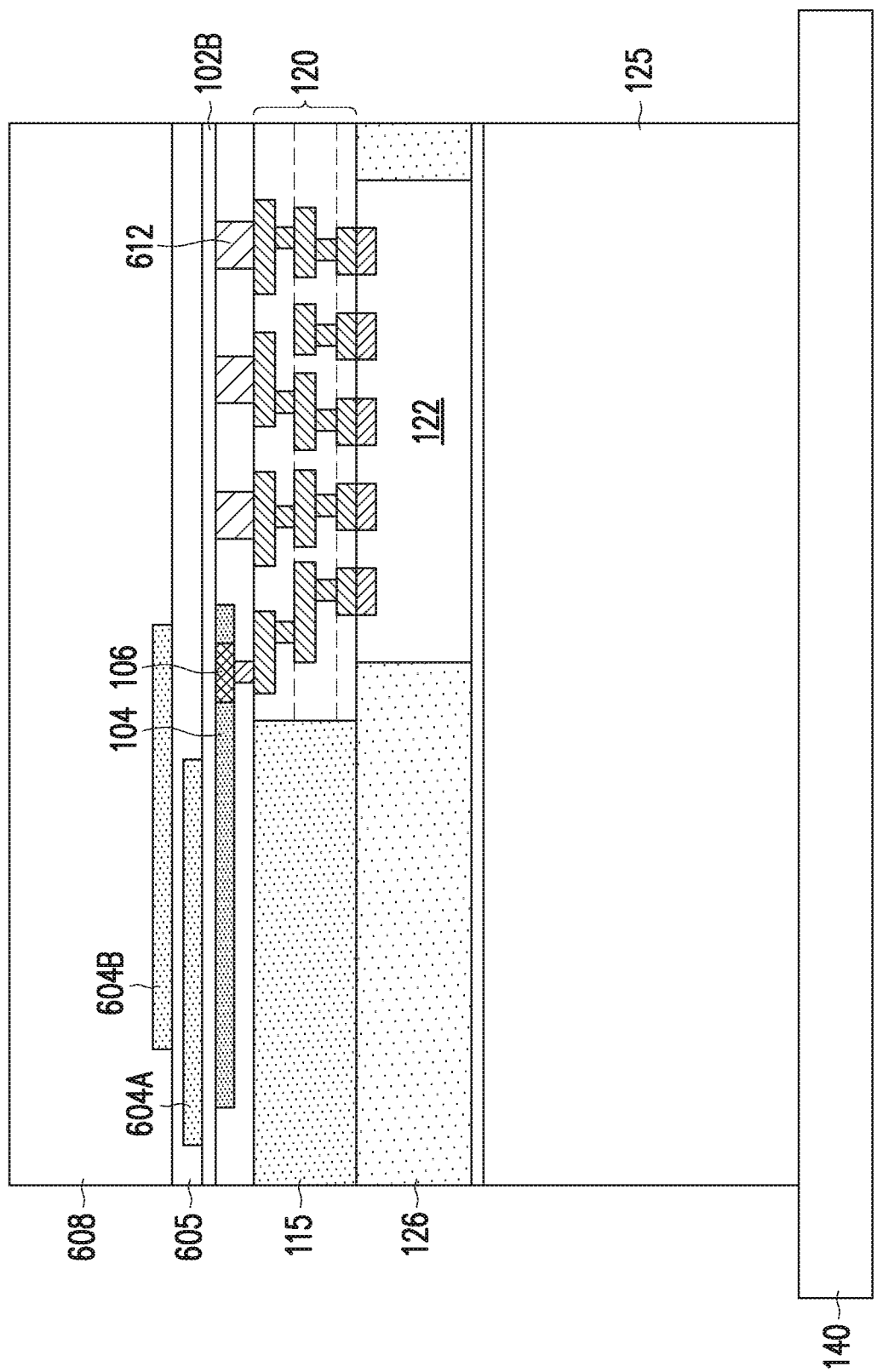

Turning to FIG. 39, a dielectric layer 608 is formed over the waveguides 604B and over the dielectric layer 605, in accordance with some embodiments. The dielectric layer 608 may comprise one or more materials similar to those described above for the dielectric layer 108, the dielectric layer 115, or the dielectric layer 605, and may be formed using similar techniques. For example, the dielectric layer 608 may comprise a silicon oxide or the like. In some embodiments, a planarization process (e.g., a CMP, grinding process, and or etching process) is used to remove excess material of the dielectric layer 605. In some embodiments, a planarization process (e.g., a CMP or grinding process) is used to remove excess material of the dielectric layer 608. After planarization, the dielectric layer 608 may have a thickness between about 6 µm and about 25 µm, in some embodiments. Other thicknesses are possible.

Figure 40:
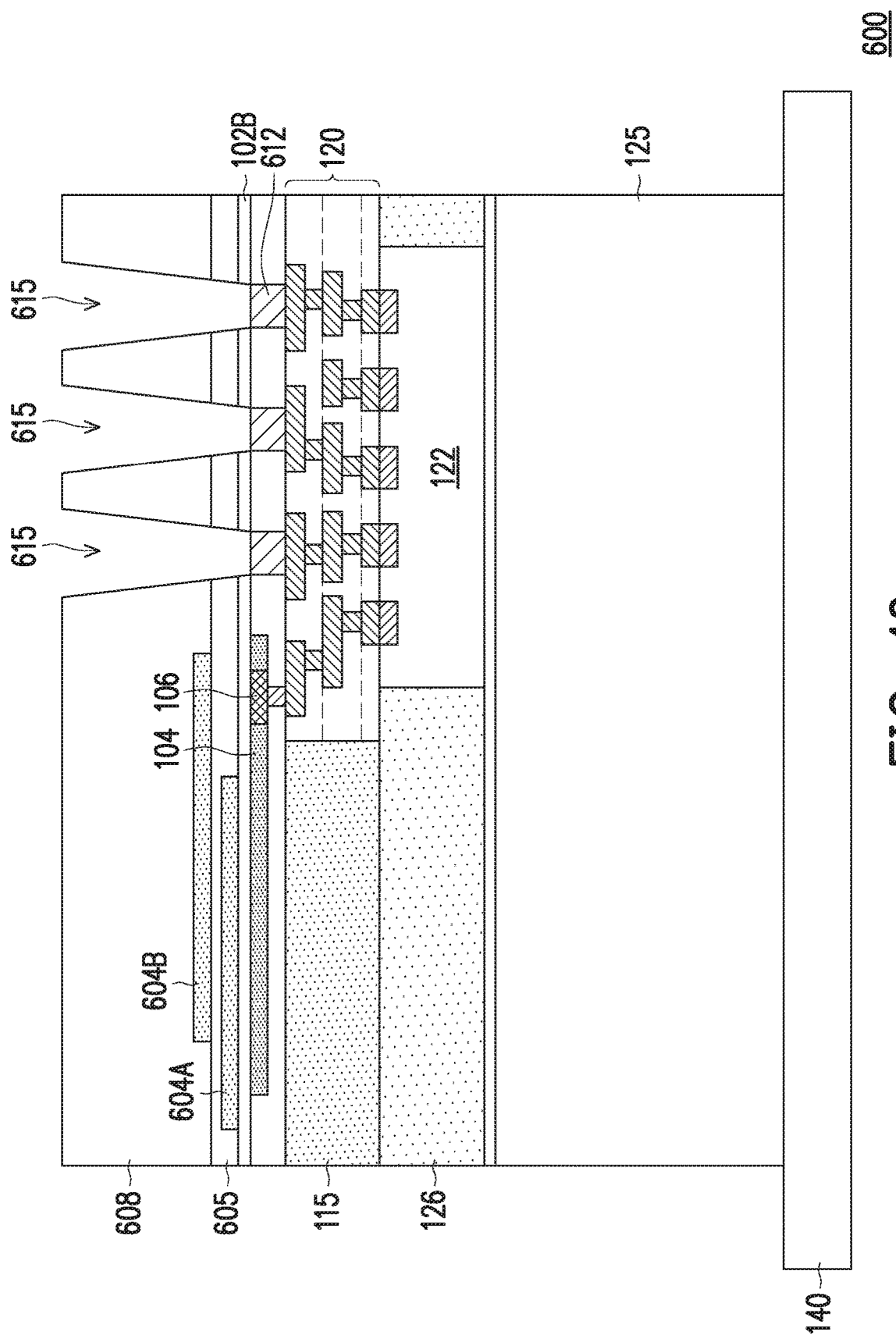
Figure 41:
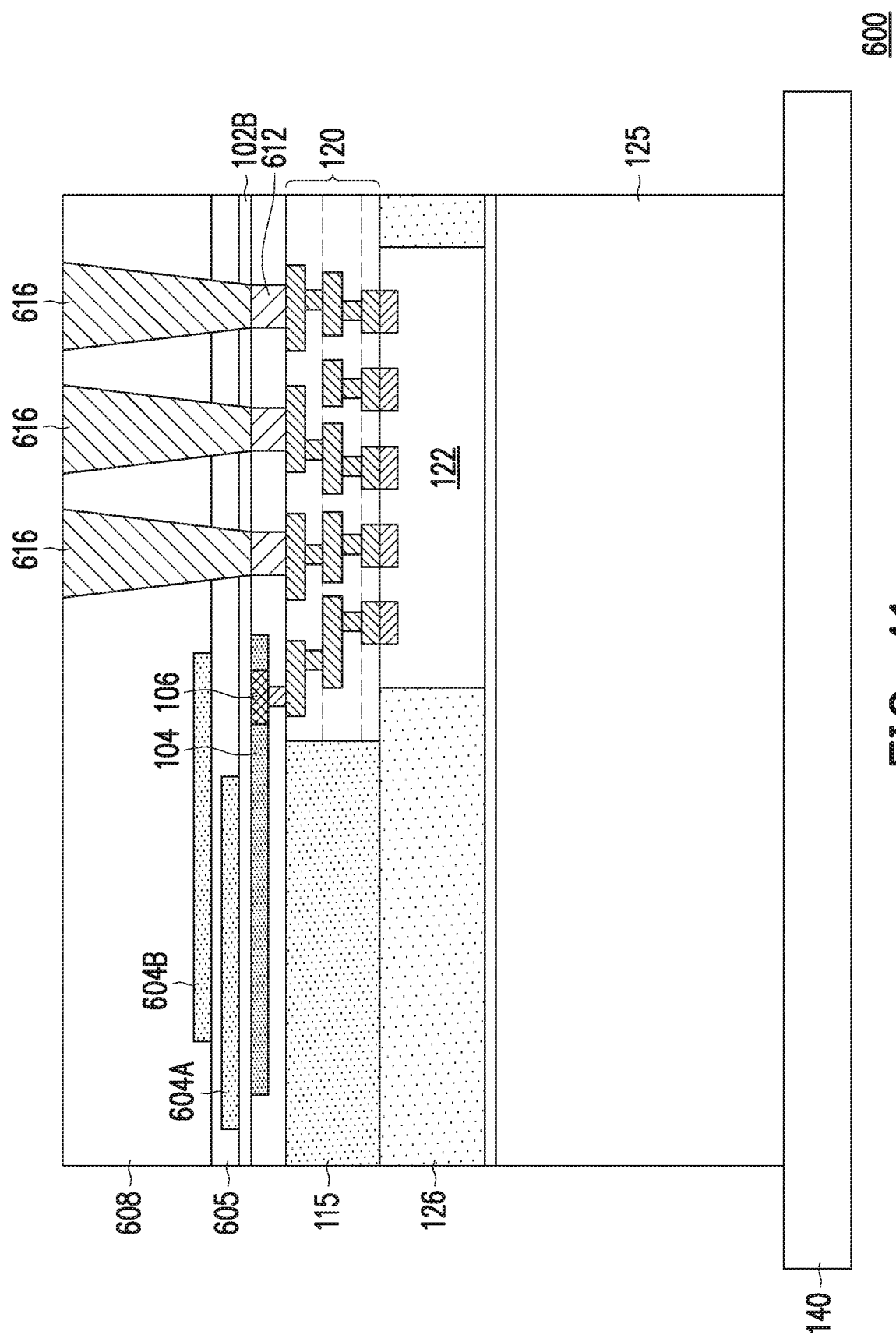

FIGS. 40 and 41 describe the formation of through vias 616, in accordance with some embodiments. The through vias 616 extend through the dielectric layer 608, the dielectric layer 605, and the oxide layer 102B to electrically contact the vias 612. In FIG. 40, openings 615 are formed extending through the dielectric layer 608, the dielectric layer 605, and the oxide layer 102B to expose the vias 612, in accordance with some embodiments. The openings 615 may be formed by acceptable photolithography and etching techniques, such as by forming and patterning a photoresist and then performing an etching process using the patterned photoresist as an etching mask. The etching process may include, for example, a dry etching process and/or a wet etching process.

In FIG. 41, a conductive material is formed in the openings 615, thereby forming the through vias 616, in accordance with some embodiments. In some embodiments, a liner (not shown), such as a diffusion barrier layer, an adhesion layer, or the like, may be formed in the openings 615 from TaN, Ta, TiN, Ti, CoW, or the like, and may be formed using suitable a deposition process such as ALD or the like. In some embodiments, a seed layer (not shown), which may include copper or a copper alloy may then be deposited in the openings 615. The conductive material of the through vias 616 is formed in the openings 615 using, for example, ECP or electro-less plating. The conductive material may include, for example, a metal or a metal alloy such as copper, silver, gold, tungsten, cobalt, aluminum, or alloys thereof. A planarization process (e.g., a CMP process or a grinding process) may be performed to remove excess conductive material along the top surface of the dielectric layer 608, such that top surfaces of the through vias 616 and the dielectric layer 608 are level. The through vias 616 allow electrical power or electrical signals to be transmitted to or from the redistribution structure 120.

Figure 42:
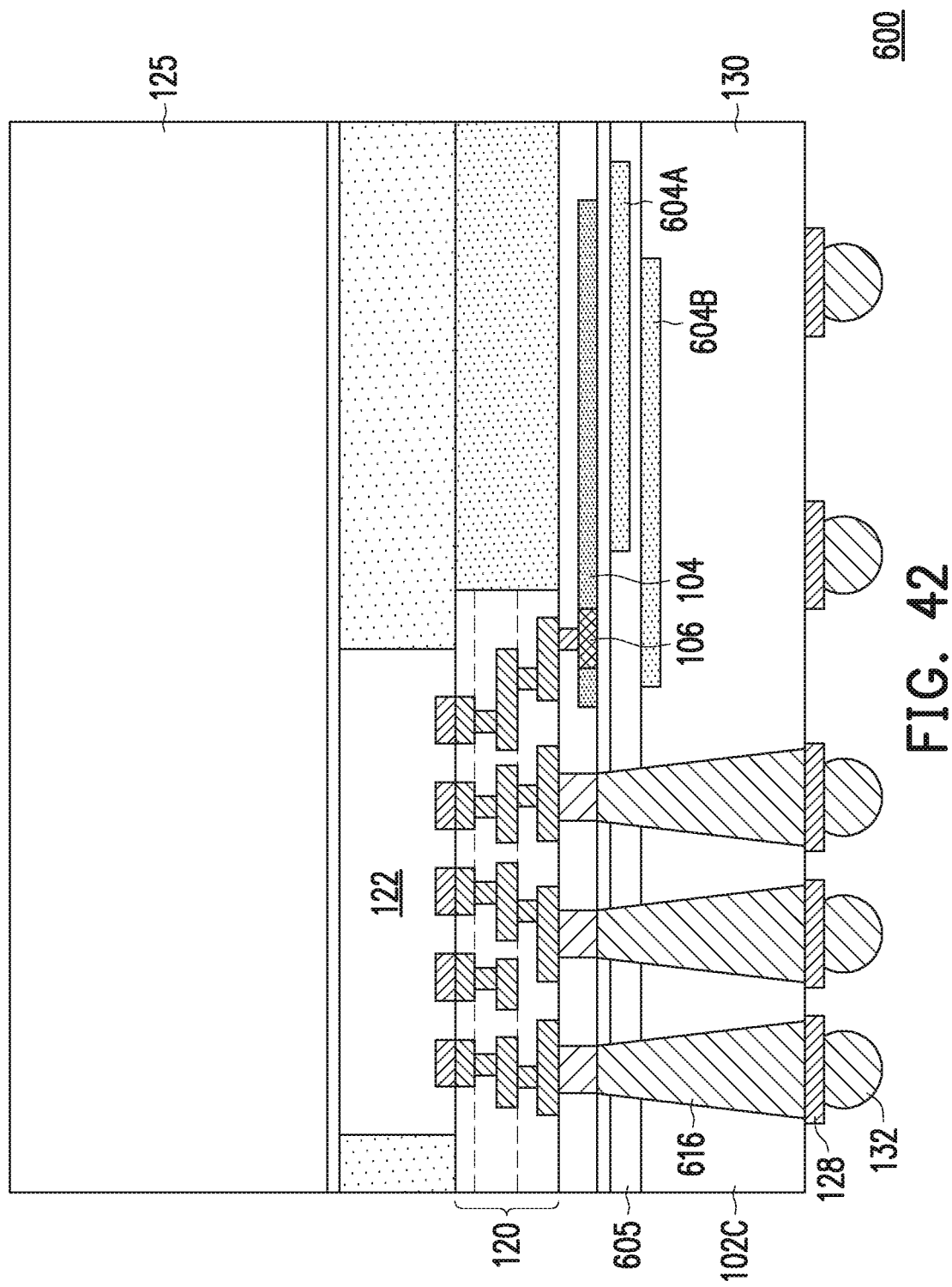

In FIG. 42, conductive pads 128 and conductive connectors 132 are formed on the through vias 616, forming the photonic package 600, in accordance with some embodiments. The carrier 140 may be removed from the structure, and then conductive pads 128 may be formed on the through vias 616. The conductive pads 128 may be similar to those described for FIG. 14, and may be formed in a similar manner. Conductive connectors 132 may then be formed on the conductive pads 128, which may be similar to those described for FIG. 14 and formed in a similar manner.

Figure 43:
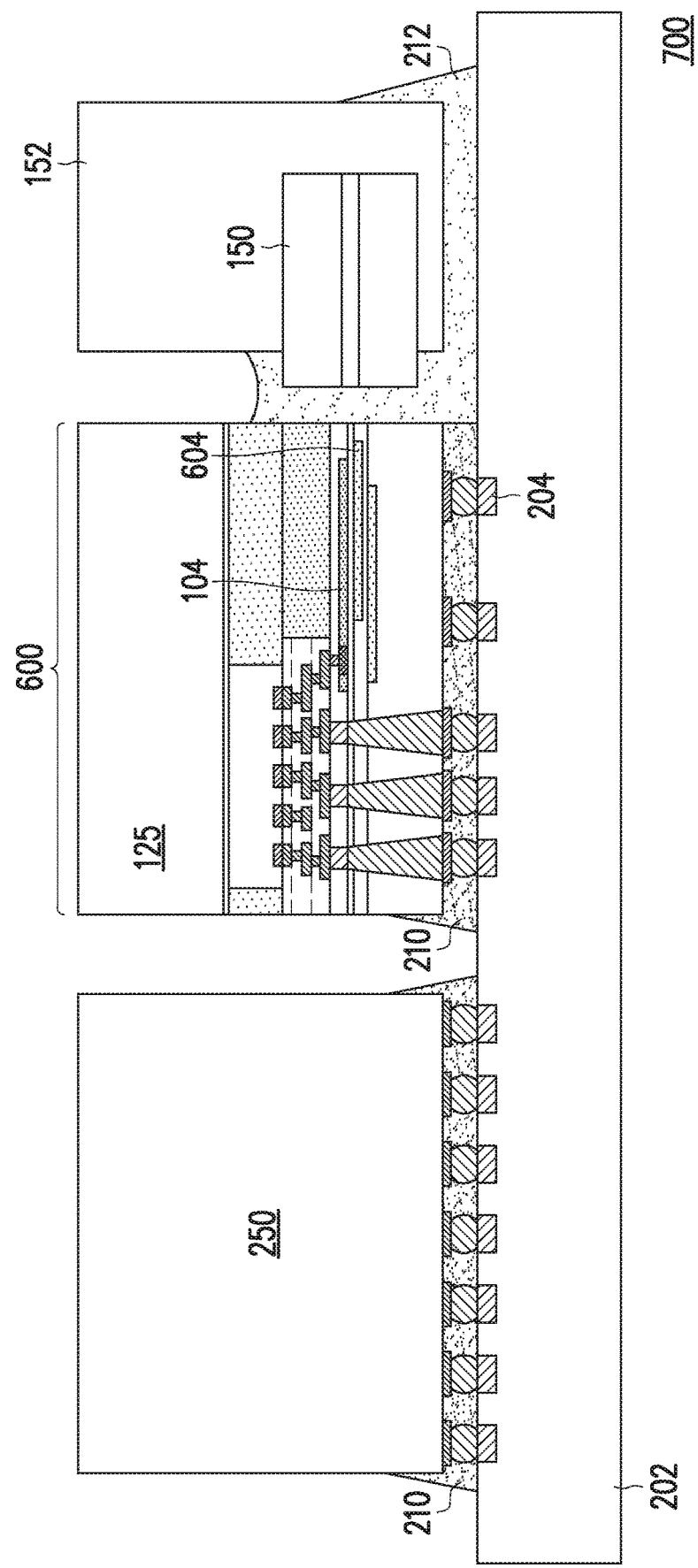
FIG. 43 illustrates a cross-sectional view of a photonic system, in accordance with some embodiments.

FIG. 43 illustrates a photonic system 700, in accordance with some embodiments. The photonic system 700 may be similar to the photonic system 200 described for FIG. 15, except a photonic package 600 similar to that described for FIG. 42 is used. The photonic system 700 includes one or more photonic packages 600 and one or more semiconductor devices 250 that are attached to an interconnect substrate 202. The interconnect substrate 202 and the semiconductor devices 250 may be similar to those described previously for the photonic system 200. An optical fiber 150 may be attached to the interconnect substrate 202 and coupled into the photonic package 600. For example, the optical fiber 150 may be optically coupled to an edge coupler formed in one or more of the waveguides 604, or may be optically coupled to an edge coupler formed in one or more of the waveguides 104. The use of a photonic package 600 comprising multiple sets of waveguides (e.g., 104, 604) can allow for faster and more efficient operation of the photonic system 700.

FIGS. 44 through 50 illustrate intermediate steps in the formation of a photonic package 900, in accordance with some embodiments. The photonic package 900 (see FIG. 50) includes a photonic structure 800 incorporated within the photonic package. The photonic structure 800 includes one or more electronic dies 122 and waveguides 104, and the photonic package 900 includes one or more waveguides 920 that are made of a different material than the waveguides 104. For example, the waveguides 920 may be made of silicon nitride, a polymer, or another material. In some cases, the waveguides 920 may be formed of a material that has less optical loss or less process cost than the waveguides 920. In this manner, an optical network formed of the waveguides 104 and the waveguides 920 may be formed in a photonic package 900, which may improve the efficiency or performance of the photonic package 900.

Figure 44:
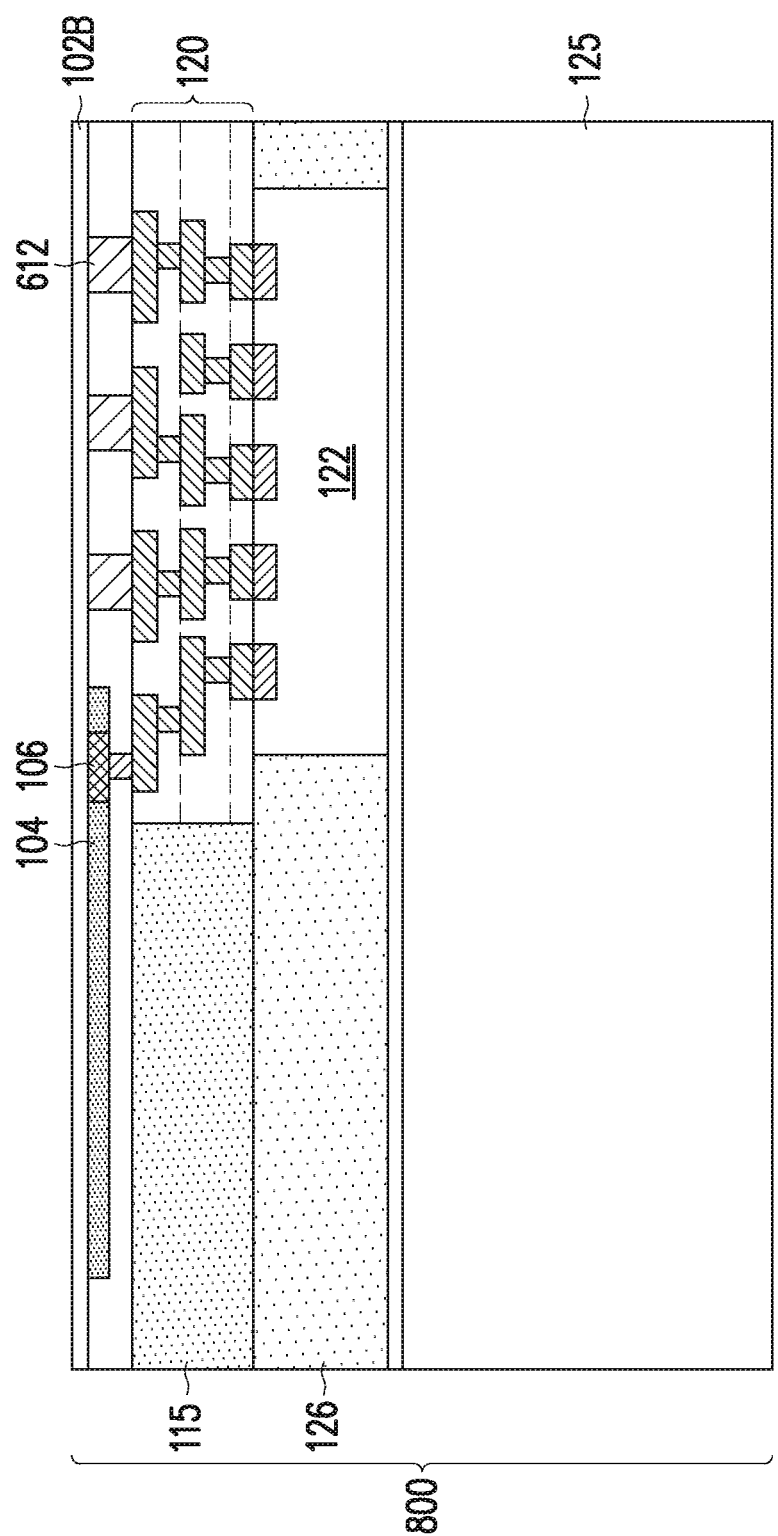
FIG. 44 illustrates a cross-sectional view of a photonic structure, in accordance with some embodiments.

FIG. 44 illustrates a photonic structure 800, in accordance with some embodiments. The photonic structure 800 may be similar to the structure shown previously in FIG. 35. The photonic structure 800 may be formed from similar materials and using similar techniques as the structure shown in FIG. 35. For example, the photonic structure 800 may include waveguides 104 and photonic components 106 formed over a redistribution structure 120, and one or more electronic dies 122 attached to the redistribution structure 120. The photonic structure 800 may also include vias 612, and an oxide layer 102B that has been thinned, in some embodiments. The photonic structure 800 may also include a support 125, in some embodiments.

Figure 45:
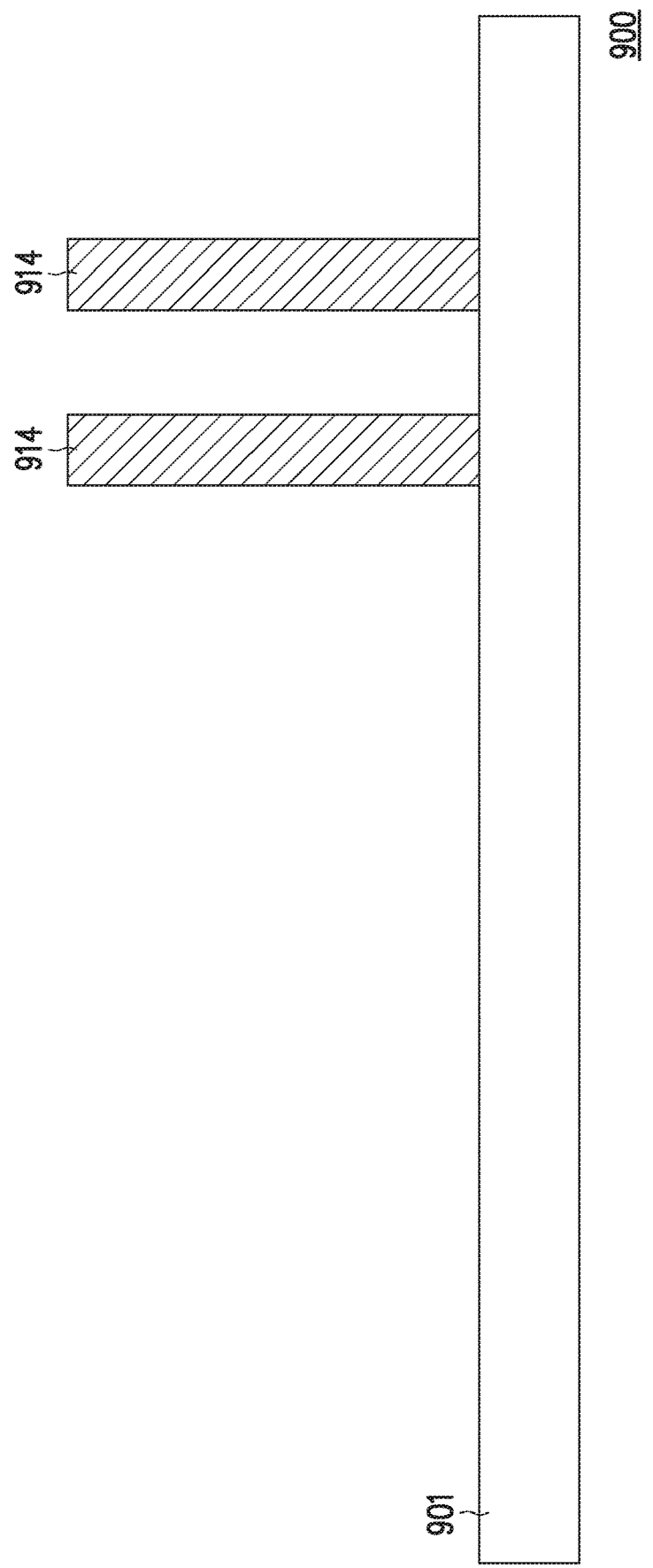
FIGS. 45 through 50 illustrate cross-sectional views of intermediate steps of forming a photonic system, in accordance with some embodiments.

In FIG. 45, through vias 914 are formed over a carrier substrate 901, in accordance with some embodiments. The carrier substrate 901 may be, for example, wafer, a glass carrier substrate, a ceramic carrier substrate, or the like. A release layer (not shown) may be formed on the carrier substrate 901, in some embodiments. As an example to form the through vias 914, a seed layer (not shown) may be formed over the carrier substrate 901. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 914. The through vias 914 may have a different number or arrangement than shown.

Figure 46:
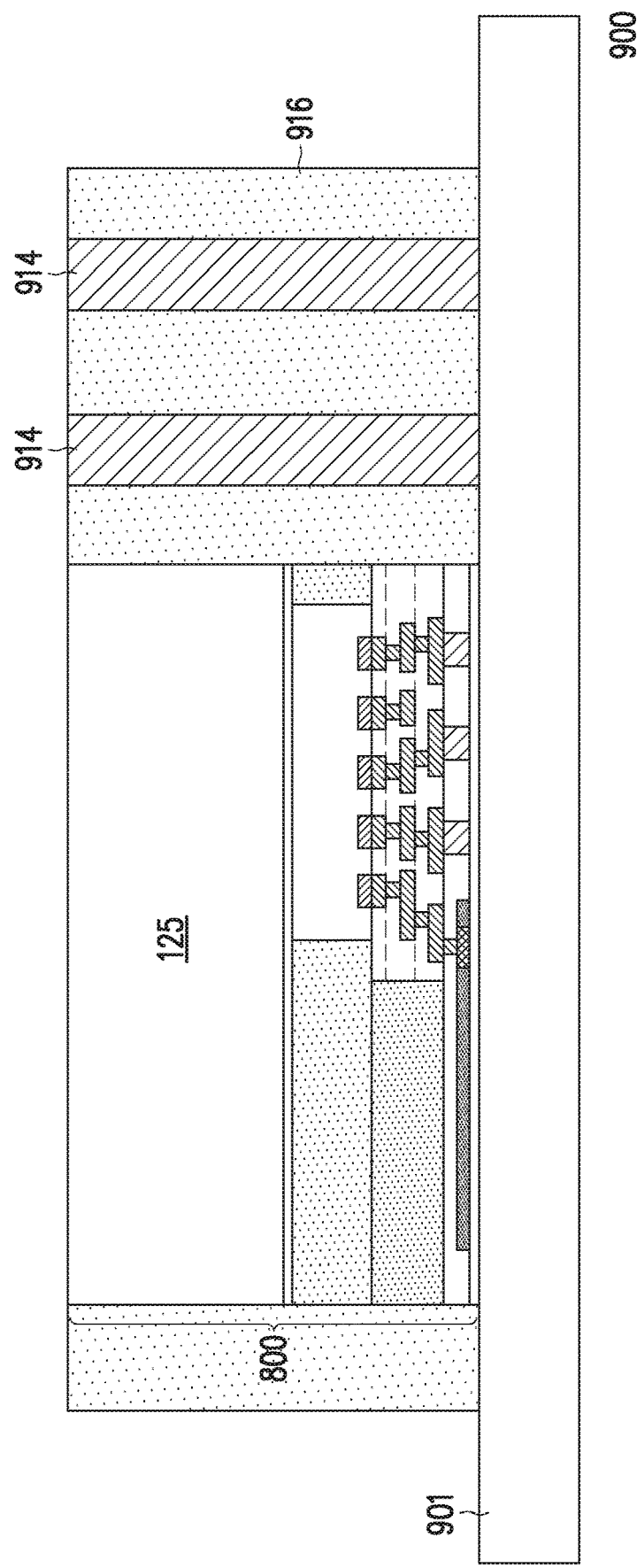

In FIG. 46, a photonic structure 800 is attached to the carrier substrate 901 and encapsulated, in accordance with some embodiments. The photonic structure 800 may be similar to that shown in FIG. 44. The arrangement of through vias 914 and the photonic structure 800 may be different than shown. The photonic structure 800 may be attached to the carrier substrate 901 by, for example, an adhesive layer or the like.

After attaching the photonic structure 800, an encapsulant 916 is formed on and around the through vias 914 and the photonic structure 800. The encapsulant 916 may be a molding compound, epoxy, or the like. The encapsulant 916 may be applied by compression molding, transfer molding, or the like, and may be formed over the carrier substrate 901 such that the through vias 914 and/or photonic structure 800 are buried or covered. The encapsulant 916 may be applied in liquid or semi-liquid form and then subsequently cured. A planarization process may then be performed on the encapsulant 916 to expose the through vias 914. The planarization process may also expose a surface of the photonic structure 800, such as the support 125 of the photonic structure. Top surfaces of the through vias 914. The encapsulant 916, and/or the photonic structure 800 may be substantially coplanar after the planarization process within process variations. The planarization process may be, for example, a chemical-mechanical polish (CMP), a grinding process, or the like. In some embodiments, the planarization may be omitted, for example, if the through vias 914 are already exposed.

Figure 47:
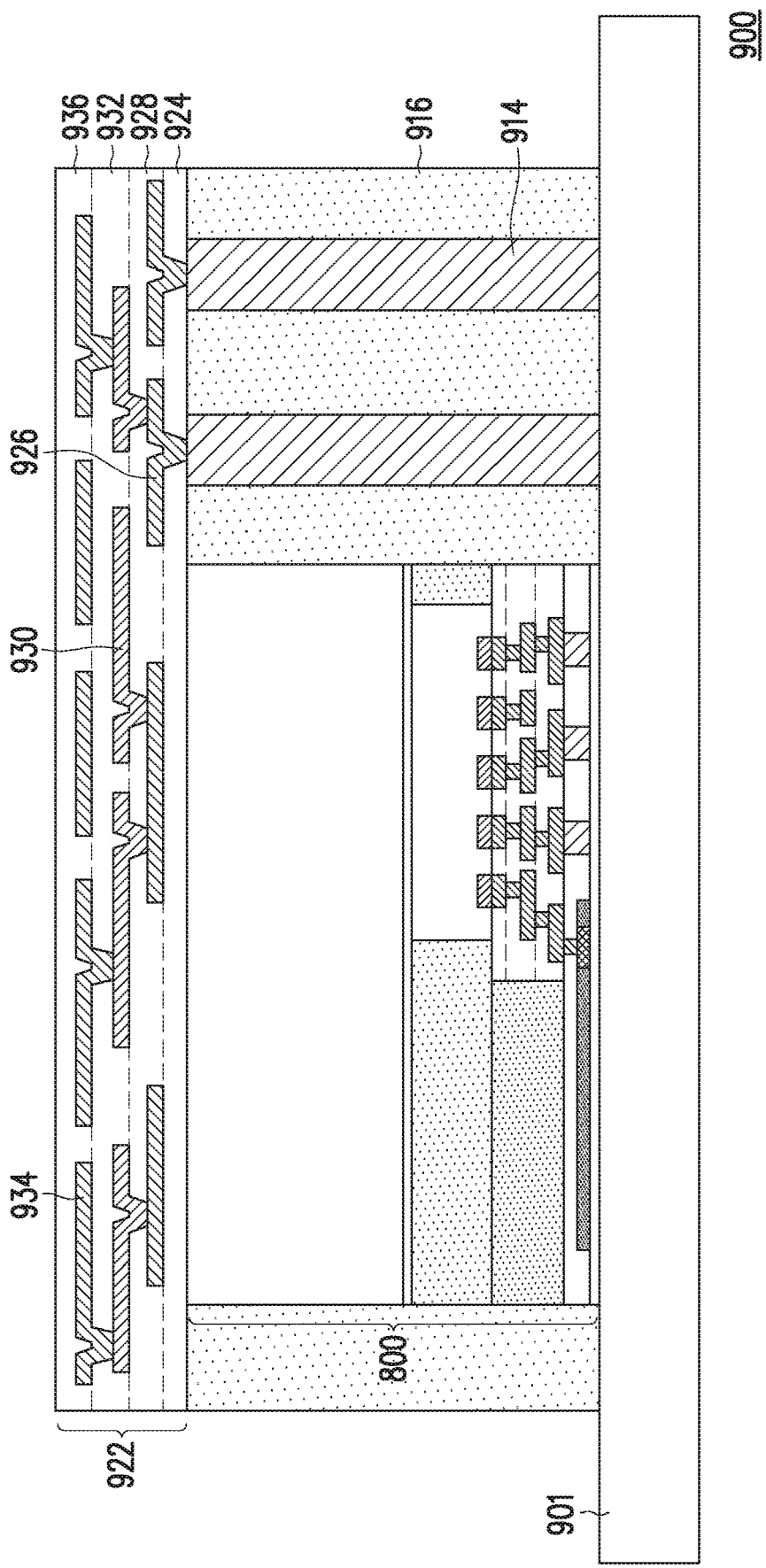

In FIG. 47, a redistribution structure 922 is formed over the encapsulant 916, through vias 914, and the photonic structure 800. The redistribution structure 922 includes dielectric layers 924, 928, 932, and 936; and metallization patterns 926, 930, and 934. The metallization patterns may also be referred to as redistribution layers or redistribution lines. The redistribution structure 922 is shown as an example having three layers of metallization patterns, but more or fewer dielectric layers and metallization patterns may be formed in the redistribution structure 922. If fewer dielectric layers and metallization patterns are to be formed, steps and process discussed below may be omitted. If more dielectric layers and metallization patterns are to be formed, steps and processes discussed below may be repeated.

As an example of forming the redistribution structure 922, the dielectric layer 924 is deposited on the encapsulant 916, through vias 914, and the photonic structure 800. In some embodiments, the dielectric layer 924 is formed of a photo-sensitive material such as PBO, polyimide, BCB, or the like, which may be patterned using a lithography mask. The dielectric layer 924 may be formed by spin coating, lamination, CVD, the like, or a combination thereof. The dielectric layer 924 is then patterned. The patterning forms openings exposing portions of the through vias 914. The patterning may be by an acceptable process, such as by exposing and developing the dielectric layer 924 to light when the dielectric layer 924 is a photo-sensitive material or by etching using, for example, an anisotropic etch.

The metallization pattern 926 is then formed. The metallization pattern 926 includes conductive elements extending along the major surface of the dielectric layer 924 and extending through the dielectric layer 924 to physically and electrically couple to the through vias 914. As an example to form the metallization pattern 926, a seed layer is formed over the dielectric layer 924 and in the openings extending through the dielectric layer 924. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 926. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 926. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The remaining dielectric layers 928/932/936 and metallization patterns 930/934 may then be formed in a similar manner. For example, the dielectric layer 928 is deposited on the metallization pattern 926 and dielectric layer 924. The dielectric layer 928 may be formed in a manner similar to the dielectric layer 924, and may be formed of a similar material as the dielectric layer 924. The metallization pattern 930 is then formed. The metallization pattern 930 includes portions on and extending along the major surface of the dielectric layer 928. The metallization pattern 930 further includes portions extending through the dielectric layer 928 to physically and electrically couple the metallization pattern 926. The metallization pattern 930 may be formed in a similar manner and of a similar material as the metallization pattern 926. In some embodiments, the metallization pattern 930 has a different size than the metallization pattern 1926. For example, the conductive lines and/or vias of the metallization pattern 930 may be wider or thicker than the conductive lines and/or vias of the metallization pattern 926. Further, the metallization pattern 930 may be formed to a greater pitch than the metallization pattern 926.

The dielectric layer 932 and the metallization pattern 934 may then be formed in a similar manner. The metallization pattern 934 is the topmost metallization pattern of the redistribution structure 92. As such, all of the intermediate metallization patterns of the redistribution structure 922 (e.g., the metallization patterns 926 and 930) are disposed between the metallization pattern 934 and the through vias 914. In some embodiments, the metallization pattern 934 has a different size than the metallization patterns 926 and 930. For example, the conductive lines and/or vias of the metallization pattern 934 may be wider or thicker than the conductive lines and/or vias of the metallization patterns 926 and 930. Further, the metallization pattern 934 may be formed to a greater pitch than the metallization pattern 930. The dielectric layer 936 is the topmost dielectric layer of the redistribution structure 922.

Figure 48:
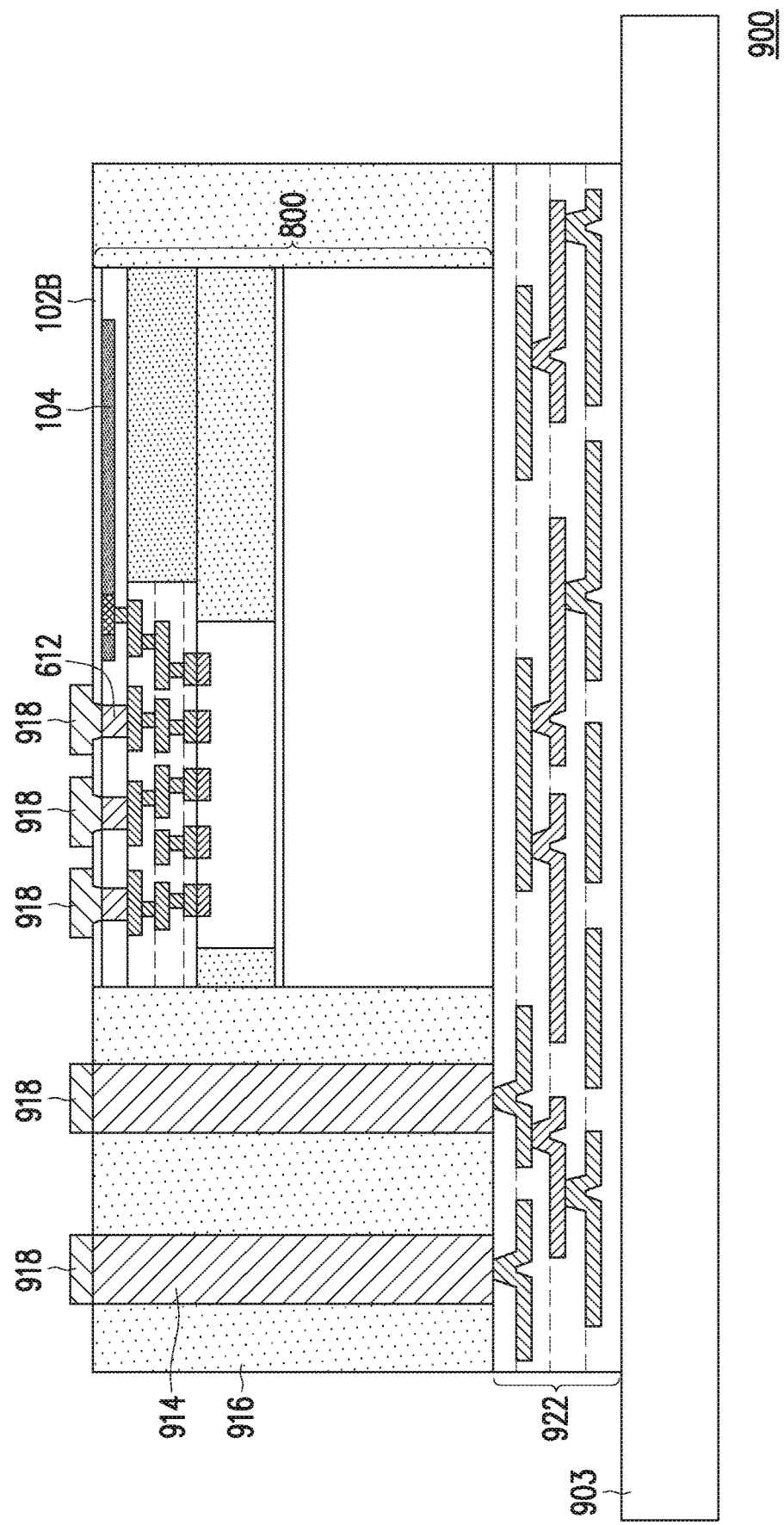

In FIG. 48, the structure is removed from the carrier substrate 901, flipped over, and attached to a carrier substrate 903. Conductive connectors 918 may also be formed on the through vias 914 and the vias 612, in accordance with some embodiments. The carrier substrate 903 may be similar to the carrier substrate 901, in some embodiments. The conductive connectors 918 are formed for connection to the redistribution structure 120 of the photonic structure 800 and for connection to the through vias 914. The conductive connectors 918 may be formed of the same material as the metallization patterns of the redistribution structure 922 or of the through vias 914, for example. In some embodiments, openings in the oxide layer 102B may be formed, with conductive connectors 918 extending through the oxide layer 102B to physically and electrically contact the vias 612. The openings in the oxide layer 102B may be formed using suitable photolithography and etching techniques.

Figure 49:
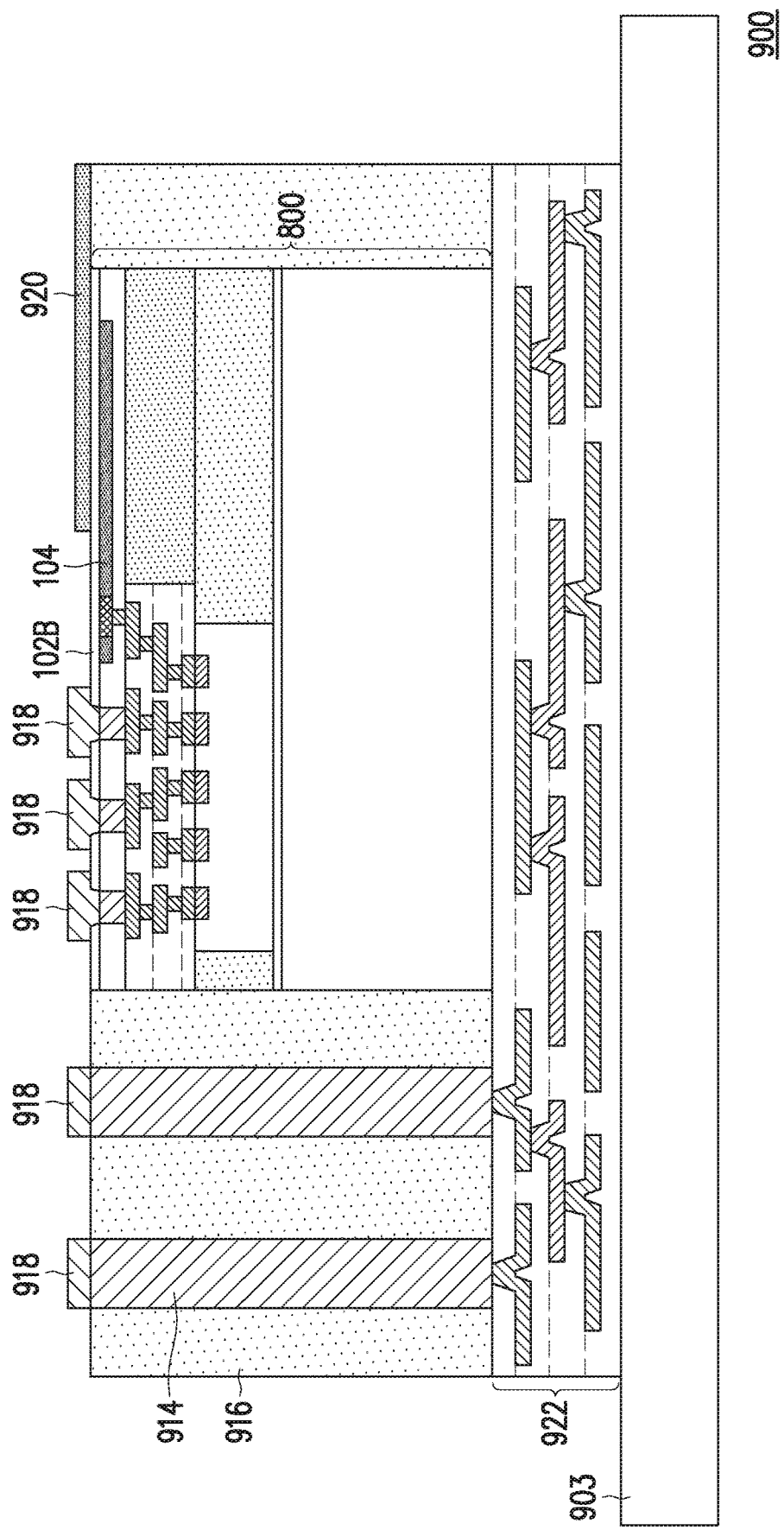

In FIG. 49, one or more waveguides 920 are formed over the oxide layer 102B and the encapsulant 916. The waveguides 920 may comprise a material such as a polymer, silicon nitride, or the like, in some embodiments. For example, the waveguides 920 may comprise a polymer such as PMMA, BCB, or the like, though other materials may be used in other embodiments. One or more of the waveguides 920 may be optically coupled to the waveguides 104 through the oxide layer 102B, in some embodiments. In some embodiments, one or more of the waveguides 920 extends over the encapsulant 916 to the edge of the structure, such that an edge-mounted optical fiber 150 may be coupled into those waveguides 920 (see FIG. 51). In some embodiments, one or more waveguides 920 may be formed extending into a scribe region such that a sidewall of the waveguides 920 are exposed during singulation of the photonic package 900.

The waveguides 920 may be formed, for example, by depositing a layer of the material of the waveguides 920 (not separately shown in the figures) over the oxide layer 102B and encapsulant 916 and then patterning the material layer to form the waveguides 920. The material layer may be deposited using a suitable technique, such as a spin-on coating technique, though other techniques are possible. In some embodiments, the waveguides 920 are formed having a thickness in the range of about 3 μm to about 6 μm, though other thicknesses are possible.

The waveguides 920 may be patterned using acceptable photolithography and etching techniques. For example, a hardmask layer may be formed over the material layer and patterned, in some embodiments. The pattern of the hardmask layer may then be transferred to the material layer using an etching process. The etching process may include, for example, a dry etching process and/or a wet etching process. The material layer may be etched to form recesses defining the waveguides 920, with sidewalls of the remaining unrecessed portions defining sidewalls of the waveguides 920. In some embodiments, more than one photolithography and etching sequence may be used in order to pattern the material layer. One waveguide 920 or multiple waveguides 920 may be patterned from the material layer. If multiple waveguides 920 are formed, the multiple waveguides 920 may be individual separate waveguides 920 or connected as a single continuous structure. In some embodiments, one or more of the waveguides 920 form a continuous loop. In some embodiments, the waveguides 920 may include photonic structures such as grating couplers, edge couplers, or couplers (e.g., mode converters) that allow optical signals to be transmitted between two waveguides 920 and/or between a waveguide 920 and a waveguide 104. For example, a waveguide 920 may include an edge coupler that allows optical signals and/or optical power to be transferred between the waveguides 920 and, for example, an edge-mounted optical fiber 150.

In some cases, a waveguide formed from a polymer material (e.g., waveguides 920) may have advantages over a waveguide formed from silicon (e.g., waveguides 104). For example, the polymer material may have a higher dielectric constant than silicon, and thus a polymer waveguide may have a greater internal confinement of light than a silicon waveguide. This may also allow the performance or leakage of polymer waveguides to be less sensitive to process variations, less sensitive to dimensional uniformity, and less sensitive to surface roughness (e.g., edge roughness or linewidth roughness). In some cases, the reduced process sensitivity may allow polymer waveguides to be easier or less costly to process than silicon waveguides. These characteristics may allow a polymer waveguide to have a lower propagation loss than a silicon waveguide. In this manner, the embodiments described herein can allow for the formation of a photonic package 900 that has both polymer waveguides (e.g., waveguides 920) and silicon waveguides (e.g., waveguides 104). The multiple sets of waveguides (e.g., 104, 920) in the photonic package 900 can allow for a larger and more efficient optical network within the photonic package 900, which can result in faster and more efficient device performance.

Figure 50:
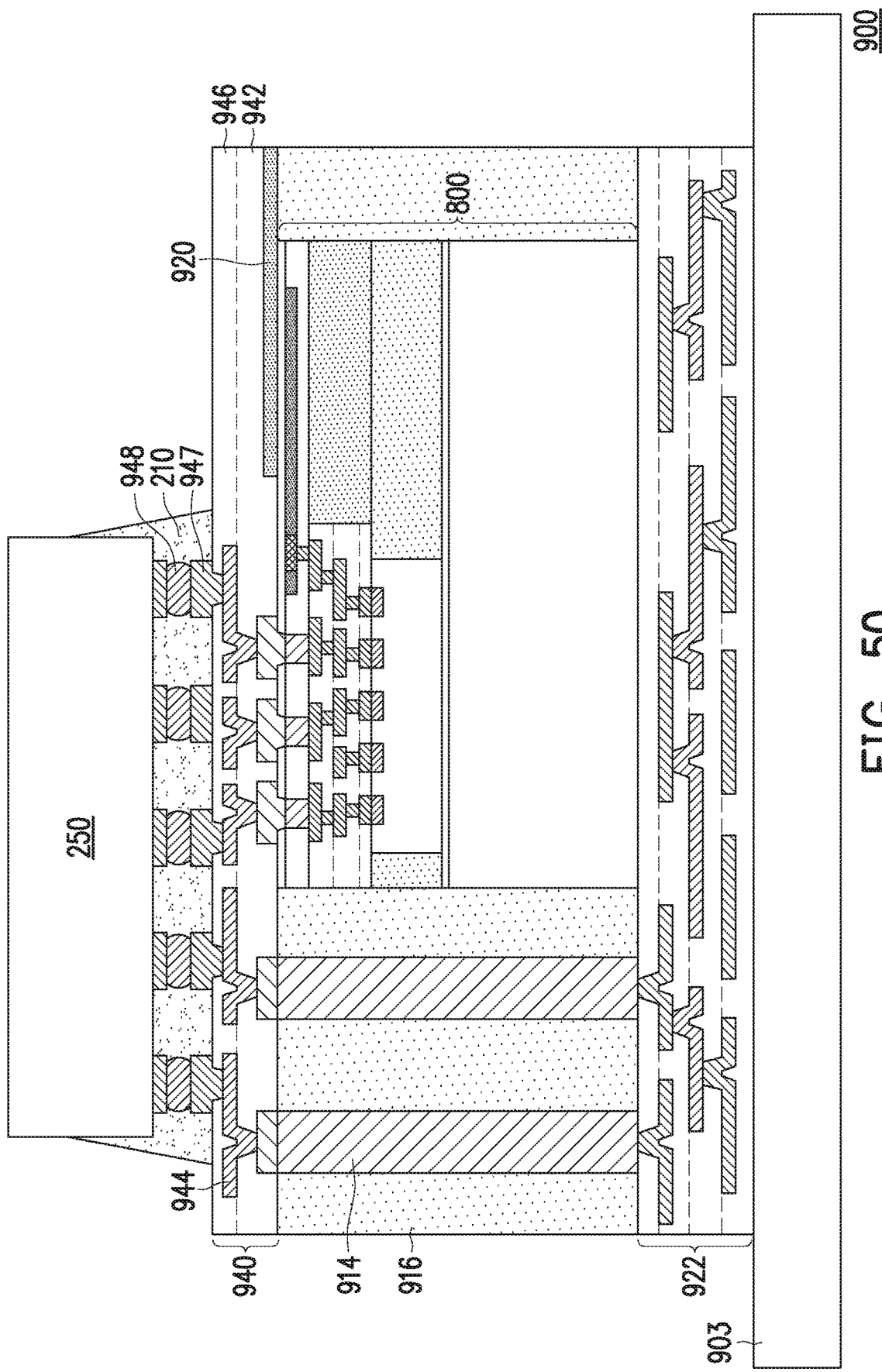

In FIG. 50, a redistribution structure 940 is formed over the conductive connectors 918 and the waveguides 920, in accordance with some embodiments. The redistribution structure 940 shown in FIG. 50 comprises dielectric layers 942/946 and a metallization pattern 944. In other embodiments, the redistribution structure 940 may have another number of dielectric layers and metallization patterns than shown. The dielectric layers 942/946 and metallization pattern 944 may be similar to the dielectric layers and metallization patterns of the redistribution structure 922 (see FIG. 47), and may be formed in a similar manner. The metallization pattern 944 is formed to be physically and electrically connected to the conductive connectors 918, and thus makes electrical connection to the through vias 914 and/or the photonic structure 800.

In some embodiments, under-bump metallizations (UBMs) 947 are formed on the redistribution structure 940. The UBMs 947 may have bump portions on and extending along the major surface of the dielectric layer 946, and may have via portions extending through the dielectric layer 946 to physically and electrically couple the metallization pattern 944. As a result, the UBMs 947 are electrically coupled to the through vias 914 and the photonic structure 800. The UBMs 947 may be formed of the same material as the metallization pattern 944. In some embodiments, the UBMs 947 has a different size than the metallization pattern 944.

In some embodiments, one or more semiconductor devices 250 are connected to the UBMs 947. The semiconductor devices 250 may be similar to those described previously. The semiconductor devices 250 may be connected to the UBMs 947 by conductive connectors 948, which may be, for example, solder bumps or the like. An underfill 210 may be deposited between the semiconductor devices 250 and the redistribution structure 940. The photonic package 900 may subsequently be removed from the carrier substrate 903, and UBMs 956 and conductive connectors 958 (see FIG. 51) may be formed on the redistribution structure 922. The UBMs 956 may be similar to the conductive pads 128 or UBMs 947 described previously, and the conductive connectors 958 may be similar to the conductive connectors 132 described previously.

Figure 51:
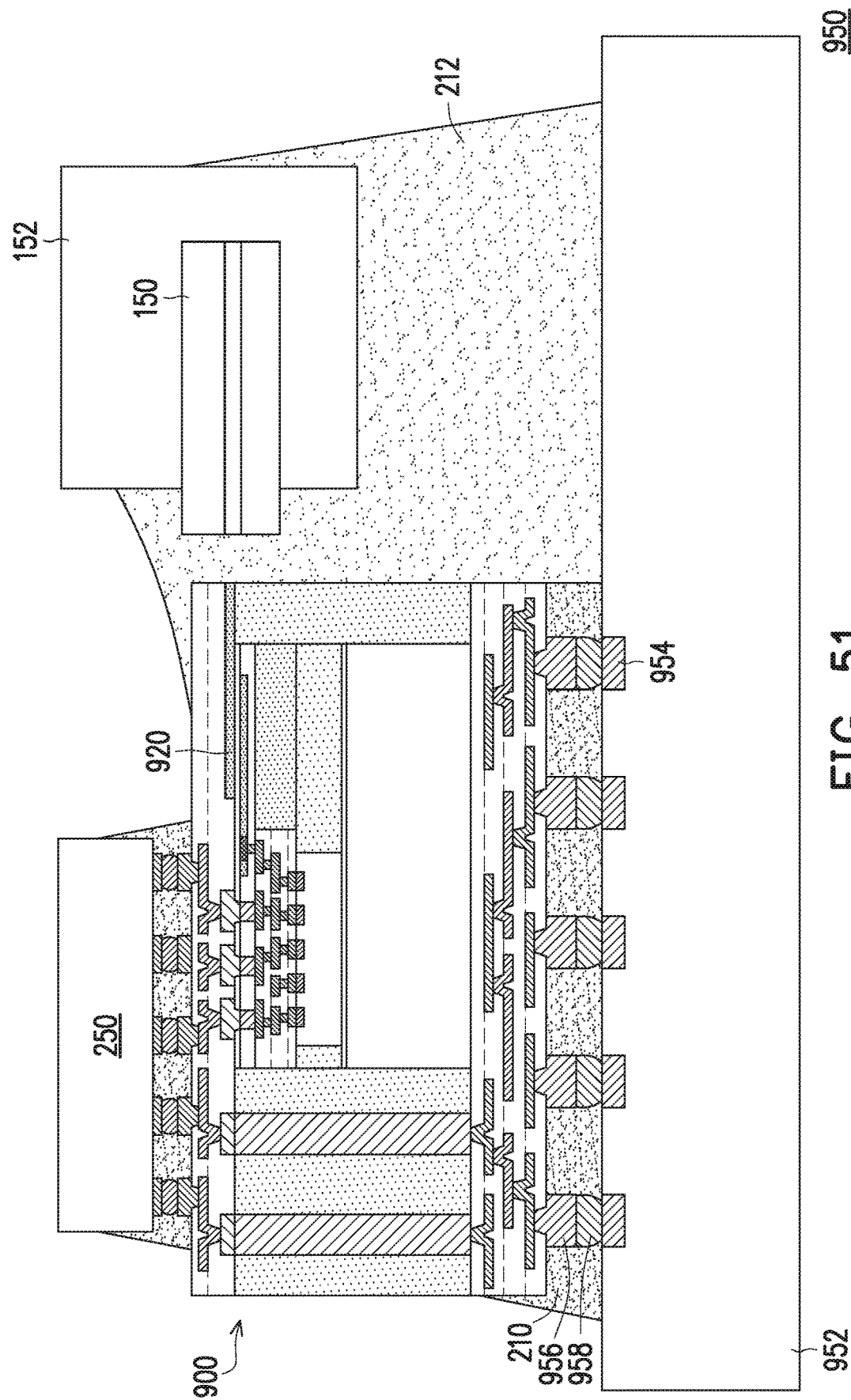
FIG. 51 illustrates a cross-sectional view of a photonic system, in accordance with some embodiments.

FIG. 51 illustrates a photonic system 950, in accordance with some embodiments. The photonic system 950 includes one or more photonic packages 900 attached to an interconnect substrate 952. The photonic package 900 may be similar to those described for FIG. 50. The interconnect substrate 952 may be similar to the interconnect substrate 202 described for FIG. 15. For example, the interconnect substrate 952 may include one or more conductive pads 954 similar to the conductive pads 204 of the interconnect substrate 202. The conductive connectors 958 of the photonic package 900 may be bonded to the conductive pads 954 of the interconnect substrate 952, forming electrical connections between the photonic package 900 and the interconnect substrate 952. For example, the conductive connectors 958 of the photonic package 900 may be placed in physical contact with the conductive pads 954, and then a reflow process may be performed to bond solder material of the conductive connectors 958 to the conductive pads 954. In some embodiments, an underfill 210 may be formed between the photonic package 900 and the interconnect substrate 952. An optical fiber 150 may be attached to the interconnect substrate 952 and optically coupled to a waveguide 104, in some embodiments.

Figure 53:
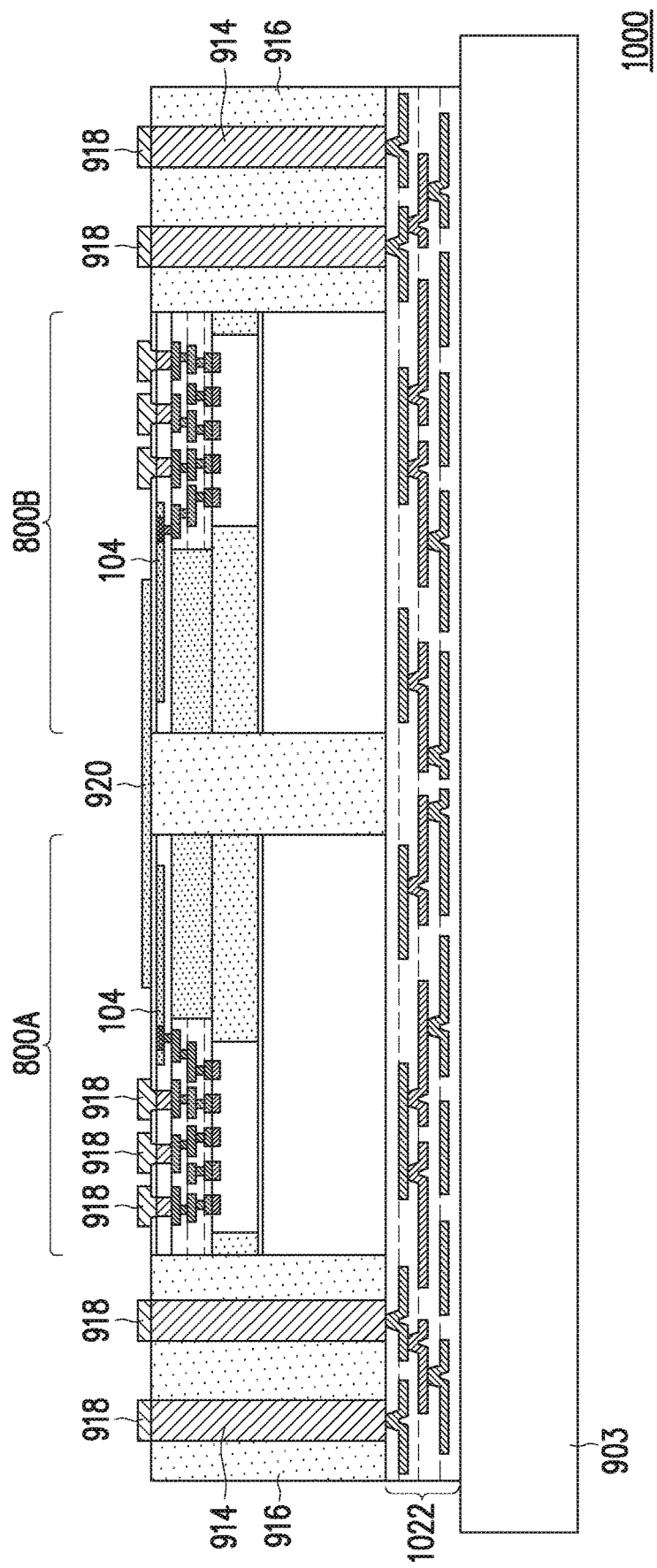
Figure 54:
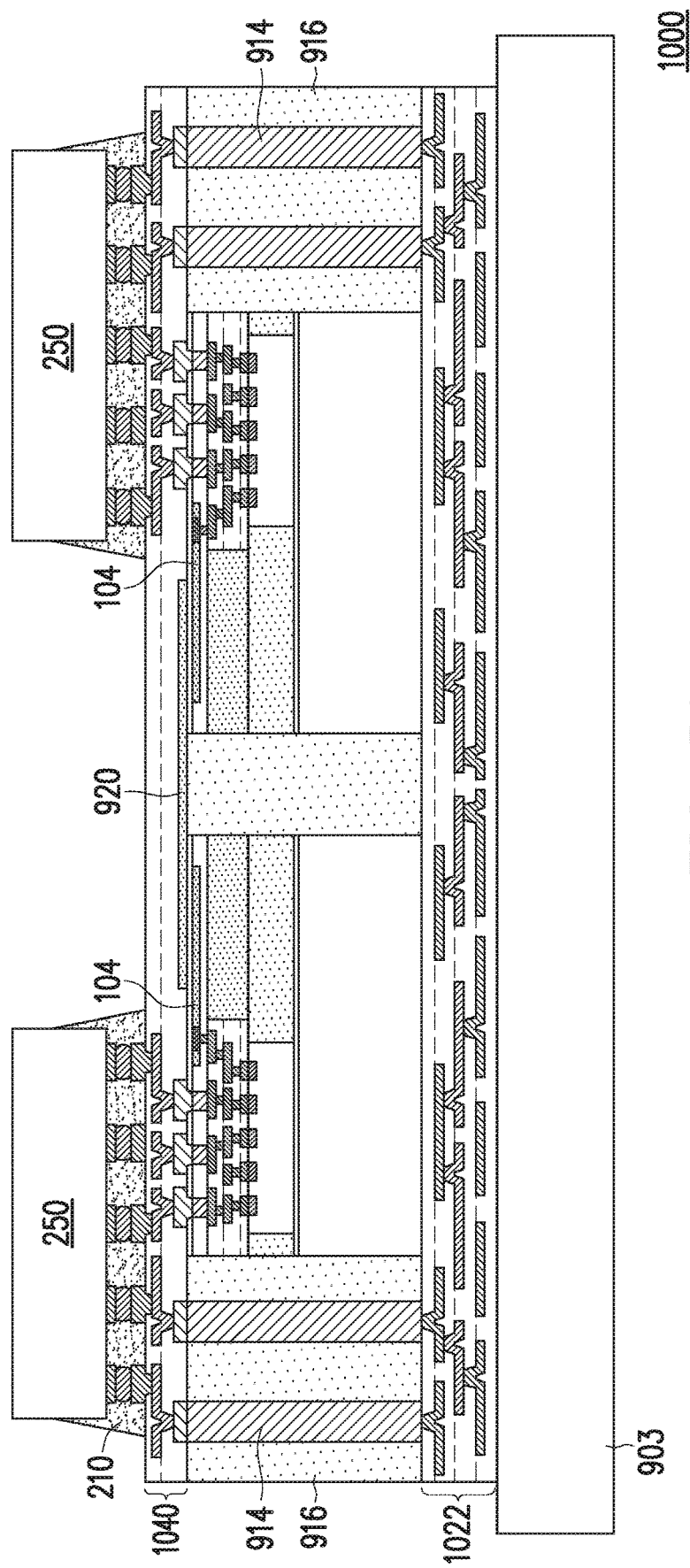
Figure 55:
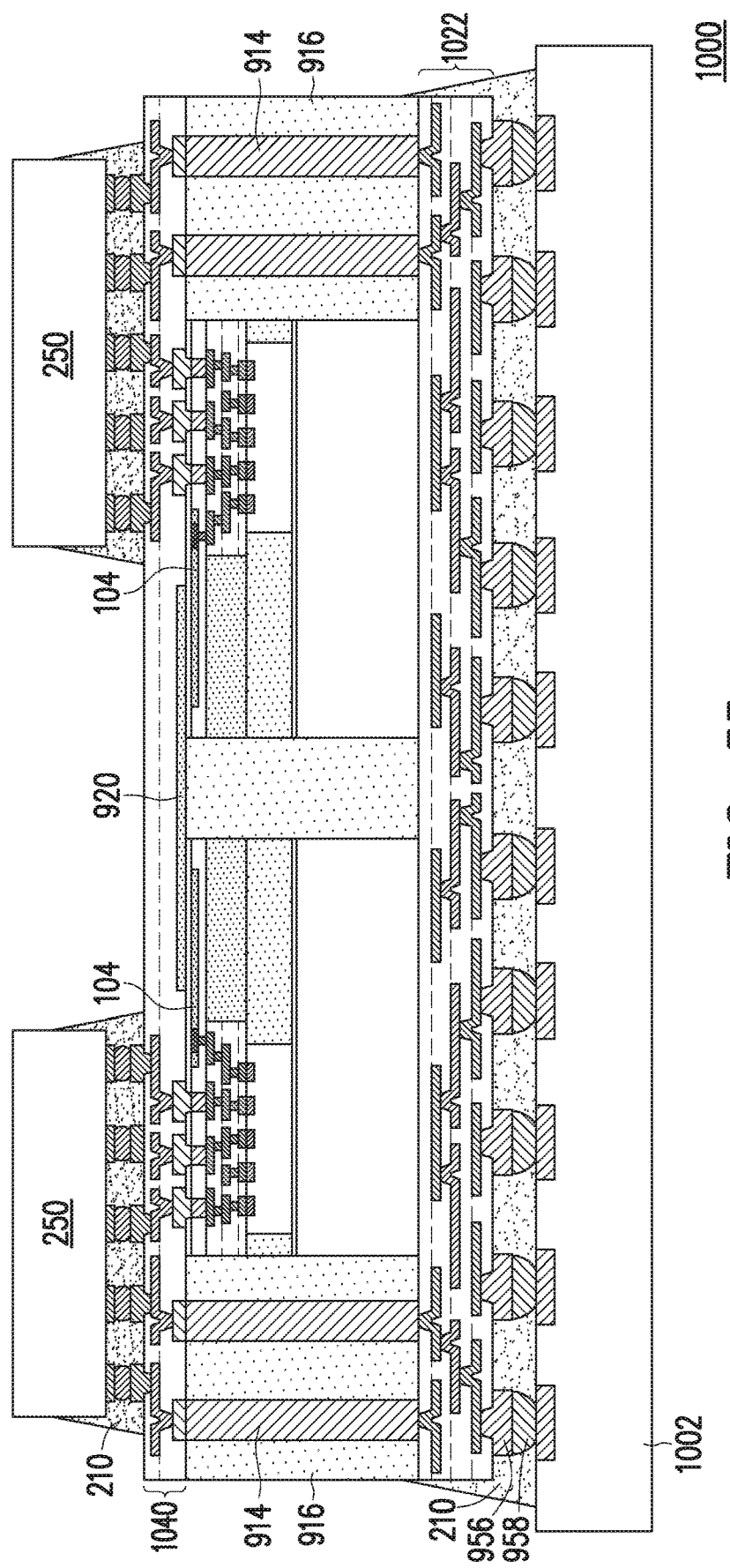

FIGS. 52 through 55 illustrate intermediate steps in the formation of a photonic system 1000, in accordance with some embodiments. The photonic system 1000 is similar to the photonic system 950 shown in FIG. 51, except that the photonic system 1000 includes multiple photonic structures 800A-B that interface with semiconductor devices 250A-B and communicate using optical signals transmitted over an optical network formed of the waveguides 920. The use of an optical network of waveguides 920 for intercommunication can allow for improved speed and efficiency of the photonic system 1000. FIG. 55 illustrates a photonic system 1000 having two photonic structures 800A-B, but in other embodiments another number of photonic structures 800 may be present.

Figure 52:
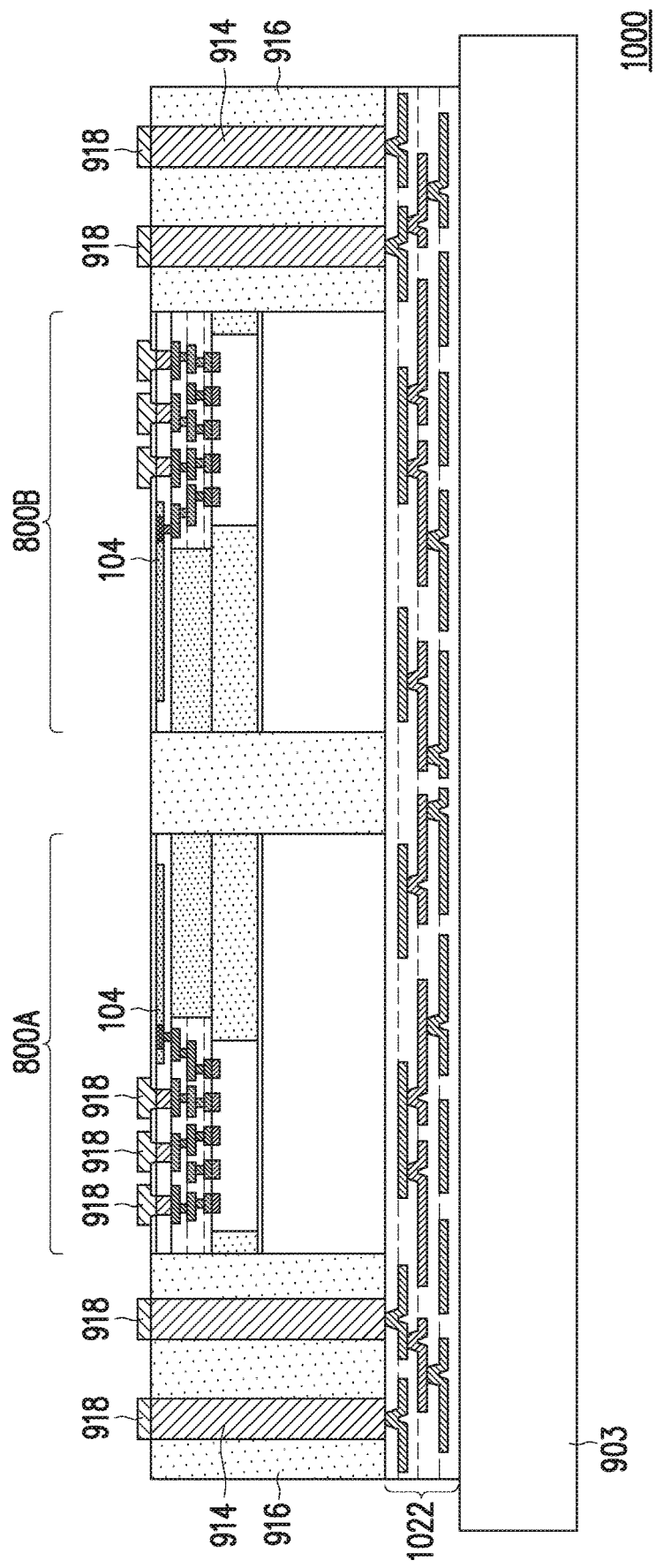
FIGS. 52 through 55 illustrate cross-sectional views of intermediate steps of forming a photonic system, in accordance with some embodiments.

FIG. 52 illustrates a structure comprising multiple photonic structures 800A-B and through vias 914 formed on a redistribution structure 1022, in accordance with some embodiments. The structure shown in FIG. 51 is similar to the structure shown in FIG. 48 except for multiple photonic structures 800A-B. For example, the structure shown in FIG. 52 includes through vias 914 which may be similar to the through vias 914 shown in FIG. 48, and which may be formed in a similar manner. The redistribution structure 1022 shown in FIG. 52 is similar to the redistribution structure 922 of FIG. 48, and may be formed in a similar manner. Similar to the structure shown in FIG. 48, the through vias 914 and the photonic structures 800A-B have been encapsulated by an encapsulant 916, and conductive connectors 918 have been formed on the through vias 914 and on vias 612 of the photonic structures 800A-B.

In FIG. 53, one or more waveguides 920 are formed over the photonic structures 800A-B. The waveguides 920 may be similar to the waveguides 920 described previously for FIG. 49, and may be formed in a similar manner. For example, the waveguides 920 may be formed of a polymer material such as those described previously for FIG. 49, but other materials are possible. Some of the waveguides 920 may extend over some of the waveguides 104 of the photonic structures 800A-B and some of the waveguides 920 may be optically coupled to the waveguides 104. In this manner, the waveguides 920 may form an optical network that extends between the photonic structures 800A-B and communicates optical signals between the photonic structures 800A-B.

In FIG. 54, a redistribution structure 1040 is formed and semiconductor devices 250A-B are connected to the redistribution structure 1040, in accordance with some embodiments. The redistribution structure 1040 is similar to the redistribution structure 940 shown in FIG. 49, and may be formed in a similar manner. For example, the redistribution structure 1040 may make electrical connection to the conductive connectors 918. The semiconductor devices 250A-B may be similar to the semiconductor devices 250 described previously. The semiconductor devices 250A-B may be connected to the redistribution structure 1040 in a manner similar to that described for FIG. 50. For example, the semiconductor devices 250A-B may be connected to UBMs formed on the redistribution structure 1040 using, for example, solder bumps or the like. In some embodiments, the semiconductor devices 250A-B may each be connected to the redistribution structure 120 of a respective photonic structure 800A-B. In this manner, the semiconductor devices 250A-B can communicate with the photonic structures 800A-B. In some embodiments, the photonic structures 800A-B may facilitate communication between semiconductor devices 250A-B by sending and receiving optical signals over the waveguides 920.

In FIG. 55, the redistribution structure 1022 is connected to an interconnect substrate 1002, forming the photonic system 1000. The interconnect substrate 1002 may be similar to the interconnect substrate 952 described for FIG. 51. For example, the interconnect substrate 1002 may include conductive pads 1004. In some embodiments, UBMs 956 and conductive connectors 958 may be formed on the redistribution structure 1022. The UBMs 956 may be connected to the conductive pads 1004 by the conductive connectors 958. In this manner, a photonic system 1000 may be formed that allows for efficient and high-speed optical communication between multiple semiconductor devices 250A-B using waveguides 920.

FIGS. 56 through 63 illustrate intermediate steps in the formation of a photonic system 1100, in accordance with some embodiments. The photonic system 1100 (see FIG. 63) includes multiple photonic packages 1101 (see FIG. 56 or the photonic packages 1101A-B in FIG. 56) that are attached to photonic interconnect structure 1111 (see FIG. 59). The photonic interconnect structure 1111 includes waveguides 1106 that are optically coupled to the photonic packages 1101 and allow optical communication between the photonic packages 1101. In this manner, efficient and high-speed optical communication between photonic packages 1101 may be achieved. FIG. 63 illustrates a photonic system 1000 having two photonic packages 1101A-B, but in other embodiments another number of photonic packages 1101 may be present.

Figure 56:
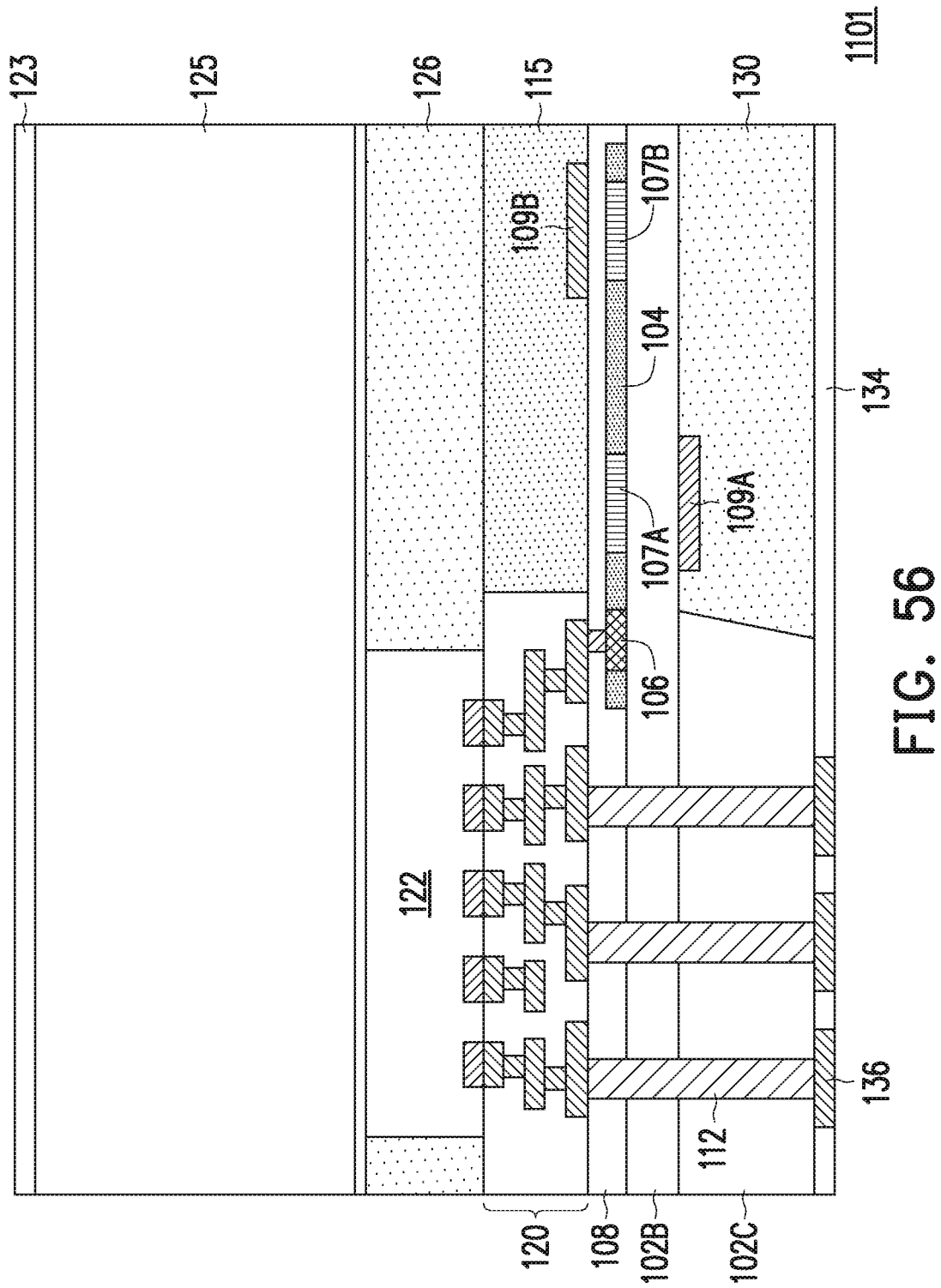
FIG. 56 illustrates a cross-sectional view of a photonic package, in accordance with some embodiments.

FIG. 56 shows a photonic package 1101, in accordance with some embodiments. The photonic package 1101 is similar to the photonic package 100 shown in FIG. 14, except that the photonic package 1101 includes contact pads 136 formed in a dielectric layer 134. For example, the photonic package 1101 comprises waveguides 104, grating couplers 107A-B, vias 112, and a dielectric layer 130. The contact pads 136 may be similar to the conductive pads 116 described for FIG. 6, and the dielectric layer 134 may be similar to the dielectric layers 117 described for FIG. 6. For example, the dielectric layer 134 may be formed over the substrate 102C, the vias 112, and the dielectric layer 130, openings may be patterned in the dielectric layer 134, and then the conductive material of the contact pads 136 may be formed in the openings. Other formation techniques are possible.

The photonic package 1101 may comprise optional features such as reflectors 109 and a coating 123 on the support 125, in accordance with some embodiments. The reflectors 109 may be formed near a corresponding grating coupler 107 to enhance optical coupling between the grating coupler 107 and another component such as a coupler or optical fiber. For example, the photonic package 1101 shown in FIG. 56 includes a reflector 109A formed below the grating coupler 107A to enhance coupling between the grating coupler 107A and an optical fiber 150 above the grating coupler 107A (see FIG. 63), and a reflector 109B formed above the grating coupler 107B to enhance coupling between the grating coupler 107B and a grating coupler 1107 of the photonic interconnect structure 1111 below the grating coupler 107B (see FIG. 63). The reflectors 109 may comprise one or more layers of a material such as a metal (e.g., copper or the like), titanium nitride, the like, or combinations thereof. In some embodiments, the reflectors 109 may comprise a periodic stack of dielectric layers, such as a stack comprising layers of silicon oxide, silicon nitride, or the like. For example, the reflector 109A may be formed by depositing a material on the oxide layer 102B and then patterning the material, and the reflector 109B may be formed by depositing a material on the dielectric layer 108A and then patterning the material. Other formation techniques are possible.

The optional coating 123 formed on the support 125 may be, for example, an anti-reflection coating. The coating 123 may be formed over the entire surface of the support 125, as shown in FIG. 56, or on part of the support 125. For embodiments in which an optical fiber 150 is attached to the support 125 and communicates optically through the support 125 (e.g., optical fibers 150A-B in FIG. 63), the use of a coating 123 can reduce optical loss or reflections between the fiber 150 and the support 125. For example, for embodiments in which the support 125 comprises silicon, the coating 123 may comprise one or more layers of silicon oxide, silicon nitride, polymer, BCB, the like, or combinations thereof. The coating 123 is omitted from FIGS. 57-63 for clarity.

Figure 57:
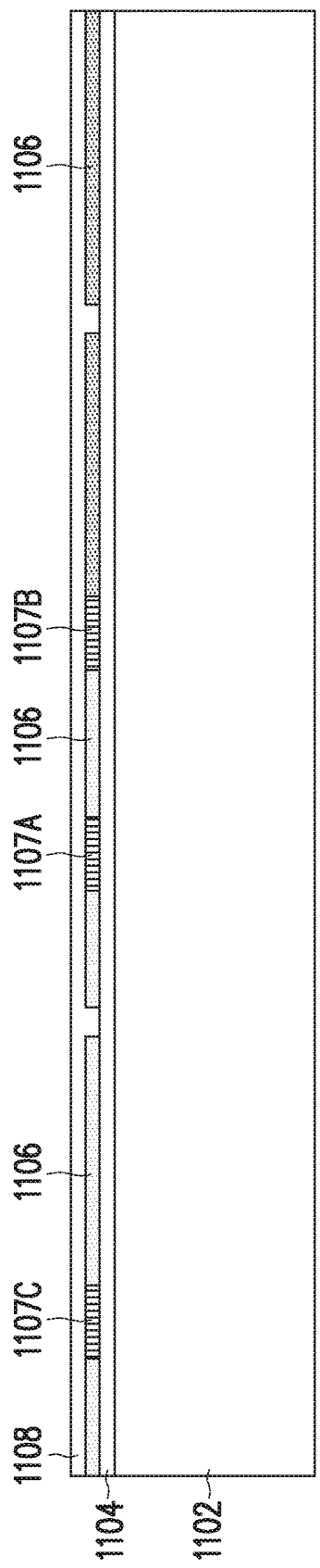
FIGS. 57 through 63 illustrate cross-sectional views of intermediate steps of forming a photonic system, in accordance with some embodiments.

FIG. 57 illustrates the formation of waveguides 1106 on a substrate 1102, in accordance with some embodiments. The substrate 1102 may be a substrate similar to that described for substrate 102C in FIG. 1. For example, in some embodiments, the substrate 1102 may be a wafer, such as a silicon wafer (e.g., a 12-inch silicon wafer), another type of semiconductor wafer, a multilayer substrate such as a BOX substrate, or the like. A dielectric layer 1104 may be formed over the substrate 1102. The dielectric layer 1104 may comprise one or more materials similar to those described for the dielectric layer 108 described in FIG. 3, and may be formed in a similar manner as described for the dielectric layer 108.

The waveguides 1106 may be formed on the dielectric layer 1104. The waveguides 1106 may be similar to the waveguides 104 of FIG. 2, the waveguides 604A of FIG. 37, or the waveguides 920 of FIG. 49, and may be formed using similar techniques. For example, in some embodiments, the waveguides 1106 are formed by depositing a layer of silicon nitride over the dielectric layer 1104 and then patterning the layer of silicon nitride to form waveguides 1106 comprising silicon nitride. Other materials or techniques are possible. In some embodiments, grating couplers 1107 may be formed in the waveguides 1106. FIG. 57 shows three grating couplers 1107A-C, but another number of grating couplers 1107 may be formed in other embodiments. After forming the waveguides 1106, a dielectric layer 1108 may be formed over the waveguides 1106 and the dielectric layer 1104. The dielectric layer 1108 may be a material similar to those described for the dielectric layer 108, and may be formed in a similar manner.

Figure 58:
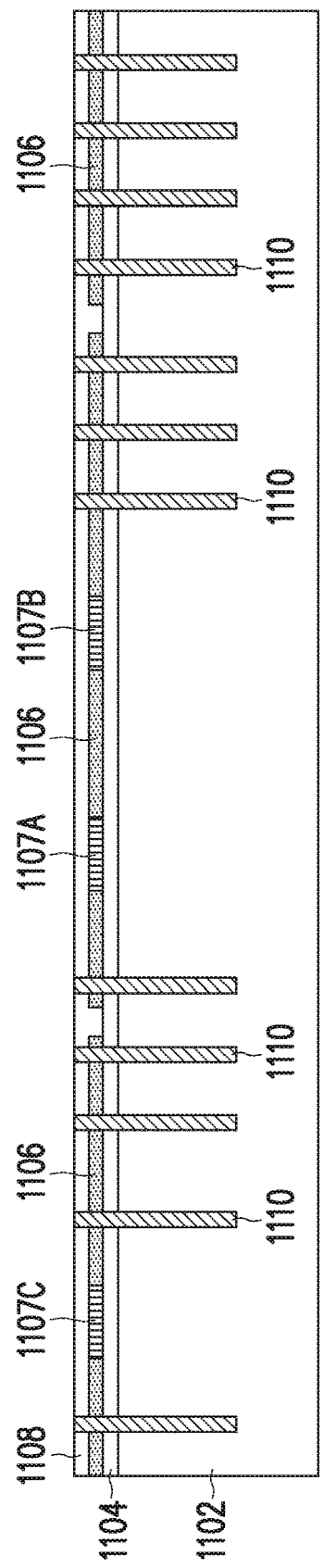

In FIG. 58, vias 1110 are formed, in accordance with some embodiments. The vias 1110 may be similar to the vias 112 shown in FIG. 5, and may be formed in a similar manner. For example, openings may be formed extending into the substrate 1102, and then conductive material may be deposited in the openings.

Figure 59:
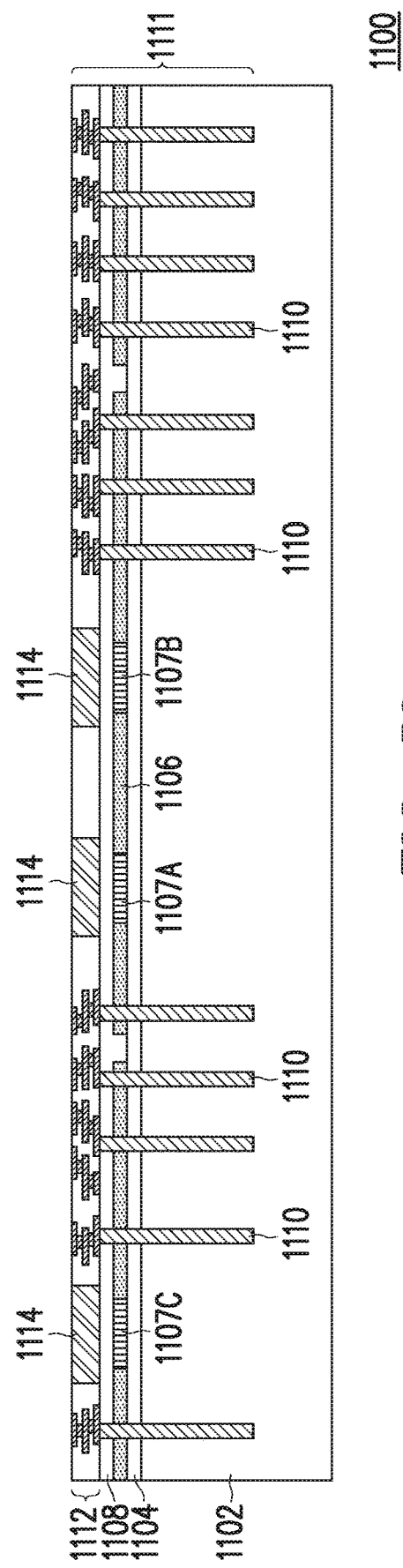

In FIG. 59, a redistribution structure 1112 may be formed over the waveguides 1106, the dielectric layer 1108, and vias 1110 to form a photonic interconnect structure 1111, in accordance with some embodiments. The redistribution structure 1112 may be formed using techniques similar to those described for the redistribution structure 120 and shown in FIG. 6. For example, the redistribution structure 1112 may include multiple metallization patterns and dielectric layers, and may be electrically connected to the vias 1110.

Still referring to FIG. 59, portions of the redistribution structure 1112 may be removed and replaced with dielectric regions 1114, in accordance with some embodiments. The dielectric regions 1114 may be formed above grating couplers 1107, such that optical signals may be transmitted through the dielectric regions 1114 to the grating couplers 1107. The dielectric regions 1114 may comprise one or more materials similar to those described for the dielectric layer 108 described in FIG. 3, and may be formed in a similar manner as described for the dielectric layer 108. For example, in some embodiments, the dielectric regions 1114 may comprise silicon oxide or the like, though other materials are possible.

Figure 60:
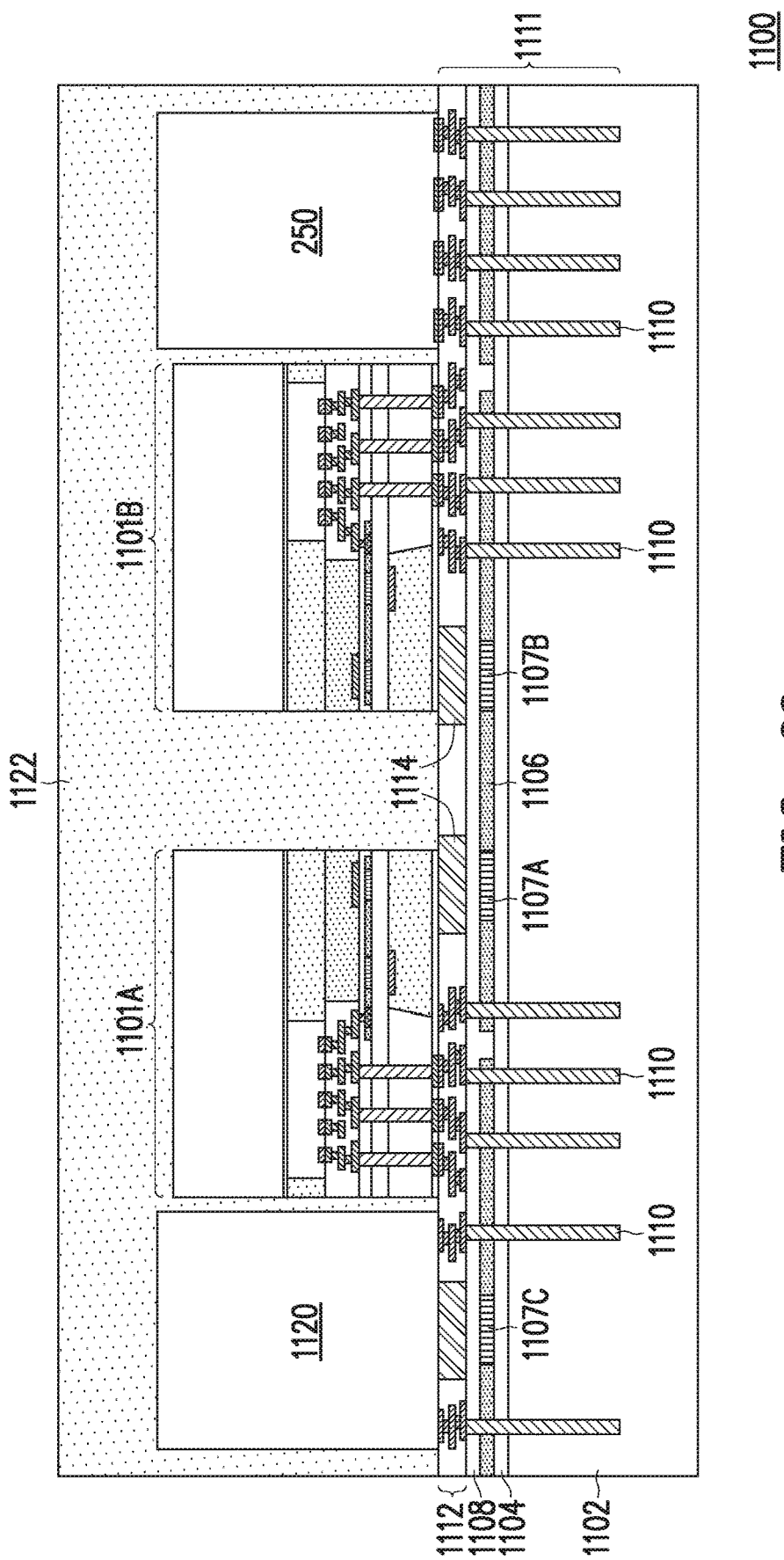

In FIG. 60, one or more photonic packages 1101, semiconductor devices 250, and/or dummy devices 1120 are attached to the photonic interconnect structure 1111, in accordance with some embodiments. The photonic packages 1101A-B and the semiconductor device 250 shown in FIG. 60 may be similar, respectively, to the photonic package 1101 shown in FIG. 56 and the semiconductor devices 250 described previously. In some embodiments, the dummy device 1120 is a dummy die, block of material, or the like that is subsequently recessed to facilitate attachment of an optical fiber 150C (see FIGS. 62-63). For example, in some embodiments, the dummy device 1120 may comprise silicon, silicon oxide, polymer, the like, or combinations thereof. FIG. 60 illustrates two photonic packages 1101A-B, one semiconductor device 250, and one dummy device 1120, but more or fewer may be present in other embodiments. For example, in some embodiments, each photonic package 1101 attached to the photonic interconnect structure 1111 has an associated semiconductor device 250 attached to the photonic interconnect structure 1111.

The photonic packages 1101A-B, the semiconductor device 250, and the dummy device 1120 may be attached using direct bonding or the like. In some embodiments, the dummy device 1120 may be attached using a different technique than the photonic packages 1101A-B and/or the semiconductor device 250. In some embodiments, an encapsulant 1122 is formed on and around the photonic packages 1101A-B, the semiconductor device 250, and the dummy device 1120. The encapsulant 1122 may be a molding compound, epoxy, or the like, and may be similar to the encapsulant 916 described for FIG. 46.

Figure 61:
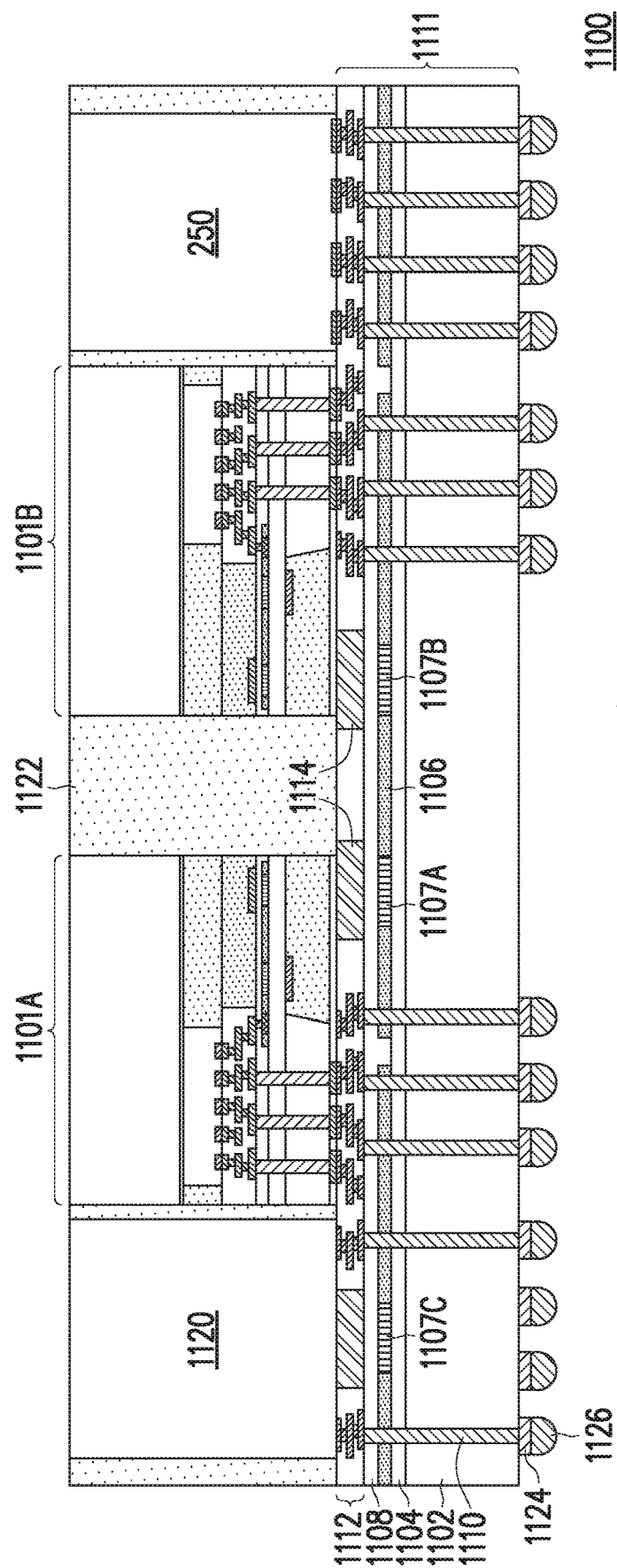

In FIG. 61, the substrate 1102 is thinned to expose the vias 1110, and conductive pads 1124 and conductive connectors 1126 are formed on the exposed vias 1110, in accordance with some embodiments. The substrate 1102 may be thinned using a suitable process, such as a CMP process, a grinding process, an etching process, the like, or a combination thereof. The conductive pads 1124 may be similar to the conductive pads 128 described for FIG. 14, and may be formed in a similar manner. The conductive connectors 1126 may be similar to the conductive connectors 132 described for FIG. 14, and may be formed in a similar manner. The conductive connectors 1126 allow external components to be connected to the photonic interconnect structure 1111. In this manner, the external components may transmit electrical signals and/or electrical power to the redistribution structure 1112 and thus to the photonic packages 1101A-B and semiconductor devices 250.

Referring to FIG. 61, a planarization process may be performed on the encapsulant 1122, in accordance with some embodiments. The planarization process may expose surfaces of the photonic packages 1101A-B (e.g., surfaces of the supports 125 or the coating 123), surfaces of the semiconductor devices 250, and/or surfaces of the dummy devices 1120. The planarization process may include a CMP process, a grinding process, an etching process, the like, or combinations thereof.

Figure 62:
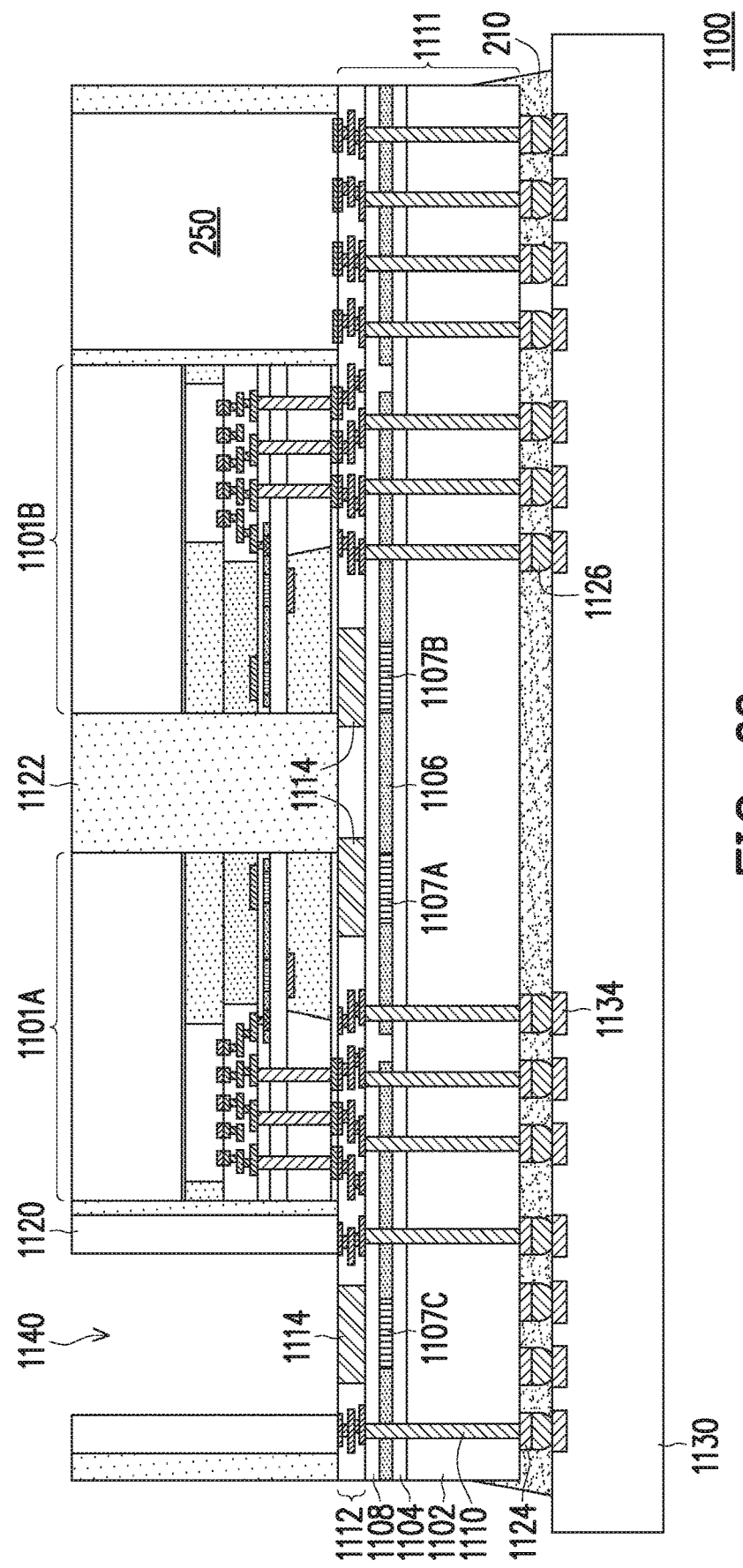

In FIG. 62, a recess 1140 is formed in the dummy device 1120, in accordance with some embodiments. FIG. 62 also shows the photonic interconnect structure 1111 connected to an interconnect substrate 1130, forming the photonic system 1100. The recess 1140 in the dummy device 1120 may be formed using an etching process, such as a wet etch, a dry etch, or a combination thereof. The recess 1140 may expose the dielectric region 1114 underneath the dummy device 1120, in some embodiments. Exposing the dielectric region 1114 in this manner allows an optical fiber 150 (e.g., the optical fiber 150C of FIG. 63) to be optically coupled to the grating coupler 1107C. The interconnect substrate 1130 may be similar to the interconnect substrate 952 described for FIG. 51. For example, the interconnect substrate 1130 may include conductive pads 1134, and the conductive connectors 1126 may be attached to the conductive pads 1134. An underfill 210 may be deposited between the substrate 1102 and the interconnect substrate 1130.

In FIG. 63, optical fibers 150A-C are attached to the photonic system 1100, in accordance with some embodiments. FIG. 63 shows an optical fiber 150A attached to the photonic package 1101A, an optical fiber 150B attached to the photonic package 1101B, and an optical fiber 150C attached within the recess 1140 of the dummy device 1120. More or fewer optical fibers 150 may be attached to more or fewer photonic packages 1101 in other embodiments. An optical glue 212 or the like may be used to attach the optical fibers 150A-C.

In the embodiment shown, the optical fiber 150A is attached to the support 125 of the photonic package 1101A and is optically coupled to the grating coupler 107A of the photonic package 1101A, and the optical fiber 150B is attached to the support 125 of the photonic package 1101B and is optically coupled to the grating coupler 107A of the photonic package 1101B. In some embodiments, optical signals and/or optical power may be transmitted through the support 125 and other dielectric layers of the photonic packages 1101A-B to allow optical communication between the grating couplers 107A of the photonic packages 1101A-B and the optical fibers 150A-B. The photonic packages 1101A-B may include reflectors 109A to facilitate optical coupling between the grating couplers 107A and the optical fibers 150A-B.

The optical fiber 150C is attached to the photonic system 1100 within the recess 1140 and optically coupled to the grating coupler 1107C of the waveguides 1106, in accordance with some embodiments. Optical signals and/or optical power may be transmitted through the dielectric region 1114 to allow optical communication between the grating coupler 1107C and the optical fiber 150C. In this manner, the optical fiber 150C may be optically coupled to the waveguides 1106 through the grating coupler 1107C. In some embodiments, the optical fibers 150A-B attached to the photonic packages 1101 are used to communicate optical signals with the photonic system 1100 using the photonic packages 1101A-B, and the optical fiber 150C is used to communicate optical power to the photonic system 1100 through the waveguides 1106.

In some embodiments, the grating couplers 107B of the photonic packages 1101A-B are optically coupled to the grating couplers 1107A-B of the waveguides 1106. Optical signals and/or optical power may be transmitted through the dielectric regions 1114 to allow optical communication between the grating couplers 1107A-B and the grating couplers 107B. In this manner, the photonic packages 1101A-B may be optically coupled to the waveguides 1106 through the grating couplers 107B and the grating couplers 1107A-B. The photonic packages 1101A-B may include reflectors 109A that facilitate optical coupling between the grating couplers 107B and the grating couplers 1107A-B.

In this manner, in some embodiments, the photonic packages 1101 of a photonic system 1100 may be electrically connected to semiconductor devices 250 of the photonic system 1100 through the redistribution structure 1112. The photonic packages 1101 may also be optically coupled to the waveguides 1106 of the photonic system 1100 to facilitate optical communication between the various semiconductor devices 250 of the photonic system 1100. The redistribution structure 1112 and the waveguides 1106 are part of a photonic interconnect structure 1111 of the photonic system 1100 that allows for both electrical communication and optical communication within the photonic system 1100. The photonic packages 1101 may be optically coupled to optical fibers 150 to facilitate optical communication between the semiconductor devices 250 and external components. The waveguides 1106 may also be optically coupled to one or more optical fibers 150 that provide optical power to the waveguides 1106. The waveguides 1106 may transmit a portion of the optical power to the photonic packages 1101, in some cases. In this manner, a photonic system 1100 may be formed that allows for efficient and high-speed optical communication between multiple semiconductor devices 250 and to external components using the photonic packages 1101 and the waveguides 1106.

FIG. 64 illustrates a photonic system 1150, in accordance with some embodiments. The photonic system 1150 is similar to the photonic system 1100 shown in FIG. 63, except that the photonic interconnect structure 1151 of the photonic system 1150 includes waveguides 1106 formed within the same structural layers as the redistribution structure 1112, and that the photonic packages 1101A-B, the semiconductor devices 250, and the dummy devices 1120 are attached to the photonic interconnect structure 1151 by conductive connectors 1152. Similarly to the photonic system 1100, optical fibers 150A-B may be optically coupled to grating couplers 107A of the photonic packages 1101A-B, optical fibers 150C may be optically coupled to grating couplers 1107C of the waveguides 1106, and grating couplers 107B of the photonic packages 1101A-B may be optically coupled to grating couplers 1107A-B of the waveguides 1106.

In some embodiments, the photonic interconnect structure 1151 of the photonic system 1150 includes a dielectric layer 1104 formed on a substrate 1102, which may be similar to those described for FIG. 57. A redistribution structure 1112 may be formed over the dielectric layer 1104, and may be formed using techniques similar to those described for the redistribution structure 1112 in FIG. 59. After forming the redistribution structure 1112, portions of the redistribution structure 1112 may be removed to expose portions of the dielectric layer 1104. The waveguides 1106 may then be formed on the exposed portions of the dielectric layer 1104. The waveguides 1106 may be similar to the waveguides 1106 described for FIG. 57, and may be formed in a similar manner. For example, a layer of silicon nitride may be deposited over the exposed portions of the dielectric layer 1104 and then patterned, though other materials or techniques are possible. Grating couplers 1107A-C may be formed in the waveguides 1106 using techniques similar to those described previously. In other embodiments, the waveguides 1106 may be formed before the redistribution structure 1112. For example, portions of the redistribution structure 1112 may be formed adjacent to and/or over the waveguides 1106.

A dielectric layer 1158 may be formed over the waveguides 1106, in some embodiments. The dielectric layer 1158 may be similar to the dielectric layer 1108 described for FIG. 57, and may be formed using similar techniques. In some embodiments, a planarization process (e.g., CMP, grinding, etching, or the like) is performed such that surfaces of the redistribution structure 1112 and the dielectric layer 1158 are substantially level. The dielectric layer 1158 allows for coupling of optical signals into the grating couplers 1107A-C from above.

The photonic packages 1101A-B, semiconductor devices 250, and/or the dummy devices 1120 may be attached to the redistribution structure 1112 of the photonic interconnect structure 1151 using conductive connectors 1152. The conductive connectors 1152 may be similar to the conductive connectors 948 described for FIG. 50, the conductive connectors 1126 described for FIG. 61, or conductive connectors described elsewhere herein. The components comprising the photonic packages 1101A-C, semiconductor devices 250, and/or the dummy devices 1120 may be attached to the redistribution structure 1112 by, for example, forming conductive connectors 1152 on the redistribution structure 1112 and placing conductive pads of the components in physical contact with the conductive connectors 1152. A reflow process may be performed to bond solder material of the conductive connectors 1152 to the conductive pads of the components. In some cases, the use of conductive connectors 1152 to attach the photonic packages 1101A-C, semiconductor devices 250, and/or the dummy devices 1120 may reduce processing cost or complexity.

In some embodiments, an optical glue 1154 may be formed between the photonic packages 1101A-B and the dielectric layer 1158. The optical glue 1154 allows for optical signals to be transmitted between the photonic packages 1101A-B and the grating couplers 1107A-B. For example, in some embodiments the optical glue 1154 may be index-matched to the dielectric layer 1158 and/or the dielectric layer 130 of the photonic packages 1101A-B. The optical glue 1154 may be deposited on the photonic interconnect structure 1151 before or after attachment of the photonic packages 1101A-B. In some embodiments, an underfill 210 may be formed between the photonic packages 1101A-C, semiconductor devices 250, and/or the dummy devices 1120 and the photonic interconnect structure 1151.

Figure 67:
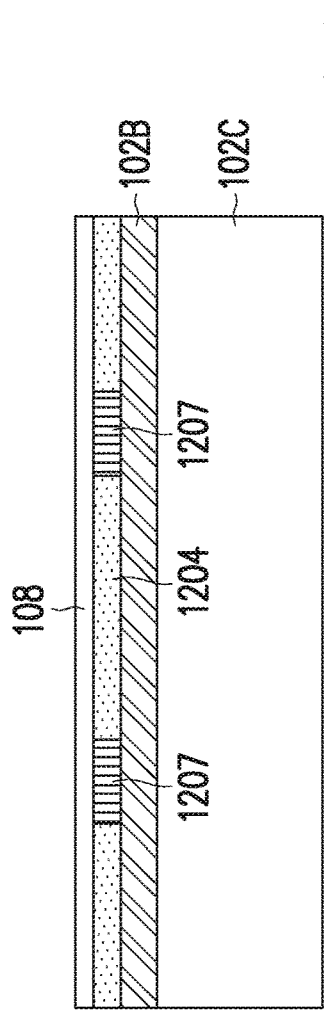
Figure 72:
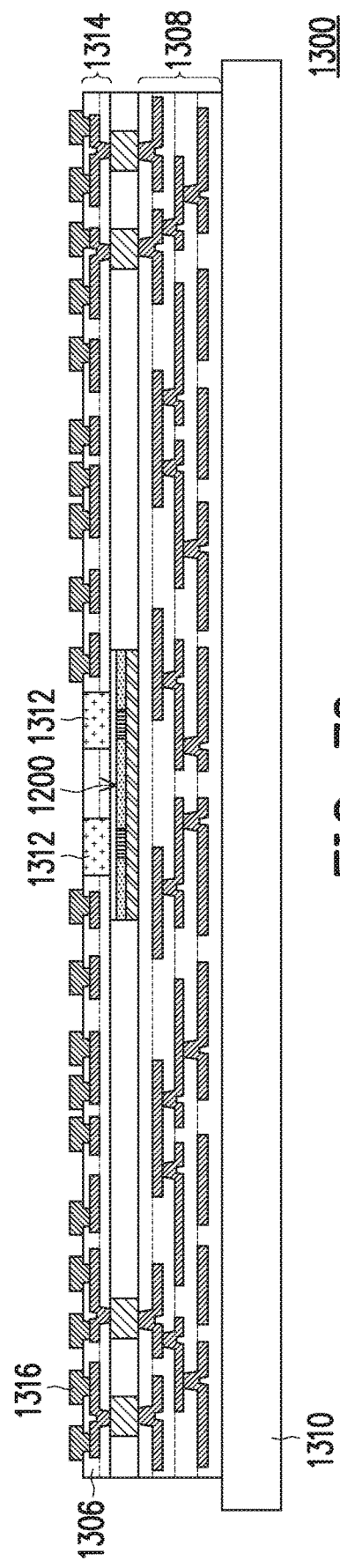
Figure 73:
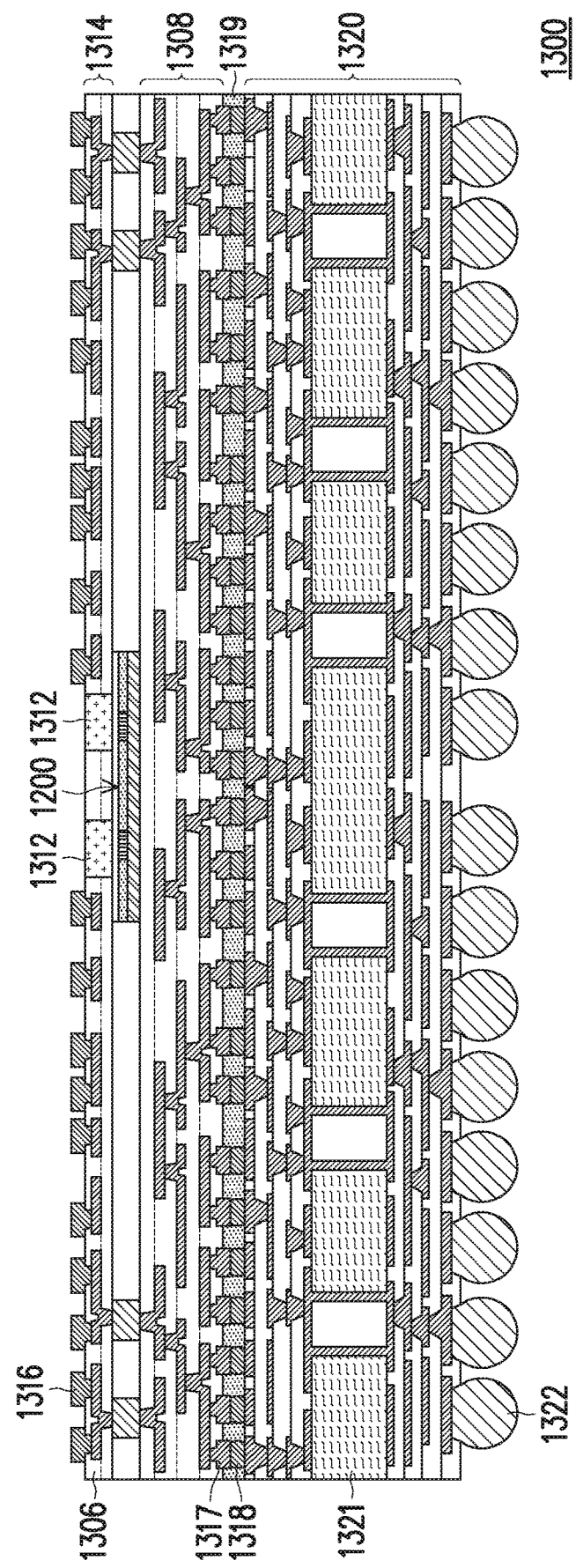
Figure 74:
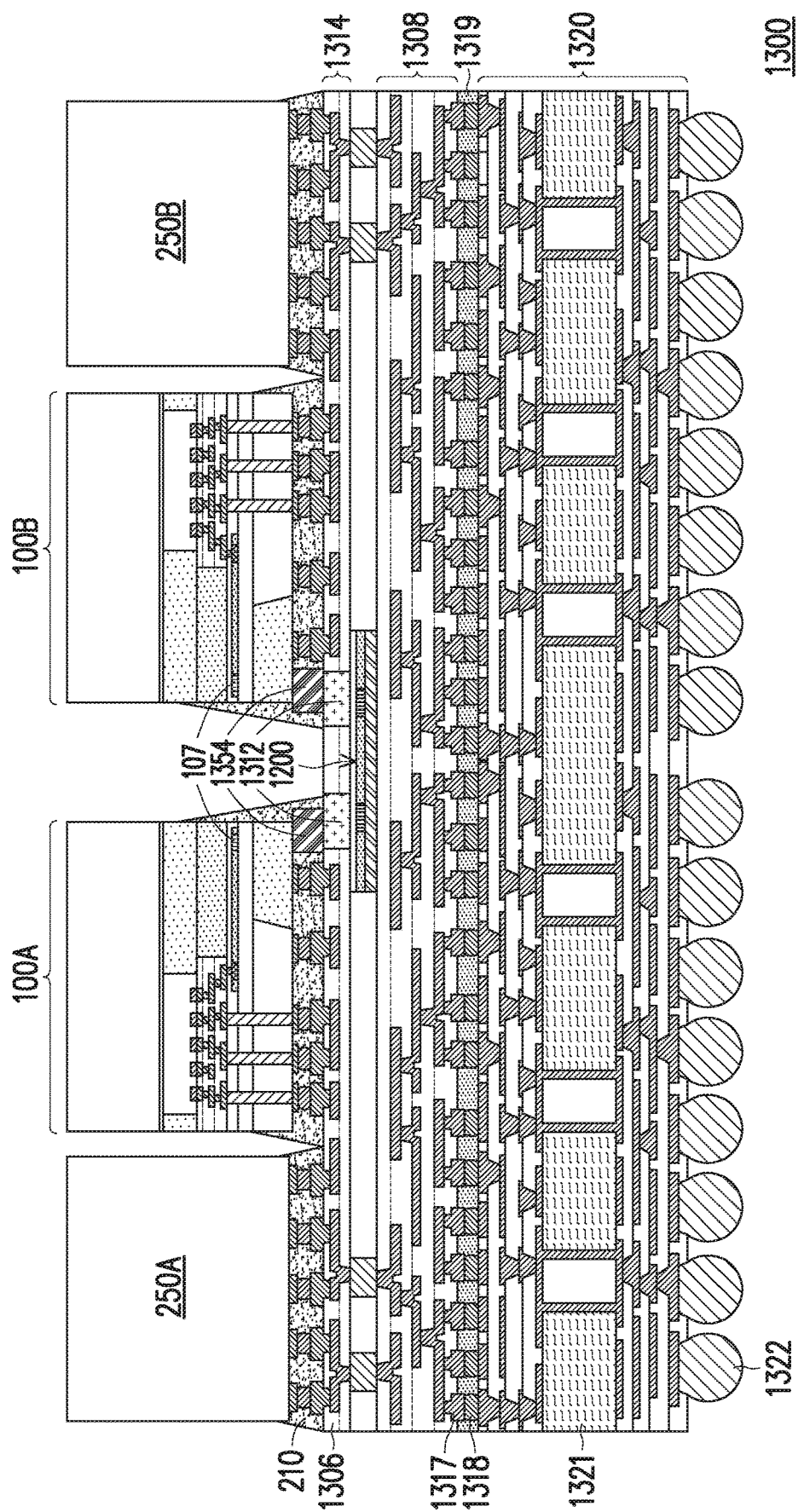

FIGS. 65 through 74 illustrate intermediate steps in the formation of a photonic system 1300, in accordance with some embodiments. FIGS. 65 through 67 illustrate the formation of a waveguide structure 1200, in accordance with some embodiments. A photonic system 1300 may include one or more waveguide structures 1200. The photonic system 1300 (see FIG. 74) includes multiple photonic packages 100A-B and multiple semiconductor devices 250A-B that are attached to a redistribution structure 1314, in some embodiments. The photonic packages 100A-B may be similar to the photonic packages 100 described previously for FIG. 14, and the semiconductor devices 250A-B may be similar to those described previously herein. The redistribution structure 1314 is formed over one or more waveguide structures 1200 that are optically coupled to photonic packages 100 and that allow optical communication between the photonic packages 100. In this manner, efficient and high-speed optical communication between photonic packages 100 may be achieved. FIG. 74 illustrates a photonic system 1300 having two photonic packages 100A-B and two semiconductor devices 250A-B, but in other embodiments another number of photonic structures 100 or semiconductor devices 250 may be present.

Turning first to FIG. 65, a BOX substrate 102 is shown, in accordance with some embodiments. The BOX substrate 102 may be similar to the BOX substrate 102 described for FIG. 1. For example, the BOX substrate may include an oxide layer 102B formed over a substrate 102C, and a silicon layer 102A formed over the oxide layer 102B. In FIG. 66, the silicon layer 102A is patterned to form silicon regions for waveguides 1204 and grating couplers 1207, in accordance with some embodiments. The waveguides 1204 or grating couplers 1207 may be similar to the waveguides 104 and couplers 107 described previously for FIG. 2 and elsewhere herein, and may be formed in a similar manner. One or more waveguides 1204 and one or more grating couplers 1207 may be formed. In FIG. 67, a dielectric layer 108 is formed on the front side of the BOX substrate 102, in accordance with some embodiments. The dielectric layer 108 is formed over the waveguides 1204, the grating couplers 1207, and the oxide layer 102B. The dielectric layer 108 may be similar to the dielectric layer 108 described previously for FIG. 3.

Figure 68:
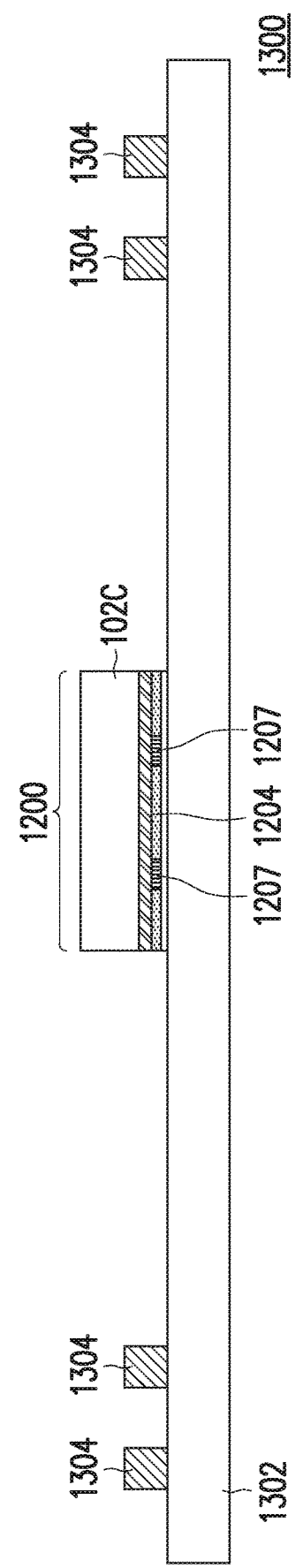
FIGS. 68 through 74 illustrate cross-sectional views of intermediate steps of forming a photonic system, in accordance with some embodiments.

In FIG. 68, vias 1304 are formed over a first carrier substrate 1302, in accordance with some embodiments. The first carrier substrate 1302 may be, for example, wafer, a glass carrier substrate, a ceramic carrier substrate, or the like. A release layer (not shown) may be formed on the first carrier substrate 1302, in some embodiments. The vias 1304 may be formed of materials similar to the through vias 914 described for FIG. 45, and may be formed using similar techniques. For example, a seed layer may be formed over the first carrier substrate 1302, a photoresist may be formed and patterned over the seed layer, and then conductive material deposited over the patterned photoresist. Other techniques are possible. As shown in FIG. 68, a waveguide structure 1200 may be attached to the first carrier substrate 1302, in accordance with some embodiments. The dielectric layer 108 of the waveguide structure 1200 may be attached to the first carrier substrate 1302 using an adhesive layer or the like (not shown). More than one waveguide structure 1200 may be attached to the first carrier substrate 1302, and the waveguide structure 1200 may be attached before or after formation of the vias 1304.

Figure 69:
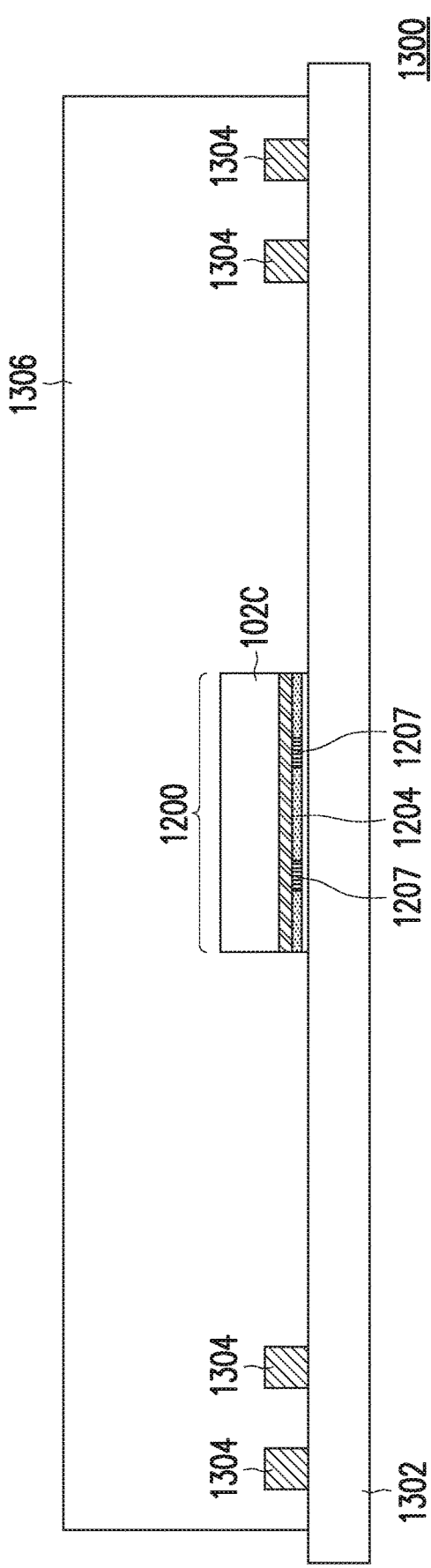
Figure 70:
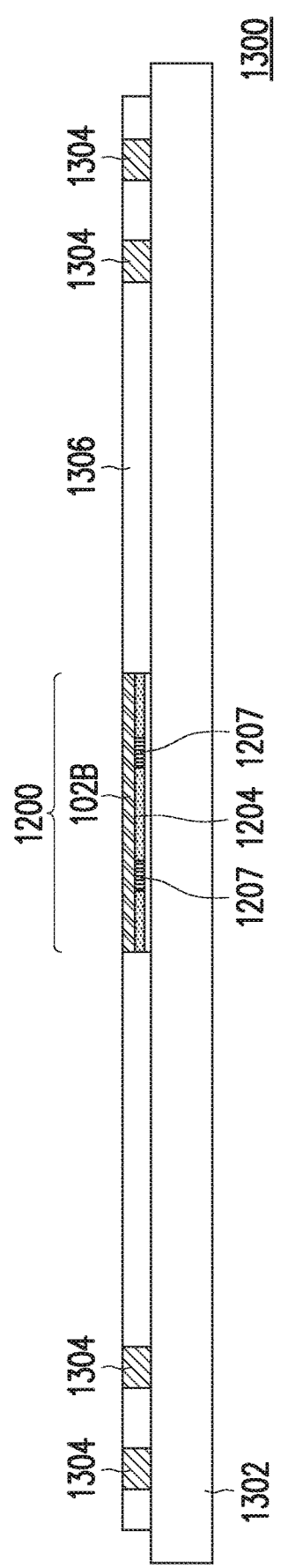

In FIG. 69, an encapsulant 1306 is formed over and around the vias 1304 and the waveguide structure 1200, in accordance with some embodiments. The encapsulant 1306 may be similar to the encapsulant 916 described for FIG. 46 or elsewhere herein, and may be formed using similar techniques. In FIG. 70, a planarization process is performed to remove the substrate 102C of the waveguide structure 1200, in accordance with some embodiments. The planarization process may include, for example, a CMP process, a grinding process, an etching process, the like, or combinations thereof. As shown in FIG. 70, the planarization process also thins the encapsulant 1306. After performing the planarization process, the oxide layer 102B of the waveguide structure 1200 may be exposed, and the vias 1304 may be exposed.

Figure 71:
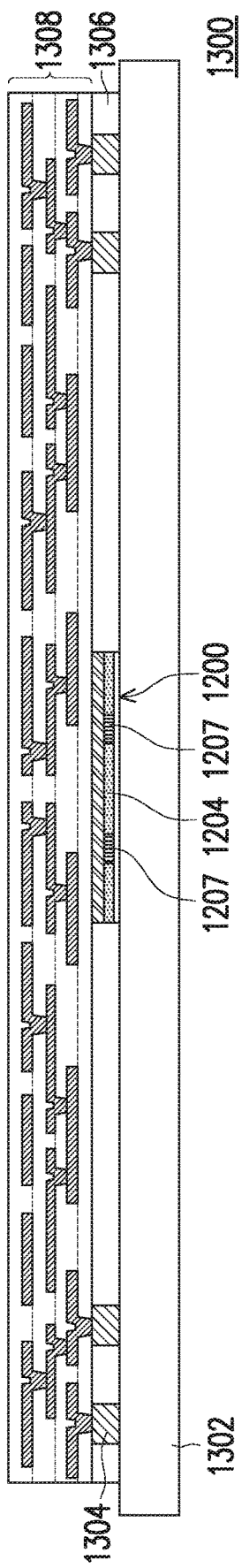

In FIG. 71, a redistribution structure 1308 is formed over the vias 1304, the encapsulant 1306, and the waveguide structure 1200, in accordance with some embodiments. The redistribution structure 1308 may be similar to the redistribution structure 922 described for FIG. 47, and may be formed using similar techniques. For example, the redistribution structure 1308 may comprise multiple dielectric layers and metallization patterns. In other embodiments, the redistribution structure 1308 may have another number of dielectric layers and metallization patterns than shown. A metallization pattern of the redistribution structure 1308 may be physically and electrically connected to the vias 1304.

In FIG. 72, the structure is removed from the first carrier substrate 1302, flipped over, and attached to a second carrier substrate 1310, in accordance with some embodiments. The second carrier substrate 1310 may be similar to the first carrier substrate 1302, and the structure may be attached using a release layer or the like (not shown in the figures). A redistribution structure 1314 and polymer regions 1312 may then be formed over the vias 1304, the encapsulant 1306, and the waveguide structure 1200, in accordance with some embodiments.

The redistribution structure 1314 may be similar to the redistribution structure 1308, and may be formed in a similar manner. For example, the redistribution structure 1314 may comprise dielectric layers and one or more metallization pattern. In other embodiments, the redistribution structure 1314 may have another number of dielectric layers and metallization patterns than shown. A metallization pattern of the redistribution structure 1314 may be physically and electrically connected to the vias 1304, and thus the redistribution structure 1314 may be electrically connected to the redistribution structure 1308 by the vias 1304.

In some embodiments, under-bump metallizations (UBMs) 1316 are formed on the redistribution structure 1314. The UBMs 1316 may have via portions extending through a dielectric layer of the redistribution structure 1314 to physically and electrically couple a metallization pattern of the redistribution structure 1314. The UBMs 1316 may be similar to the UBMs 947 described for FIG. 50, and may be formed using similar techniques.

In some embodiments, portions of the redistribution structure 1314 over the waveguide structure 1200 are removed, and polymer regions 1312 are formed on the waveguide structure 1200. The polymer regions 1312 may be formed above the grating couplers 1207 of the waveguide structure 1200, such that optical signals may be transmitted through the polymer regions 1312 to the grating couplers 1207. The polymer regions 1312 may comprise, for example, PMMA, BCB, the like, or combinations thereof. The material of the polymer regions 1312 may be formed using a suitable technique, such as ink-drop printing or the like, though other techniques are possible. In some embodiments, a polymer material may be deposited without significantly damaging the redistribution structure 1314. In other embodiments, the polymer regions 1312 may be formed before the redistribution structure 1314.

In some embodiments, the structure shown in FIG. 72 may be removed from the second carrier substrate 1310, and UBMs 1317 and conductive connectors 1318 (see FIG. 73) may be formed on the redistribution structure 1308. The UBMs 1317 may be similar to the UBMs 1316 described previously, and the conductive connectors 1318 may be similar to the conductive connectors 1152 described previously for FIG. 64.

In FIG. 73, an interconnect substrate 1320 is attached to the redistribution structure 1308, in accordance with some embodiments. The interconnect substrate 1320 may provide electrical routing and structural stability for the photonic system 1300. In some embodiments, the interconnect substrate 1320 may be, for example, an interposer or a "semi-finished substrate," and may be free of active devices. In some embodiments, interconnect substrate 1320 may include routing layers formed on a core substrate 1321. The core substrate 1321 may include a material such as Ajinomoto build-up film (ABF), a pre-impregnated composite fiber ("prepreg") material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate may be a double-sided copper-clad laminate (CCL) substrate or the like. The interconnect substrate 1320 may have one or more routing structures formed on each side of the core substrate 1321 and through vias extending through the core substrate 1321. The routing structures may each include one or more routing layers and one or more dielectric layers (not individually labeled in the figures).

Still referring to FIG. 73, external connectors 1322 may be formed on a routing structure of the interconnect substrate 1320. The external connectors 1322 may be, for example, contact bumps or solder balls, although any suitable connectors may be utilized. In an embodiment in which the external connectors 216 are contact bumps, the external connectors 1322 may include a material such as tin, or other suitable materials, such as silver, lead-free tin, or copper. In an embodiment in which the external connectors 1322 are solder bumps, the external connectors 1322 may be formed by initially forming a layer of solder using such a technique such as evaporation, electroplating, printing, solder transfer, ball placement, etc. Once a layer of solder has been formed on the structure, a reflow may be performed in order to shape the material into the desired bump shape for the external connectors 1322.

The interconnect substrate 1320 may be attached to the redistribution structure 1308 by placing conductive regions of the interconnect substrate 1320 on corresponding conductive connectors 1318. Once in physical contact, a reflow process may be utilized to bond the conductive connectors 1318 to the interconnect substrate 1320. As shown in FIG. 73, an underfill 1319 may be deposited between the interconnect substrate 1320 and the redistribution structure 1308. The underfill 1319 may also at least partially surround the conductive connectors 1318. The underfill 1319 may be a material such as an encapsulant molding compound, an epoxy, an underfill, a molding underfill (MUF), a resin, or the like, which may be similar to underfills or encapsulants described previously herein.

In FIG. 74, the photonic packages 100A-B and the semiconductor devices 250A-B are attached to the redistribution structure 1314, forming the photonic system 1300, in accordance with some embodiments. The photonic packages 100A-B and the semiconductor devices 250A-B may be connected to the redistribution structure 1314 in a manner similar to that described for FIG. 64. For example, the photonic packages 100A-B and the semiconductor devices 250A-B may be connected to the UBMs 1316 formed on the redistribution structure 1314 using conductive connectors similar to the conductive connectors 1152 described for FIG. 64 or elsewhere herein. For example, conductive connectors may be formed on the UBMs 1316 and then the photonic packages 100A-B and the semiconductor devices 250A-B may be placed on the conductive connectors. A reflow process may be performed to bond solder material of the conductive connectors to the conductive pads of the photonic packages 100A-B and the semiconductor devices 250A-B. Other techniques are possible.

In some embodiments, an optical glue 1354 may be formed between the photonic packages 100A-B and the polymer regions 1312. The optical glue 1154 allows for optical signals to be transmitted between the photonic packages 100A-B and the grating couplers 1207 of the waveguide structure 1200. The optical glue 1354 may be similar to the optical glue 1154 described for FIG. 64, in some cases. The optical glue 1354 may be deposited before or after attachment of the photonic packages 100A-B. In some embodiments, an underfill 210 may be deposited between the photonic packages 1101A-C or the semiconductor devices 250 and the redistribution structure 1314.

Figure 75:
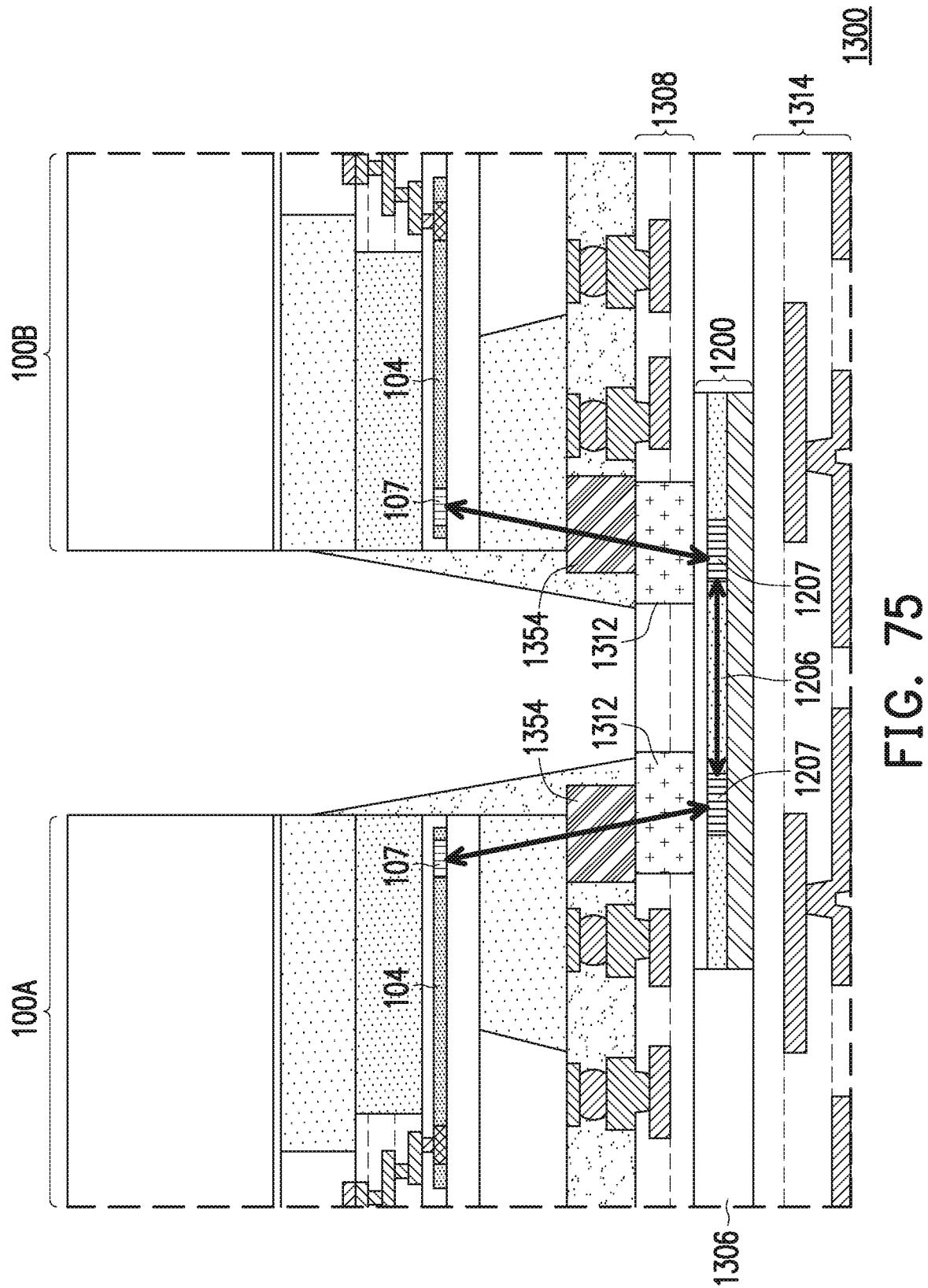
FIG. 75 illustrates a cross-sectional view of a photonic system, in accordance with some embodiments.

In this manner, in some embodiments, the photonic packages 100A-B may be optically coupled to the waveguides 1206 of the waveguide structure 1200 to facilitate optical communication between the semiconductor devices 250A-B of the photonic system 1300. This is shown in FIG. 75, which shows a magnified view of a portion of the photonic system 1300 of FIG. 74. As shown in FIG. 75, optical signals may be transmitted between the grating couplers 107 of the photonic package 100A-B and the grating couplers 1207 of the waveguide structure 1200. Optical signals may also be transmitted within the waveguides 1206 of the waveguide structure 1200. In this manner, optical communication between photonic packages 100A-B may be facilitated by the waveguide structure 1200. In this manner, a photonic system 1300 may be formed that allows for efficient and high-speed optical communication between multiple semiconductor devices 250A-B components using the photonic packages 100A-B and the waveguide structure 1200.

Embodiments may achieve advantages. The embodiments described herein allow for a photonic system to be formed with less cost, larger size, and improved operation. For example, a photonic package formed on a substrate may replace a portion of that substrate with a dielectric layer that transmits optical signals. In this manner, optical signals may be transmitted from a grating coupler within the photonic package to external components, allowing for more efficient optical communication between the photonic package and external components. In some cases, the dielectric layer may also improve the coupling efficiency of an edge coupler formed in the photonic package, allowing for more efficient optical communication between the photonic package and, for example, an edge-mounted optical fiber. In some embodiments, multiple photonic packages may be attached to a structure that includes waveguides, and each photonic package may be optically coupled to the waveguides through the dielectric layer. A photonic system may include both photonic packages and semiconductor devices, and the photonic packages may interface with semiconductor devices to facilitate optical communication between the semiconductor devices. In this manner, components of a photonic system may communicate using optical signals, which can improve efficiency and speed of the photonic system. For example, transmitting optical signals may have less signal attenuation at high frequencies, lower crosstalk, and less switching noise than transmitting electrical signals with e.g., conductive lines and the like. Optical communication may allow for lower-latency and higher-bandwidth communication.

In accordance with an embodiment, a method includes forming a first photonic package, wherein forming the first photonic package includes patterning a silicon layer to form a first waveguide, wherein the silicon layer is on an oxide layer, and wherein the oxide layer is on a substrate; forming vias extending into the substrate; forming a first redistribution structure over the first waveguide and the vias, wherein the first redistribution structure is electrically connected to the vias; connecting a first semiconductor device to the first redistribution structure; removing a first portion of the substrate to form a first recess, wherein the first recess exposes the oxide layer; and filling the first recess with a first dielectric material to form a first dielectric region. In an embodiment, the first semiconductor device is bonded to the first redistribution structure using a direct bonding process. In an embodiment, forming the photonic package includes forming a photodetector in the silicon layer, wherein the photodetector is optically coupled to the first waveguide, wherein the photodetector is electrically connected to the first redistribution structure. In an embodiment, forming the photonic package includes patterning the silicon layer to form a grating coupler, wherein the grating coupler is optically coupled to the first waveguide. In an embodiment, forming the photonic package includes patterning the silicon layer to form an edge coupler, wherein the edge coupler is optically coupled to the first waveguide. In an embodiment, a sidewall of the first dielectric region and a sidewall of the oxide layer are coplanar. In an embodiment, the method includes removing a second portion of the substrate to form a second recess, wherein the second recess exposes the oxide layer, and filling the second recess with the first dielectric material to form a second dielectric region. In an embodiment, the method includes attaching the first photonic package and a second photonic package to an interconnect structure, wherein the interconnect structure includes a second waveguide, wherein the second waveguide is optically coupled to the first waveguide of the first photonic package. In an embodiment, the method includes attaching a support structure to the first semiconductor device.

In accordance with an embodiment, a method includes forming a first waveguide on a first side of an oxide layer, wherein the first waveguide includes a first waveguide material, wherein the oxide layer is on a substrate; forming a first redistribution structure over the first waveguide; bonding an electronic die to the first redistribution structure; removing the substrate to expose a second side of the oxide layer; and forming a second waveguide on the second side of the oxide layer, wherein the second waveguide includes a second waveguide material that is different than the first waveguide material. In an embodiment, the second waveguide material is silicon nitride. In an embodiment, the second waveguide material is a polymer. In an embodiment, the method includes forming a third waveguide over the second waveguide, wherein the third waveguide includes the second waveguide material, wherein the third waveguide is optically coupled to the second waveguide. In an embodiment, the method includes thinning the oxide layer before forming the second waveguide on the second side of the oxide layer. In an embodiment, the method includes depositing a molding material on a sidewall of the oxide layer, wherein the second waveguide extends on a top surface of the molding material. In an embodiment, the method includes forming a second redistribution structure extending over the oxide layer and the second waveguide.

In accordance with an embodiment, a package includes a substrate including a first material; a first dielectric region adjacent the substrate, wherein the first dielectric region includes a second material that is different from the first material, wherein a first sidewall of the first dielectric region physically contacts a sidewall of the substrate; a first dielectric layer extending on the substrate and on the first dielectric region, wherein a second sidewall of the first dielectric region and a sidewall of the first dielectric layer are coplanar; a waveguide on the first dielectric layer; an edge coupler on the first dielectric layer, wherein the edge coupler is optically coupled to the waveguide, wherein the edge coupler and the first dielectric region are vertically aligned; a redistribution structure over the waveguide; and an electronic die bonded to the redistribution structure. In an embodiment, the package includes a photonic device on the first dielectric layer, wherein the photonic device is optically coupled to the waveguide and electrically connected to the redistribution structure. In an embodiment, the package includes an optical fiber that is optically coupled to the edge coupler. In an embodiment, the package includes vias extending through the substrate, wherein the vias are electrically connected to the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first photonic package, wherein forming the first photonic package comprises:
patterning a silicon layer to form a first waveguide, wherein the silicon layer is on an oxide layer, and wherein the oxide layer is on a substrate;
forming vias extending into the substrate;
forming a first redistribution structure over the first waveguide and the vias, wherein the first redistribution structure is electrically connected to the vias;
connecting a first semiconductor device to the first redistribution structure;
removing a first portion of the substrate to form a first recess, wherein the first recess exposes the oxide layer; and
filling the first recess with a first dielectric material to form a first dielectric region.

2. The method of claim 1, wherein the first semiconductor device is bonded to the first redistribution structure using a direct bonding process.

3. The method of claim 1, wherein forming the photonic package further comprises forming a photodetector in the silicon layer, wherein the photodetector is optically coupled to the first waveguide, wherein the photodetector is electrically connected to the first redistribution structure.

4. The method of claim 1, wherein forming the photonic package further comprises patterning the silicon layer to form a grating coupler, wherein the grating coupler is optically coupled to the first waveguide.

5. The method of claim 1, wherein forming the photonic package further comprises patterning the silicon layer to form an edge coupler, wherein the edge coupler is optically coupled to the first waveguide.

6. The method of claim 1, wherein a sidewall of the first dielectric region and a sidewall of the oxide layer are coplanar.

7. The method of claim 1 further comprising removing a second portion of the substrate to form a second recess, wherein the second recess exposes the oxide layer, and filling the second recess with the first dielectric material to form a second dielectric region.

8. The method of claim 1 further comprising attaching the first photonic package and a second photonic package to an interconnect structure, wherein the interconnect structure comprises a second waveguide, wherein the second waveguide is optically coupled to the first waveguide of the first photonic package.

9. The method of claim 1 further comprising attaching a support structure to the first semiconductor device.

10. A package, comprising:
a substrate comprising a first material;
a first dielectric region adjacent the substrate, wherein the first dielectric region comprises a second material that is different from the first material, wherein a first sidewall of the first dielectric region physically contacts a sidewall of the substrate;
a first dielectric layer extending on the substrate and on the first dielectric region, wherein a second sidewall of the first dielectric region and a sidewall of the first dielectric layer are coplanar;
a waveguide on the first dielectric layer;
an edge coupler on the first dielectric layer, wherein the edge coupler is optically coupled to the waveguide, wherein the edge coupler and the first dielectric region are vertically aligned;
a redistribution structure over the waveguide; and
an electronic die bonded to the redistribution structure.

11. The package of claim 10 further comprising a photonic device on the first dielectric layer, wherein the photonic device is optically coupled to the waveguide and electrically connected to the redistribution structure.

12. The package of claim 10, further comprising an optical fiber that is optically coupled to the edge coupler.

13. The package of claim 10 further comprising vias extending through the substrate, wherein the vias are electrically connected to the redistribution structure.

14. A method comprising:
forming a first waveguide on an oxide layer, wherein the oxide layer is on a first side of a substrate;
forming a first redistribution structure over the first waveguide;
forming a first via in the substrate, wherein the first via penetrates the oxide layer to physically and electrically contact the first redistribution structure;
etching a second side of the substrate to expose a surface of the oxide layer; and
depositing an oxide material on the exposed surface of the oxide layer.

15. The method of claim 14 further comprising:
forming a groove extending through the substrate, the oxide layer, and the oxide material; and
attaching an optical fiber to the groove.

16. The method of claim 14 further comprising physically and electrically connecting a semiconductor device to the first redistribution structure.

17. The method of claim 14 further comprising physically and electrically connecting a semiconductor device to the first via.

18. The method of claim 14 further comprising:
forming a recess in the first redistribution structure; and
depositing the oxide material in the recess.

19. The method of claim 14, wherein the first waveguide extends over the exposed surface of the oxide layer.

20. The method of claim 14 further comprising physically and electrically connecting a wire bond to the first via.

* * * * *